(12) United States Patent
Haridas et al.

(10) Patent No.: US 11,362,411 B2
(45) Date of Patent: Jun. 14, 2022

(54) ANTENNA APPARATUS

(71) Applicant: SOFANT TECHNOLOGIES LTD., Edinburgh (GB)

(72) Inventors: Nakul Raghavanand Haridas, Edinburgh (GB); David Michael Wither, Malmo (SE); Victor Steel, Driggs, ID (US); Wei Zhou, Edinburgh (GB); Tonio Idda, Edinburgh (GB); Admed Osman El-Rayis, Edinburgh (GB)

(73) Assignee: SOFANT TECHNOLOGIES LTD., Edinburgh (GB)

( * ) Notice: Subject to any disclaimer, the term of this patent is extended or adjusted under 35 U.S.C. 154(b) by 240 days.

(21) Appl. No.: 16/472,800

(22) PCT Filed: Dec. 20, 2017

(86) PCT No.: PCT/GB2017/053873
§ 371 (c)(1),
(2) Date: Jun. 21, 2019

(87) PCT Pub. No.: WO2018/115896
PCT Pub. Date: Jun. 28, 2018

(65) Prior Publication Data
US 2019/0372199 A1    Dec. 5, 2019

(30) Foreign Application Priority Data

Dec. 21, 2016 (GB) ..................................... 1621909
Dec. 21, 2016 (GB) ..................................... 1621913

(51) Int. Cl.
*H01Q 1/22* (2006.01)
*B81B 7/00* (2006.01)
(Continued)

(52) U.S. Cl.
CPC ......... *H01Q 1/2283* (2013.01); *B81B 7/0064* (2013.01); *B81C 1/00246* (2013.01);
(Continued)

(58) Field of Classification Search
CPC ...... H01Q 1/2283; H01Q 3/30; H01Q 21/065; H01Q 23/00
See application file for complete search history.

(56) References Cited

U.S. PATENT DOCUMENTS

| 5,541,614 A | 7/1996 | Lam |
| 6,388,631 B1 | 5/2002 | Livingston |

(Continued)

FOREIGN PATENT DOCUMENTS

| KR | 20100018963 A | 2/2010 |
| WO | WO9810309 A1 | 3/1998 |
| WO | 2011058354 A1 | 5/2011 |

OTHER PUBLICATIONS

Examination Report dated Jul. 29, 2021 for United Kingdom Patent Application No. GB1910391.0. 4 pages.
(Continued)

*Primary Examiner* — Graham P Smith
(74) *Attorney, Agent, or Firm* — Haynes and Boone, LLP

(57) ABSTRACT

The invention relates to antenna apparatus comprising: an antenna, a signal conductor and one or more RF MEMS switches, the antenna being conductively connected to the signal conductor, the MEMS switches and at least a portion of the signal conductor being supported by a crystalline MEMS substrate; and a capping substrate comprising a capping portion, wherein an enclosed volume is formed around the said MEMS switches between the capping portion and at least a portion of the crystalline MEMS substrate, and wherein the capping substrate comprises the said antenna.

14 Claims, 24 Drawing Sheets

(51) Int. Cl.
*B81C 1/00* (2006.01)
*H01Q 3/30* (2006.01)
*H01Q 21/06* (2006.01)
*H01Q 23/00* (2006.01)
*H03H 7/01* (2006.01)
*H04B 1/38* (2015.01)

(52) U.S. Cl.
CPC ........... *B81C 1/00269* (2013.01); *H01Q 3/30* (2013.01); *H01Q 21/065* (2013.01); *H01Q 23/00* (2013.01); *H03H 7/0115* (2013.01); *H04B 1/38* (2013.01); *B81C 2203/0735* (2013.01)

(56) References Cited

U.S. PATENT DOCUMENTS

| | | |
|---|---|---|
| 2002/0098611 A1 | 7/2002 | Chang et al. |
| 2003/0001251 A1 | 1/2003 | Cheever |
| 2003/0022395 A1 | 1/2003 | Olds |
| 2005/0161753 A1 | 1/2005 | Huff |
| 2005/0035915 A1 | 2/2005 | Livingston |
| 2005/0040988 A1 | 2/2005 | Zaghloul |
| 2005/0167047 A1 | 8/2005 | Huff et al. |
| 2005/0288392 A1* | 12/2005 | Okubora ................. H01L 24/81 523/176 |
| 2006/0180897 A1 | 8/2006 | Park |
| 2008/0186247 A1 | 8/2008 | Cotte et al. |
| 2009/0009422 A1* | 1/2009 | Guy ........................ H01Q 21/22 343/893 |
| 2010/0289717 A1 | 11/2010 | Arslan et al. |
| 2012/0074818 A1 | 3/2012 | Crowley |
| 2013/0313947 A1 | 11/2013 | Chen |
| 2014/0264661 A1 | 9/2014 | Cheng |
| 2015/0111332 A1 | 4/2015 | Lee |

OTHER PUBLICATIONS

European Patent Office, International Search Report for International Application No. PCT/GB2017/053873; dated Jun. 26, 2018; 6 pages; Officer Abderrahim Moumen, NL-2280 HV Rijswijk.
Search Report for GB Patent Application No. GB1621909.9 dated Mar. 23, 2017. 6 pages.
Search Report for GB Patent Application No. GB1621913.1 dated May 18, 2017. 11 pages.
Examination Report dated Feb. 10, 2022 for United Kingdom Patent Application No. GB1910391.0. 3 pages.

* cited by examiner

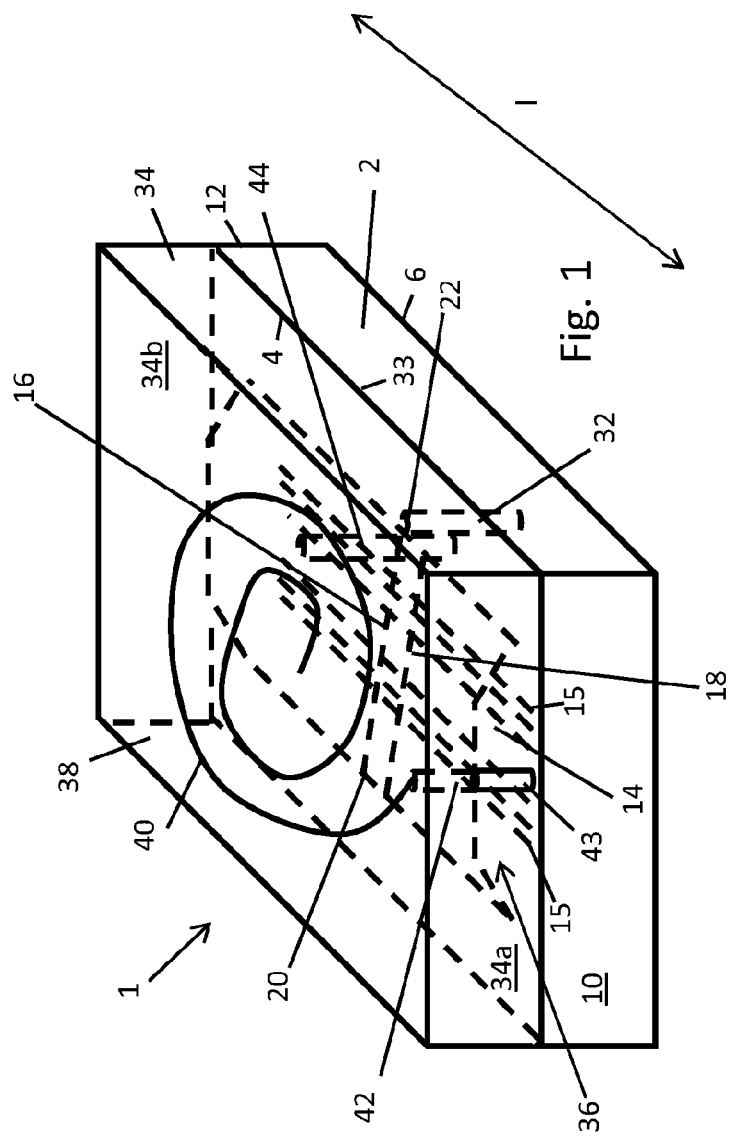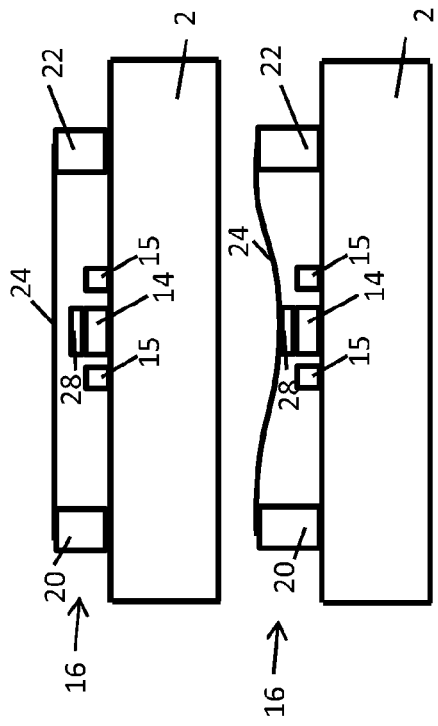

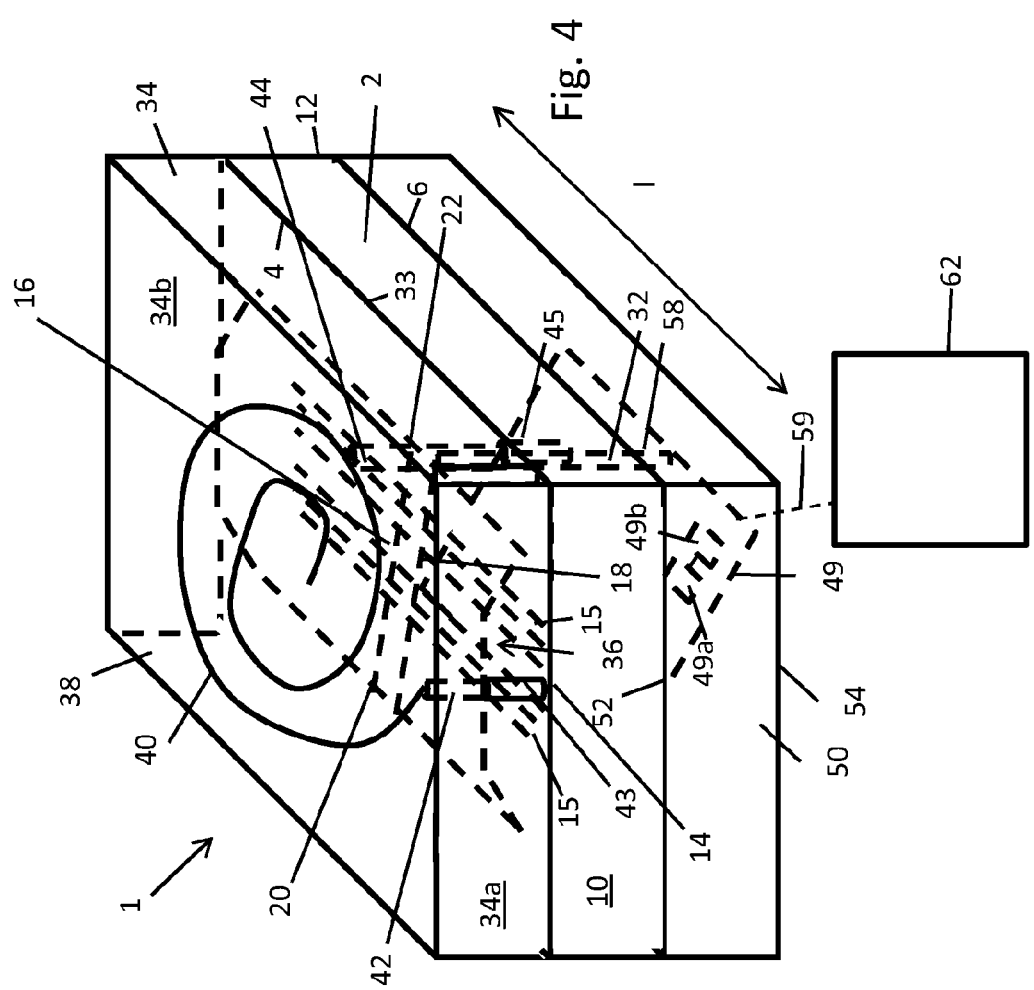

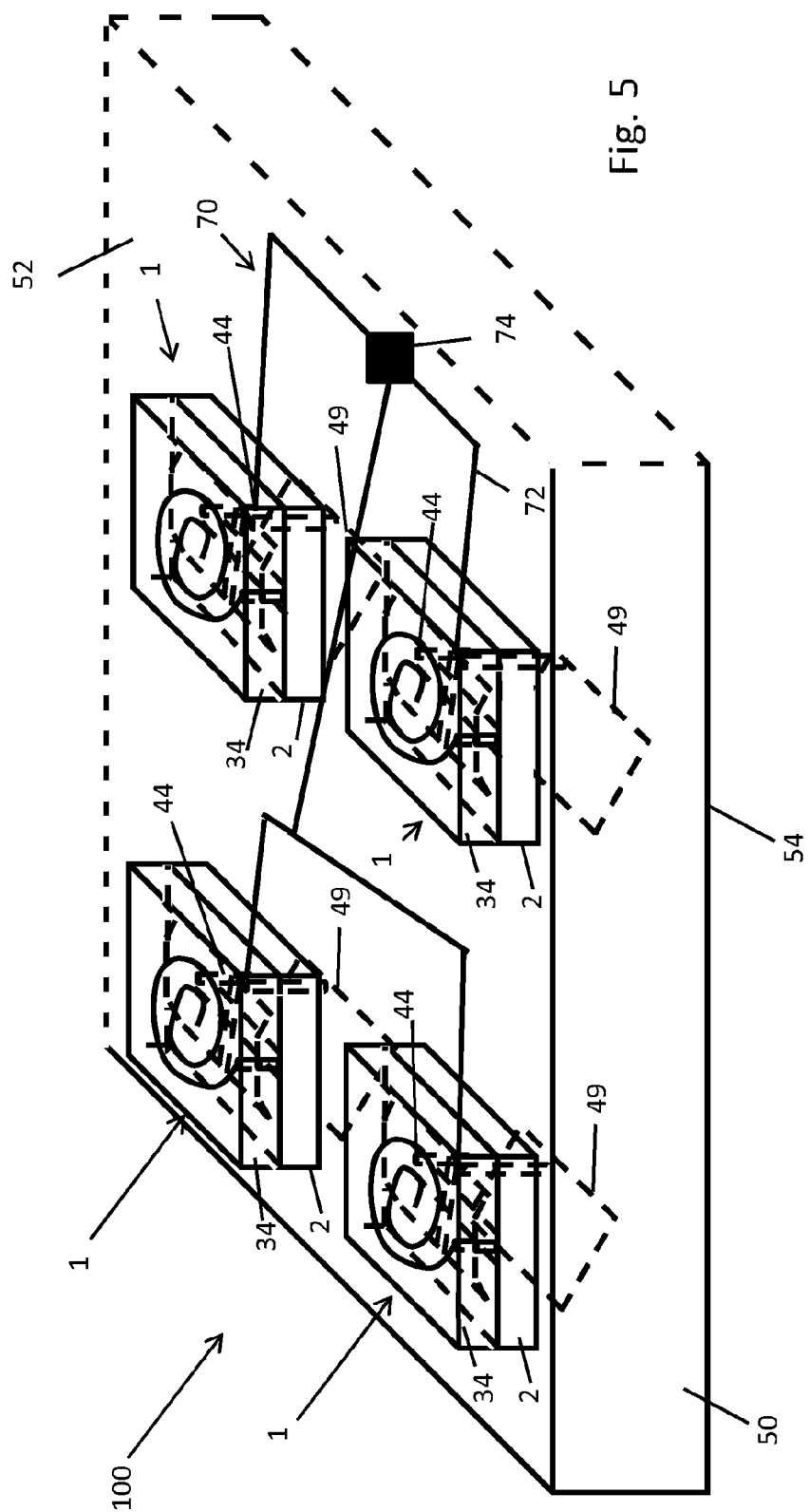

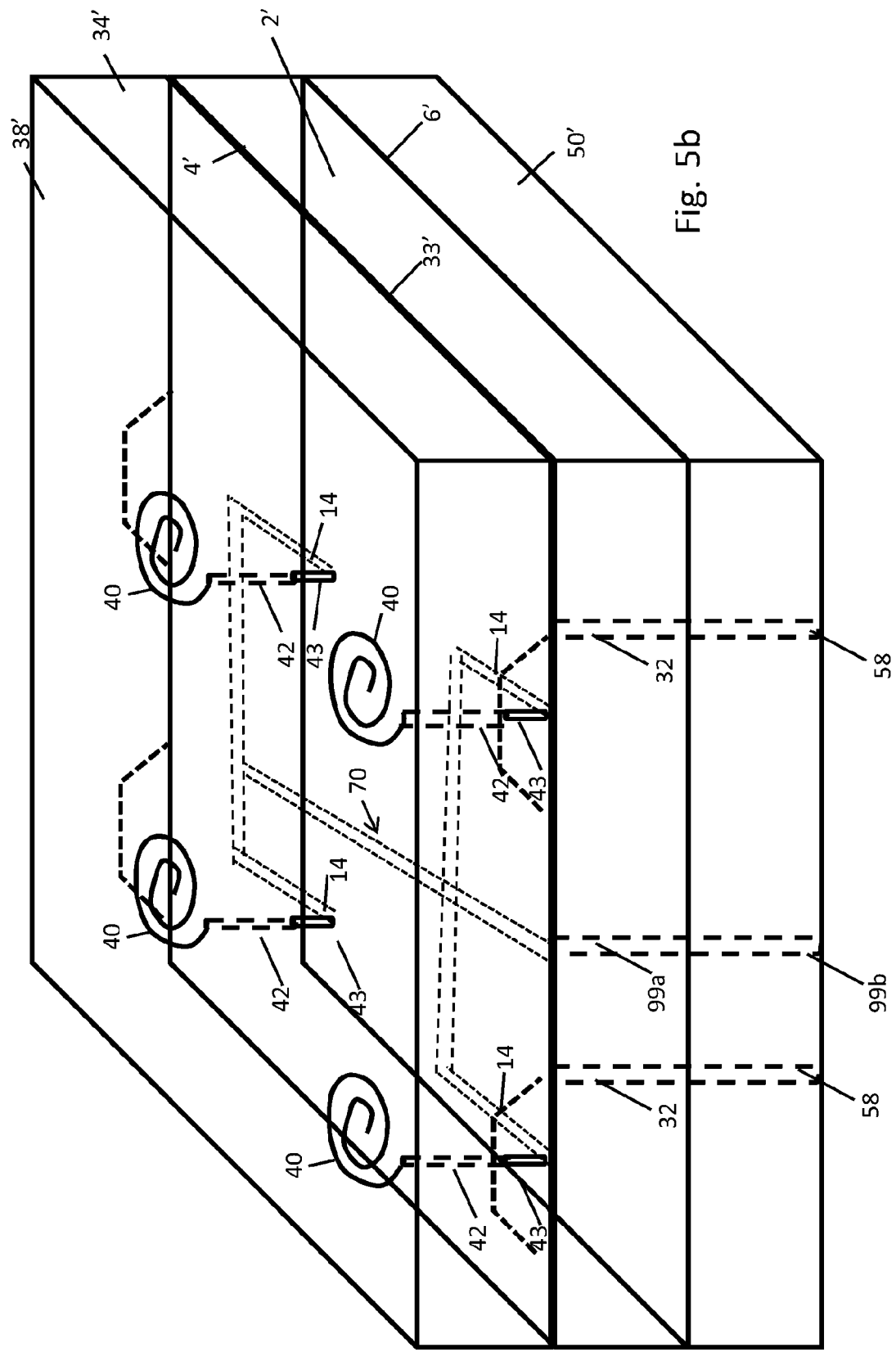

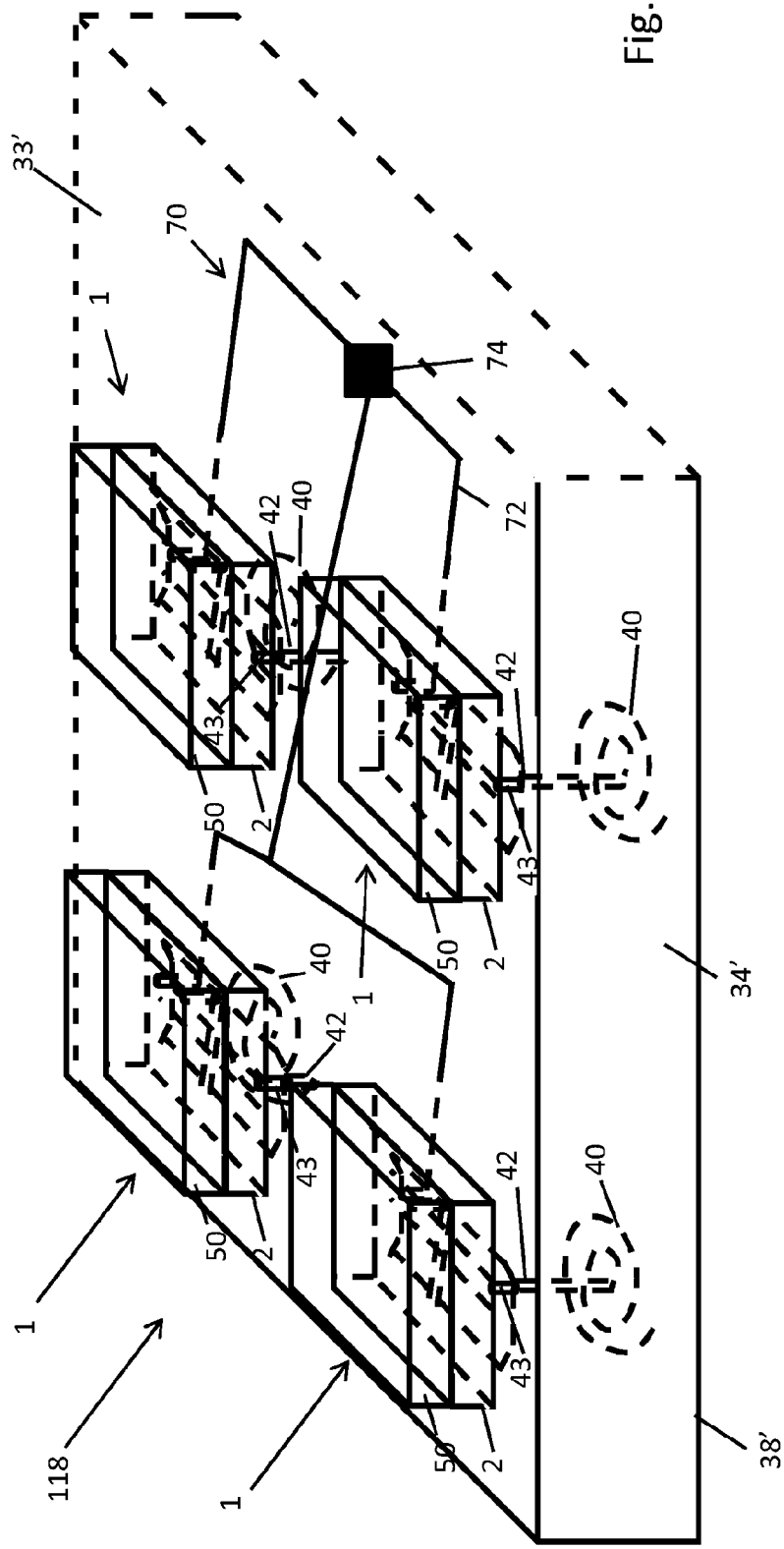

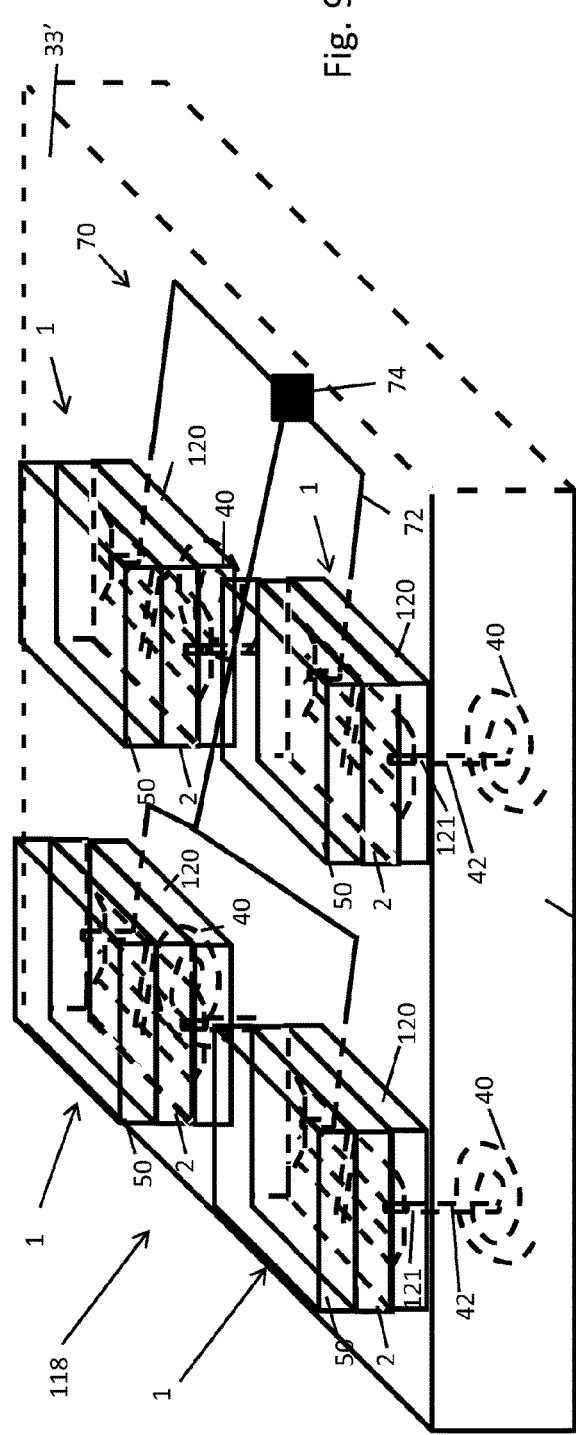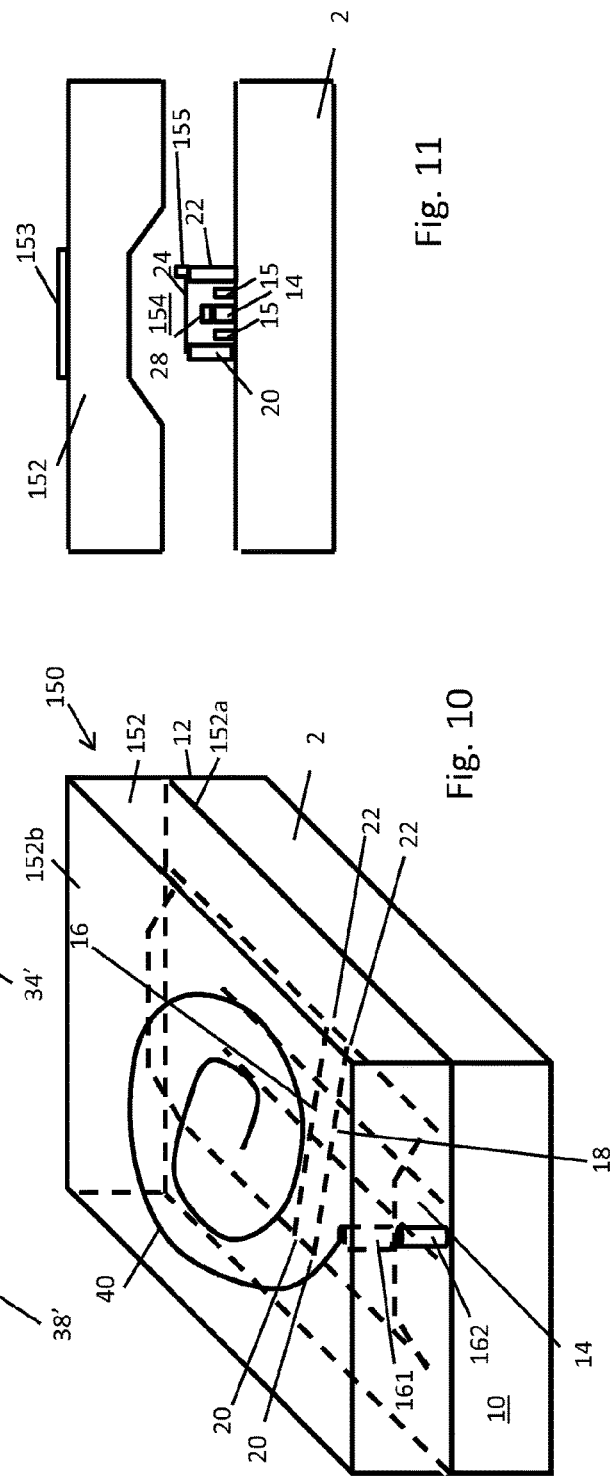

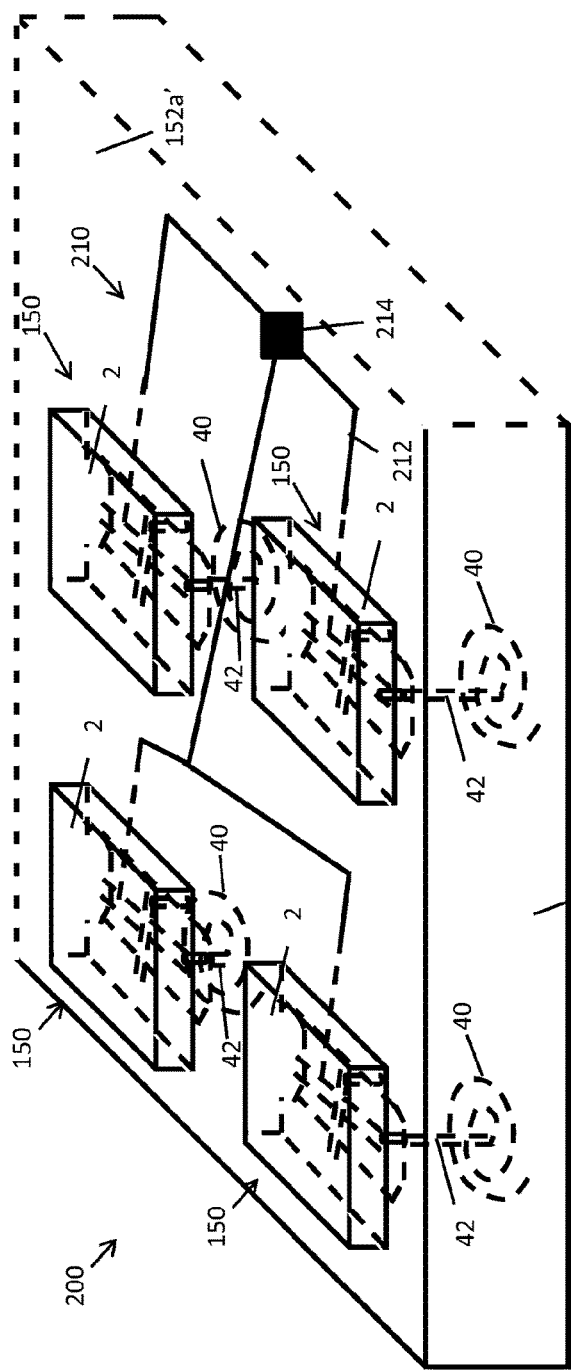
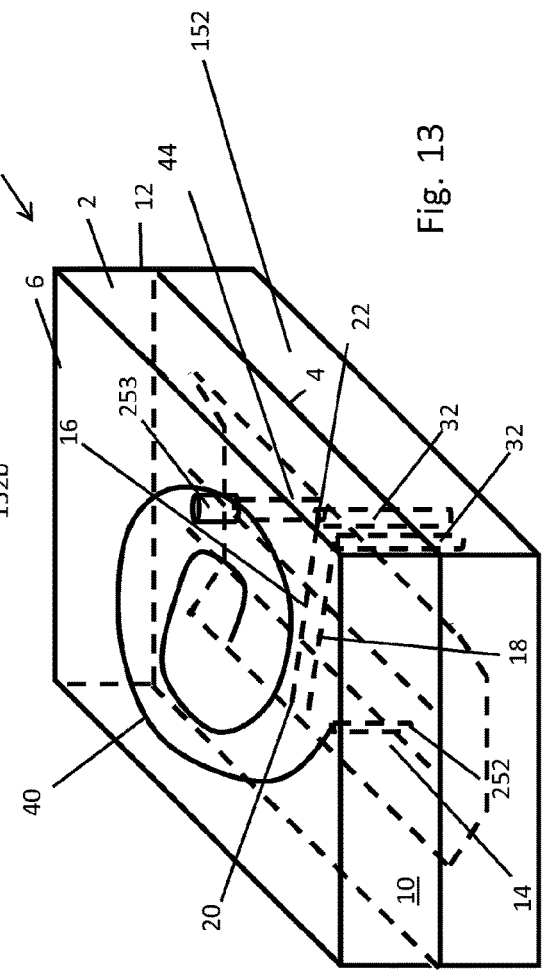
Fig. 12
Fig. 13

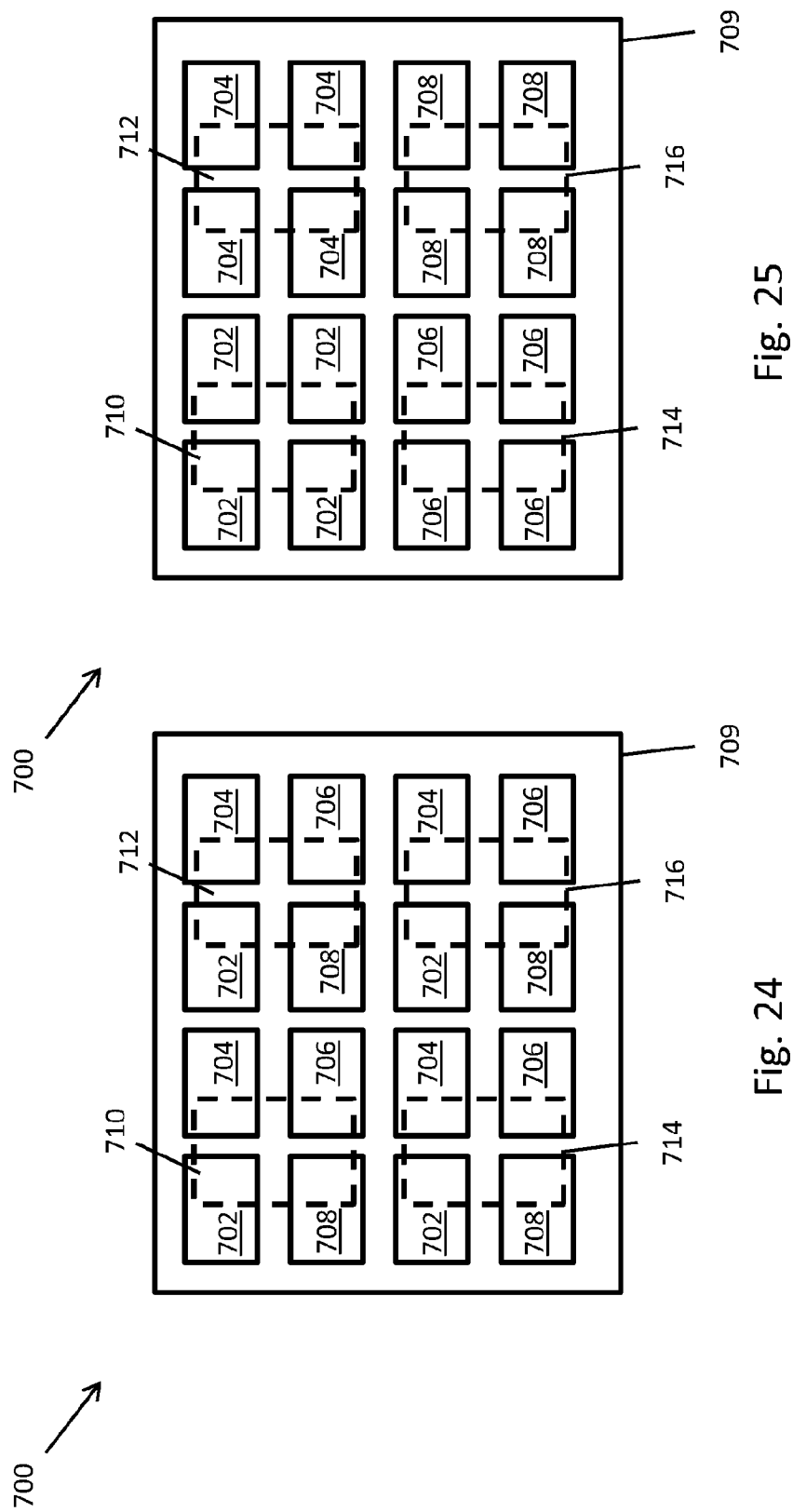

ANTENNA APPARATUS

CROSS REFERENCE TO RELATED APPLICATIONS

This application is a United States national phase application of co-pending international patent application No. PCT/GB2017/053873, filed Dec. 21, 2017 which claims priority to GB Patent Application No. 1621909.9, filed Dec. 21, 2016 and GB Patent Application No. 1621913.1, filed Dec. 21, 2016, the disclosures of which are incorporated herein by reference.

FIELD OF THE INVENTION

The invention relates to antenna apparatus; methods of manufacturing antenna apparatus; a phased antenna array; a base station or a small, micro or femto cell infrastructure, a satellite communication device or a (typically wireless) backhaul, transmitter, receiver or transceiver comprising antenna apparatus; a base station comprising a phased antenna array; a mobile communications device comprising antenna apparatus; and a mobile communications device comprising a phased antenna array.

BACKGROUND TO THE INVENTION

Phased antenna arrays, in which the relative phases of electromagnetic signals received or to be transmitted by respective antennas of the array are controlled to effectively "steer" the antenna array in a desired direction and/or control their gain. One skilled in the art will appreciated that phased antenna arrays are electronically steered as distinct from mechanically steered (although phased antenna arrays may in addition be mechanically steered). Phase antenna arrays require phase shifters to control signal phase. An important characteristic of phase shifters is their insertion loss, which must be kept as low as possible to maximise the power efficiency of the array.

Phase shifters can be implemented in microelectromechanical systems (MEMS). Such phase shifters are inherently broadband, and are therefore highly attractive for use in for phased antenna arrays, particularly for use in mobile telecommunications. However, MEMS components must be carefully (preferably hermetically) packaged. In addition, existing phase shifters can have relatively high insertion losses. Phased antenna arrays which use phase shifters can also be expensive to manufacture as the phase shifters typically need to be manufactured separately (which may use different processes) from the antennas and associated control/signal processing circuitry.

Improved phased antenna arrays are therefore required which exhibit lower insertion losses, preferably are less expensive to manufacture and package and which are more suitable for high frequency use, for example in (e.g. 5G) mobile telecommunications.

SUMMARY OF THE INVENTION

According to a first aspect of the invention there is provided antenna apparatus (e.g. an antenna module) comprising: (typically RF) antenna (typically configured to wirelessly transmit and/or receive electromagnetic (typically RF) radiation), one or more radio frequency (RF) microelectromechanical (MEMS) switches, the MEMS switches being supported by a MEMS substrate; and a capping substrate comprising a capping portion (typically the capping portion is configured to protect the MEMS switches).

Typically, the antenna apparatus comprises a signal conductor, the antenna being (typically directly) conductively connected to the signal conductor, the MEMS switches and at least a portion of the signal conductor being supported by (and typically formed on) the MEMS substrate, wherein the MEMS substrate or the capping substrate comprises the antenna.

Typically, an enclosed volume is formed around the said MEMS switches between the capping portion and at least a portion of the MEMS substrate (or wherein the capping portion and at least a portion of the MEMS substrate together form an enclosed volume around the said MEMS switches).

The apparatus may further comprise one or more through substrate vias which extend through the MEMS substrate or the capping portion. The one or more through substrate vias may connect the signal conductor to a MEMS controller or RF signal processing circuitry external to the enclosed volume.

It may be that at least one said through substrate via is hermetic. It may be that each through substrate via extending into the enclosed volume is hermetic.

It may be that there are at most six through substrate vias extending into the enclosed volume (for example, two connected to an RF signal conductor and four connected to ground lines). There may be least one non-hermetic through-substrate via not extending into the enclosed volume to connect the MEMS switches to one or more ICs.

The apparatus may further comprise a seal between the capping substrate and the MEMS substrate, wherein at least one switch control signal line extends out of the enclose volume under the seal on the surface of the capping substrate or MEMS substrate, the at least one switch control signal line conducting switch signals used to control the actuation of the MEMS switches in use. The switch control signals are not RF signals. The switch control signals might for example be digital control signals (which may be further processed by said ICs to determine the control signals applied to the MEMS switches). They may be voltage pulses generated using a charge pump. The apparatus may further comprise a seal between the capping substrate and the MEMS substrate, wherein at least one MEMS switch control signal line extends out of the enclosed volume under the seal on the surface of the capping substrate or MEMS substrate, the at least one MEMS switch control signal line extending to a MEMS controller external to the enclosed volume and conducting MEMS switch control signals in use.

It may be that each RF signal extending into the enclosed volume is conducted through a said through substrate via.

It may be that the capping substrate comprises the antenna and the antenna is conductively connected to the signal conductor by way of a through via which extends through the capping substrate.

It may be that the capping substrate is a CMOS capping substrate.

It may be that the capping substrate further comprises a controller portion.

It may be that the capping substrate is a single layered capping substrate.

It may be that the antenna and/or the one or more MEMS switches are dielectrically loaded by the capping substrate or capping portion.

The apparatus may further comprise one or more integrated circuits (ICs) comprising a MEMS controller configured to control the said one or more MEMS switches and/or signal processing circuitry configured to process signals received and/or to be transmitted by the antenna.

It may be that the capping substrate comprises the one or more ICs.

It may be that the capping substrate is a semiconductor capping substrate or comprises a semiconductor capping portion.

It may be that the MEMS substrate is a crystalline MEMS substrate.

In some embodiments the invention extends to antenna apparatus (e.g. an antenna module) comprising: an (typically RF) antenna (typically configured to wirelessly transmit and/or receive electromagnetic (typically RF) radiation), a signal conductor and one or more radio frequency (RF) microelectromechanical (MEMS) switches, the antenna being (typically directly) conductively connected to the signal conductor, the MEMS switches and at least a portion of the signal conductor being supported by (and typically formed on) a crystalline MEMS substrate; and a (optionally CMOS) capping substrate comprising a (capping portion (typically the capping portion is configured to protect the MEMS switches), and optionally a controller portion, wherein an enclosed volume is formed around the said MEMS switches between the capping portion and at least a portion of the crystalline MEMS substrate (or wherein the capping portion and at least a portion of the crystalline MEMS substrate together form an enclosed volume around the said MEMS switches), and wherein the capping substrate (or the MEMS substrate) comprises (e.g. carries) the said antenna.

Typically the enclosed volume is at least partly defined by the capping portion and the said at least a portion of the MEMS substrate.

By the capping substrate comprising the antenna (e.g. by way of the antenna being mounted or formed on a surface of the capping substrate) and having a capping portion which helps to form the enclosed volume around the MEMS switches, it performs a dual function, thereby making the antenna apparatus (e.g. module) more compact. This helps the antenna, MEMS switches and signal conductor to be provided closer together which helps to keep parasitic and signal losses low. In addition, by making the MEMS substrate from a crystalline material, electromagnetic signals propagating on the signal conductor will experience low losses due to the substantially uniform (relatively defect free) structure of the crystalline substrate, particularly at high signal frequencies (e.g. signal frequencies greater than 0.6 GHz, in some cases greater than 1 GHz, in some cases greater than greater than 2 GHz, greater than 5 GHz, greater than 8 GHz or greater than 20 GHz, greater than 50 GHz or greater than 70 GHz). Additionally, there is no requirement for a separate protective cap over the MEMS switches; this reduces material costs and helps to reduce the quantity of processing required during manufacture, thereby helping to reduce the overall cost of the antenna apparatus.

In some embodiments, the invention provides antenna apparatus (e.g. an antenna module) comprising: an (e.g. RF) antenna (typically configured to wirelessly transmit and/or receive electromagnetic (typically RF) radiation), a signal conductor and one or more RF microelectromechanical (MEMS) switches, the antenna being (typically directly) conductively connected to the signal conductor, the MEMS switches and at least a portion of the signal conductor being supported by (and typically formed on) a (typically crystalline) MEMS substrate; and a (typically single layered) capping substrate comprising a (optionally semiconductor) capping portion (typically the capping portion is configured to protect the MEMS switches), wherein an enclosed volume may be formed around the said MEMS switches between the capping portion and at least a portion of the MEMS substrate (or wherein the capping portion and at least a portion of the MEMS substrate together form an enclosed volume around the said MEMS switches), and wherein the capping substrate (or in some embodiments the MEMS substrate) comprises (e.g. carries) the said antenna.

Typically the enclosed volume is at least partly defined by the capping portion and the said at least a portion of the MEMS substrate.

By the capping substrate comprising the antenna (e.g. by way of the antenna being mounted or formed on a surface of the capping substrate) and having a capping portion which helps to form the enclosed volume around the MEMS switches, it performs a dual function, thereby making the apparatus (module) more compact. This also helps the antenna, signal conductor and MEMS switches to be provided closer together which helps to keep parasitic and signal losses low (e.g. by reducing the number of wire bonds in the package). Additionally, there is no requirement for a separate protective cap over the MEMS switches; this reduces material costs and helps to reduce the quantity of processing required during manufacture, thereby helping to reduce the overall cost of the antenna apparatus.

In either of the first or second aspects of the invention, it may be that the capping substrate is single layered.

It may be that the capping substrate is monolithic.

It may be that the capping substrate is a semiconductor substrate, for example comprising or consisting of silicon, silicon dioxide, aluminium oxide, sapphire, germanium, silicon-germanium (SiGe), gallium arsenide (GaAs), an alloy of silicon and germanium, or indium phosphide (InP), or fused silica ($SiO_2$) or high resistivity silicon.

By a "semiconductor substrate" we mean a (typically insulating or semiconducting) substrate on which semiconductor integrated circuits can be grown layer-by-layer by (typically serial) semiconductor (e.g. CMOS) fabrication techniques.

By making the capping substrate a semiconductor substrate, the antenna can be formed thereon more accurately and reliably, with higher yield, and more cost effectively than other types of substrate because semiconductor substrates can be processed using (mature, well developed) semiconductor (e.g. CMOS) fabrication techniques.

It may be that the capping substrate is a laminate substrate, a monolithic substrate, a low temperature co-fired ceramic (LTCC) substrate, a high temperature co-fired ceramic (HTCC) substrate, an organic substrate, a multi-layer organic substrate (such as a multi-layer organic substrate from Rogers Corporation), a glass substrate, a ceramic substrate, a glass ceramic substrate, or an insulating substrate such as an alumina substrate.

It may be that the capping substrate comprises a first surface and a second surface opposite the first surface. It may be that the MEMS substrate comprises a first surface and a second surface opposite the first surface. Typically the MEMS switches and signal conductor are provided (e.g. formed) on the first surface of the MEMS substrate. It may be that the enclosed volume is formed between the first surface of the capping substrate and the first surface of the MEMS substrate. It may be that the first surface of the capping substrate is connected (e.g. bonded) to the first surface of the MEMS substrate. It may be that the antenna is provided (e.g. formed) on the second surface of the capping substrate. It may be that the enclosed volume comprises the first surfaces of the capping and MEMS substrates. It may be that the second surface of the capping substrate is exposed.

Typically the antenna is exposed.

It may be that the capping substrate is an interposer substrate comprising a conductive interface (e.g. the interposer substrate provides a signal routing layer) configured to conductively connect the antenna to the signal conductor. It may be that the conductive interface is provided in the capping portion. Typically the signal conductor is conductively (e.g. directly) connected to the antenna by way of one or more signal propagation paths extending at least part of the way (or fully) through the capping substrate. Typically the signal conductor is conductively (e.g. directly) connected to the antenna by way of one or more through vias extending at least part of the way (or fully) through the capping substrate. It may be that the interposer substrate (e.g. the conductive interface) comprises one or more conductive through substrate vias. It may be that the interposer substrate further comprises one or more integrated components or (e.g. passive) devices, such as one or more lumped elements (e.g. one or more capacitors, one or more inductors or one or more resistors). For example, the interposer substrate may comprise one or more vertical capacitors. It may be that the said one or more integrated components or passive devices are provided as part of the conductive interface.

It may be that the antenna apparatus further comprises one or more (typically CMOS) integrated circuits (ICs) formed on a semiconductor (typically semiconducting) IC substrate, the said one or more ICs comprising a MEMS controller configured to control the said one or more MEMS switches, and/or (typically active) signal processing circuitry (e.g. transmitter, receiver or transceiver circuitry) configured to process signals received and/or to be transmitted by the antenna. It may be that one or more of the ICs (e.g. MEMS controller) comprise memory.

It may be that the semiconductor IC substrate comprises or consists of the MEMS substrate. Alternatively, it may be that the semiconductor IC substrate is the capping substrate (in which case the capping substrate is typically a semiconducting capping substrate). It may be that at least part of one or more of the said ICs is provided (e.g. formed) on the first or second surface of the capping substrate. It may be that the antenna is provided (e.g. formed) on the second surface of the capping substrate.

Alternatively it may be that the semiconductor IC substrate is discrete from the MEMS substrate and the capping substrate. In this case, it may be that the semiconductor IC substrate is connected (e.g. bonded) to (e.g. the second surface of) the MEMS substrate.

It may be that the capping substrate and the MEMS substrate (and in some embodiments, where provided, the semiconductor IC substrate) are arranged together in a stack (e.g. stacked one on top of the other). It may be that the capping portion of the capping substrate is stacked on the first surface of the MEMS substrate. It may be that the capping substrate is (e.g. vertically) offset from the MEMS substrate (e.g. in a stacking direction of the said capping portion on the MEMS substrate). Thus it may be that the antenna is (e.g. vertically) offset from the MEMS switches (e.g. in a stacking direction of the said capping portion on the MEMS substrate). It may be that the semiconductor IC substrate is stacked on the second surface of the MEMS substrate. It may be that the semiconductor IC substrate is (e.g. vertically) offset from the MEMS substrate (e.g. in a stacking direction of the said semiconductor IC substrate on the MEMS substrate). Thus, it may be that the semiconductor IC substrate is (e.g. vertically) offset from the MEMS switches (e.g. in a stacking direction of the said semiconductor IC substrate on the MEMS substrate). It may be that at least part of one or more of the ICs of the semiconductor IC substrate is vertically aligned with the MEMS switches (e.g. in a stacking direction of the said semiconductor IC substrate on the MEMS substrate). In this way, a compact integrated package comprising the capping portion, the antenna, the signal conductor, the MEMS switches and the ICs is provided. This allows signal propagation paths to be kept short, thereby keeping parasitic and signal losses low within the antenna apparatus, particularly at high signal frequencies (e.g. millimetre wavelengths). Particularly when the MEMS substrate and the capping substrate are semiconductor substrates, the antenna apparatus can be manufactured in high volume at relatively low cost using semiconductor (e.g. CMOS) fabrication techniques.

It may be that the MEMS controller is conductively connected to the MEMS switches by way of one or more conductive paths. It may be that the MEMS controller is conductively connected to the MEMS switches by way of (typically digital, typically high voltage) signal tracks and/or one or more conductive through substrate vias which (e.g. together) carry signals between the MEMS controller and the said switches. It may be that one or more of the said vias extend (or together extend) at least part of the way (or fully) through the MEMS substrate and/or at least part of the way (or fully) through the semiconductor IC substrate. It may be that the signal tracks are provided by deposited and/or patterned signal tracks (e.g. on the semiconductor IC substrate and/or on the MEMS substrate).

It may be that the signal processing circuitry is conductively connected to the signal conductor by way of one or more conductive through substrate vias (e.g. extending (or together extending) at least part of the way (or fully) through the capping substrate and/or through the MEMS substrate and/or through the semiconductor IC substrate).

It may be that the semiconductor IC substrate comprises a first surface connected (e.g. bonded) to the (e.g. second surface of the) MEMS substrate and a second surface opposite the first surface. It may be that at least a portion of one or more or each of the ICs are provided (e.g. formed) on the first surface of the semiconductor IC substrate. It may be that at least a portion of one or more or each of the ICs are provided (e.g. formed) on the second surface of the semiconductor IC substrate. It may be that at least a portion of a first IC is provided (e.g. formed) on the first surface of the semiconductor substrate and at least a portion of a second IC (or at least a different portion of the first IC) is provided (e.g. formed) on the second surface of the semiconductor IC substrate.

It may be that the antenna apparatus comprises an antenna ground plane for the said antenna.

It may be that the said first surface of the capping substrate comprises a conductive antenna ground plane. It may be that the first surface of the capping substrate comprises an insulating portion surrounding a through substrate via which conductively connects the antenna to the signal conductor (the insulating portion preventing the via from shorting to the ground plane).

It may be that the semiconductor IC substrate is monolithic.

It may be that the semiconductor IC substrate is single layered, or bi-layered (e.g. semiconductor-on-insulator) or tri-layered (e.g. semiconductor-on-insulator-on-semiconductor).

It may be that the MEMS substrate and/or the capping substrate comprises or consists of material having a dielectric constant greater than 3, more preferably greater than 5, more preferably greater than 8, even more preferably greater than 10, in some embodiments greater than 11.69, in some embodiments greater than 12, in some embodiments greater than 15, in some embodiments greater than 20, in some embodiments greater than 50. By providing the capping substrate with a relatively high dielectric constant, the antenna apparatus can be further compacted at least because components or circuitry provided on that substrate can be made smaller and physically closer together.

It may be that any one or more or each of the MEMS substrate, the capping substrate and the semiconductor IC substrate are homogeneous. By making one or more or each of the substrates (particularly the MEMS substrate and the antenna substrate which carry RF signals) homogenous, signal losses are low, again particularly at high signal frequencies.

It may be that the capping substrate is crystalline. It may be that the capping substrate is monocrystalline. It may be that the capping substrate is polycrystalline. By making the capping substrate (which carries RF signals) crystalline (preferably monocrystalline), signal losses are low, particularly at high signal frequencies, in view of the uniform (relatively defect free) structure of the crystalline substrate which enables electromagnetic signals to propagate uniformly. It may be that the capping substrate is a laminate substrate, a monolithic substrate, a low temperature co-fired ceramic (LTCC) substrate, a high temperature co-fired ceramic (HTCC) substrate, an organic substrate, a multi-layer organic substrate, or a coreless substrate, a glass substrate, a ceramic substrate, a glass ceramic substrate or an insulating substrate such as an alumina substrate.

It may be that the capping portion of the capping substrate comprises the said antenna. Alternatively it may be that the antenna is (e.g. laterally) offset from the capping portion (e.g. offset from the capping portion in a direction having a component in a plane perpendicular to a stacking direction of the capping portion on the MEMS substrate). That is, it may be that the antenna is provided on a portion of the capping substrate not comprising the capping portion. It may be that the antenna is laterally offset from the MEMS switches (e.g. in a direction in a plane perpendicular to a stacking direction of the antenna on the MEMS substrate) to thereby reduce interference between the antenna and the MEMS switches.

Some embodiments of the invention provides antenna apparatus (e.g. an antenna module) comprising: an (e.g. RF) antenna (typically configured to wirelessly transmit and/or receive electromagnetic (typically RF) radiation), and one or more RF MEMS switches, the said one or more MEMS switches being supported by (and typically formed on) a (typically crystalline) MEMS substrate; and a (optionally semiconductor) (typically semiconducting) capping substrate comprising a capping portion, wherein an enclosed volume is formed around the said MEMS switches between the capping portion and at least a portion of the MEMS substrate (or wherein the capping portion and at least a portion of the MEMS substrate together form an enclosed volume around the MEMS switches), and wherein the (optionally) semiconductor capping substrate comprises one or more (typically CMOS) integrated circuits (ICs) comprising a MEMS controller configured to control the said one or more MEMS switches and/or (typically active) signal processing circuitry (e.g. transmitter, receiver or transceiver circuitry) configured to process signals received and/or to be transmitted by the antenna.

Typically the enclosed volume is at least partly defined by the capping portion and the said at least a portion of the MEMS substrate.

By providing the said ICs in or on the (e.g. semiconductor) capping substrate, the (e.g. semiconductor) capping substrate has a dual function of protecting/capping the MEMS switches and carrying the ICs. The MEMS switches and ICs are also provided closer together in a more compact package, which helps to keep parasitic and signal losses low, particularly at high signal frequencies. Additionally, there is no requirement for a separate cap over the MEMS switches; this reduces material costs and helps to reduce the quantity of processing required during manufacture, thereby helping to reduce the overall cost of the antenna apparatus.

Typically the antenna apparatus further comprises a signal conductor at least part of which is supported by the MEMS substrate, the signal conductor being conductively connected to the antenna.

Typically the MEMS substrate is crystalline. In this case, electromagnetic signals propagating on the signal conductor will experience less losses due to the substantially uniform (relatively defect free) structure of the crystalline substrate, particularly at high frequencies (e.g. signal frequencies greater than 0.6 Ghz, greater than 2 GHz, greater than 5 GHz, greater than 8 GHz, greater than 20 GHz, greater than 50 GHz or greater than 70 GHz).

It may be that the MEMS switches (and, where provided the signal conductor) are provided (e.g. formed) on a first surface of the MEMS substrate. It may be that the MEMS substrate comprises a second surface opposite the first surface. It may be that the first surface of the MEMS substrate is internal to the said enclosed volume. It may be that the second surface of the MEMS substrate is exposed.

It may be that the capping substrate comprises a first surface and a second surface opposite the first surface. It may be that the first surface is internal to the said enclosed volume. It may be that the second surface is external to the enclosed volume. It may be that at least a portion of one or more (or each) of the said ICs is provided (e.g. formed) on the first surface of the (e.g. semiconductor) capping substrate. It may be that at least a portion of one or more (or each) of the said ICs is provided (e.g. formed) on the second surface of the (e.g. semiconductor) capping substrate. It may be that at least part of one or more of the said ICs is provided (e.g. formed) on the first surface of the (e.g. semiconductor) capping substrate and at least part of one or more of the said ICs is provided (e.g. formed) on the second surface of the (e.g. semiconductor) capping substrate.

It may be that the second surface of the MEMS substrate comprises the said antenna (e.g. the antenna may be mounted or formed on the said second surface of the MEMS substrate). In this way, the antenna can be positioned close to the signal conductor, allowing a short conductive connection to be made between them (e.g. a conductive connection comprising a conductive through substrate via passing through the MEMS substrate), thereby reducing losses particularly at high signal frequencies.

It may be that the first surface of the MEMS substrate comprises the said antenna (e.g. the antenna may be mounted or formed on the first surface of the MEMS substrate (e.g. laterally) offset from the MEMS switches).

It may be that the second surface of the (e.g. semiconductor) capping substrate comprises the said antenna (e.g. the antenna may be mounted or formed on the said second surface of the said (e.g. semiconductor) capping substrate). In this way, the antenna can be positioned close to the signal conductor, allowing a short conductive connection to be made between them (e.g. a conductive connection comprising a conductive through substrate via passing through the (e.g. semiconductor) capping substrate), thereby reducing losses particularly at high signal frequencies.

It may be that the said antenna is (e.g. (typically laterally) offset from the MEMS switches, e.g. in a direction having a component in a plane perpendicular to a stacking direction in which the MEMS substrate is stacked on the capping substrate).

It may be that the said antenna is provided (e.g. formed) in the capping substrate, for example in the form of a substrate integrated waveguide (SIW). It may be that the antenna substrate is connected to the capping substrate containing one or more additional antennas.

It may be that the said antenna is provided (e.g. formed) on an antenna substrate discrete from the MEMS and capping substrates. It may be that the antenna substrate is connected (e.g. bonded) to (e.g. the second surface of) the MEMS substrate.

It may be that the antenna substrate is a (e.g. semiconducting or insulating) semiconductor antenna substrate. It may be that the antenna substrate is a laminate substrate, a monolithic substrate, a low temperature co-fired ceramic (LTCC) substrate, a high temperature co-fired ceramic (HTCC) substrate, an organic substrate, a multi-layer organic substrate (such as a multi-layer organic substrate from Rogers Corporation), a glass substrate, a ceramic substrate, a glass ceramic substrate or an insulating substrate such as an alumina substrate.

It may be that the antenna substrate is crystalline. It may be that the antenna substrate is monocrystalline. It may be that the antenna substrate is polycrystalline. By providing a crystalline (preferably monocrystalline) antenna substrate, signal losses can again be reduced, particularly at high signal frequencies.

It may be that the MEMS substrate and the (e.g. semiconductor) capping substrate (and in some embodiments, where provided, the antenna substrate) are arranged together in a stack (e.g. stacked one on top of the other). It may be that the (e.g. semiconductor) capping substrate is (e.g. vertically) offset from the MEMS substrate (e.g. in a stacking direction of the said capping substrate on the MEMS substrate). It may be that the antenna substrate is stacked on the second surface of the MEMS substrate. It may be that the antenna substrate is (e.g. vertically) offset from the MEMS substrate (e.g. in a stacking direction of the said antenna substrate on the MEMS substrate). In this way, a compact integrated package can be provided comprising the antenna, the signal conductor, the MEMS switches and the ICs. This allows signal propagation paths to be reduced in length, thereby keeping parasitic and signal losses low within the antenna apparatus, particularly at high signal frequencies (e.g. millimetre wave). When the MEMS substrate and the antenna substrate (where provided) are semiconductor substrates, the antenna apparatus can be manufactured reliably, inexpensively and at high volume using (typically serial) semiconductor (e.g. CMOS) fabrication processes.

Typically the antenna is exposed.

By providing the antenna on an antenna substrate which is separate from the semiconductor IC substrate and the MEMS substrate, manufacture of the antenna apparatus is simplified.

It may be that the antenna substrate comprises opposing first and second surfaces. It may be that the first surface of the antenna substrate is connected (e.g. bonded) to (e.g. the second surface of) the MEMS substrate. It may be that the second surface of the antenna substrate comprises the antenna. It may be that the antenna is provided (e.g. formed) on the second surface of the antenna substrate.

It may be that the first surface of the antenna substrate or the second surface of the MEMS substrate comprises a conductive antenna ground plane. It may be that the said first surface of the antenna substrate or second surface of the MEMS substrate further comprises an insulating portion surrounding a through substrate via connecting the antenna to the signal conductor.

It may be that the antenna substrate is monolithic.
It may be that the antenna substrate is single layered.
It may be that the capping substrate is monolithic.

It may be that one or more or each of the MEMS substrate and the antenna substrate (where provided) comprise or consist of material having a dielectric constant greater than 3, more preferably greater than 5, more preferably greater than 8, even more preferably greater than 10, in some embodiments greater than 11.69, in some embodiments greater than 12, in some embodiments greater than 15, in some embodiments greater than 20, in some embodiments greater than 50.

It may be that one or more or each of the MEMS substrate, the capping substrate and the antenna substrate (where provided) are homogeneous.

It may be that the capping portion of the (e.g. semiconductor) capping substrate comprises one or more or each of the said IC(s) (or at least a portion of one or more said ICs). It may be that one or more or each of the said ICs (or at least a portion of one or more said ICs) are provided on a portion of the (e.g. semiconductor) capping substrate not comprising the capping portion (e.g. (typically laterally) offset from the capping portion of the capping substrate, e.g. in a direction having a component in a plane perpendicular to the stacking direction of the (e.g. semiconductor) capping substrate on the MEMS substrate).

It may be that the capping substrate and/or the MEMS substrate comprises a redistribution layer configured to conductively connect one or more of the said ICs to one or more of the MEMS switches. Typically the redistribution layer redistributes one or more conductive pads of one or more said ICs towards one or more conductive pads of the MEMS substrate (typically in communication with one or more of the MEMS switches). It may be that the redistribution layer is provided in or on the capping substrate.

It may be that the semiconductor IC substrate further comprises one or more lumped (typically impedance) elements (e.g. capacitors, resistors, inductors). It may be that the capping substrate and/or the MEMS substrate comprises a redistribution layer configured to conductively connect one or more said lumped elements to one or more of the MEMS switches.

Typically the capping substrate is an interposer substrate comprising a conductive interface (e.g. the interposer substrate provides a signal routing layer) configured to conductively connect the said IC(s) to the signal conductor and/or to the MEMS switches. It may be that the conductive interface is provided in the capping portion. It may be that one or more of the ICs are conductively connected to the MEMS switches by way of one or more conductive paths. It may be that one or more of the ICs (e.g. comprising the MEMS controller) are conductively connected to the MEMS switches by way of (typically deposited and/or patterned, typically digital, typically high voltage) signal tracks and/or one or more conductive through substrate vias (e.g. extending at least part of the way (or fully) through the (e.g. semiconductor) capping substrate) which carry signals between the said ICs and the MEMS switches. It may be that one or more of the ICs comprising signal processing circuitry are conductively connected to the signal conductor by way of one or more conductive through substrate vias extending (or together extending) at least part of the way (or fully) through the (e.g. semiconductor) capping substrate and/or through the MEMS substrate and/or through the antenna substrate. It may be that the interposer substrate (e.g. the conductive interface) comprises one or more conductive through substrate vias. It may be that the interposer substrate further comprises one or more integrated components or (e.g. passive) devices, such as one or more lumped elements (e.g. one or more capacitors, one or more inductors or one or more resistors). It may be that the said one or more integrated components or passive devices are provided as part of the conductive interface.

It may be that the MEMS substrate comprises or consists of a (e.g. insulating or semiconducting) semiconductor substrate, for example comprising or consisting of silicon, silicon dioxide, aluminium oxide, sapphire, germanium, silicon-germanium (SiGe), an alloy of silicon and germanium, gallium arsenide (GaAs), gallium nitride (GaN), or indium phosphide (InP).

By the MEMS substrate being a semiconductor substrate, the MEMS switches can be formed thereon more accurately and reliably, with higher yield, and more cost effectively than other types of substrate because semiconductor substrates can be processed using (mature, well developed) semiconductor (e.g. CMOS) fabrication techniques.

It may be that the MEMS substrate is a crystalline ceramic substrate.

It may be that the MEMS substrate has a polycrystalline structure.

It may be that the MEMS substrate has a monocrystalline structure.

It may be that the MEMS substrate is a glass substrate.

It may be that the MEMS substrate is a ceramic substrate.

It may be that the MEMS substrate is a glass ceramic substrate.

It may be that the MEMS substrate comprises a semiconductor-on-insulator substrate comprising a semiconductor layer provided on an insulating layer. For example, it may be that the MEMS substrate comprises silicon-on-sapphire. It may be that the said at least a portion of the signal conductor supported by the MEMS substrate is in electromagnetic communication with the MEMS substrate. It may be that the said at least a portion of the signal conductor supported by the MEMS substrate is in electromagnetic communication with the (typically crystalline) insulator (e.g. sapphire) portion of the semiconductor-on-insulator MEMS substrate (where provided).

It may be that the said at least a portion of the signal conductor is formed on a monocrystalline surface of the MEMS substrate. It may be that the signal conductor is in electromagnetic communication with a crystalline (e.g. monocrystalline) surface of the MEMS substrate.

It may be that the MEMS substrate is monolithic.

It may be that the MEMS substrate is single layered, bi-layered (e.g. semiconductor on insulator) or tri-layered (e.g. semiconductor on insulator on semiconductor).

Typically the antenna apparatus comprises a seal between the capping portion and the MEMS substrate. Typically the seal is a hermetic seal. It may be that the enclosed volume between the capping portion and the MEMS substrate is substantially at vacuum pressure. It may be that the enclosed volume between the capping portion and the MEMS substrate is substantially at atmospheric pressure; in this case, the enclosed volume is typically filled with a gas, such as an inert gas or nitrogen. By providing the volume between the capping portion and the MEMS substrate at substantially atmospheric pressure, the probability of a leak occurring in the seal is typically reduced because of the reduced pressure differential between the enclosed volume and the surrounding environment. It may be that the enclosed volume between the capping portion and the MEMS substrate is at a pressure intermediate vacuum and atmospheric pressure (e.g. between 10% and 90% of atmospheric pressure, e.g. between 25% and 75% of atmospheric pressure, e.g. substantially 50% of atmospheric pressure) in order to reduce seal leakage (as compared to vacuum pressure) and to increase switching speed (as compared to atmospheric pressure) of the MEMS switches.

Typically at least a portion or all of the signal conductor is provided within the said enclosed volume formed between the capping portion and the said at least a portion of the MEMS substrate. It may be that the MEMS switches comprise respective bridges which extend across the signal conductor. It may be that the signal conductor and bridges of the MEMS switches are provided (typically built up) on a substantially planar MEMS substrate.

It may be that the first surface of the capping portion comprises a cavity (typically aligned vertically, or aligned along an axis defined by the stacking direction in which the capping substrate is stacked on the MEMS substrate) provided over the MEMS switches to thereby allow the MEMS switches to (typically independently, typically selectively) move unimpeded between first and second states when the capping portion is installed over the MEMS substrate.

It may be that, for one or more or each of the antenna modules, the cavity comprises conductive tracks configured to route signals (e.g. to and/or from one or more integrated circuits, to and/or from the antenna, to and/or from the signal conductor, or to and/or from the MEMS switches).

Typically the said enclosed volume comprises the said cavity. It may be that the cavity comprises at least a portion of the said one or more ICs.

It may be that the MEMS switches are switchable between at least first and second states. It may be that the said MEMS controller is configured to reconfigurably control the states of the respective MEMS switches. It may be that at least some of the MEMS switches are configured to interact with signals propagating on the signal conductor, at least when they are in one of the said first and second states.

It may be that the one or more MEMS switches comprise one or more capacitive switches of a reconfigurable MEMS phase shifter configured to (typically individually and selectively) adjust a phase of an electromagnetic (typically RF) signal propagating on the signal conductor to or from the antenna (e.g. for beam steering). It may be that the one or more MEMS switches comprise one or more (e.g. ohmic) switches of a variable gain attenuator configured to (typically individually and selectively) adjust an amplitude of an electromagnetic (typically RF) signal propagating on the signal conductor to or from the antenna. It may be that the one or more MEMS switches comprise one or more (e.g. capacitive or ohmic) switches of a (typically variable gain) MEMS power amplifier and/or a (typically variable gain) MEMS low noise amplifier configured to (typically individually and selectively) amplify electromagnetic signals propagating on the signal conductor.

It may be that the one or more MEMS switches of a reconfigurable MEMS phase shifter and/or the one or more MEMS switches of a variable gain attenuator and/or the one or more MEMS switches of the MEMS power amplifier and/or MEMS low noise amplifier comprises one or more MEMS (e.g. capacitive) switches each being switchable between first and second states. When the MEMS switches are capacitive, the capacitances of the respective MEMS switches are typically different in their first states as compared to their second states. One or more of the said switches (e.g. of the variable gain attenuator) may be ohmic (e.g. metal-to-metal contact) switches. It may be that the said (e.g. capacitive) switches each comprise a bridge (e.g. extending over the signal conductor), the bridge being movable between first and second (physical) states (e.g. to thereby change the capacitance of the switch). It may be that an impedance (e.g. capacitance, inductance or resistance) of the switch is different (e.g. greater) when the bridge is in the second position compared to the first position. Typically the bridge is spaced from the signal conductor in the first (e.g. up) state and closer to (e.g. in contact with) the signal conductor in the second (e.g. down) state as compared to the first state (e.g. such that the impedance (e.g. capacitance) of the switch is greater in the second state than in the first state). It may be that a dielectric layer comprising solid dielectric material is provided between the signal conductor and the bridge (typically to prevent a short circuit between the bridge and the signal conductor and/or to provide the required capacitance needed).

It may be that the MEMS switches are electrostatically actuated.

It may be that each of the MEMS switches is electrostatically actuated by way of a respective DC bias signal.

It may be that the signal processing circuitry comprises analogue integrated circuitry, digital integrated circuitry or mixed signal integrated circuitry comprising both analogue and digital circuitry. It may be that the signal processing circuitry comprises integrated electronic circuitry and/or integrated radio frequency circuitry.

Typically the MEMS controller is configured to control which of the first and second states the said one or more MEMS switches are in. It may be that the MEMS controller is configured to receive control signals specifying which of the MEMS switches should be in their first states and/or which of the MEMS switches should be in their second states (e.g. in order to apply a particular phase shift or apply an attenuation or gain of a certain value to a signal carried by the signal conductor). In this case, it may be that the control signals are provided by control circuitry external to the antenna module (or external to an array comprising the antenna module) or by a master MEMS controller (e.g. of an array comprising the antenna module). The control circuitry is typically configured to convert a target phase shift and/or a target signal amplitude and/or gain and/or steering direction to the said control signals (e.g. using a look-up table or by performing one or more algorithms retrieved from a memory).

Alternatively, it may be that the MEMS controller is configured to receive as inputs target phase shifts and/or target steering directions and/or target gains and/or target signal amplitudes and to determine from the target phase shifts and/or target steering directions and/or target gains and/or target signal amplitudes MEMS switch configurations for implementing the said target phase shifts and/or target steering directions and/or target gains and/or target signal amplitudes (typically including which of the MEMS switches should be in their first states and/or which of the MEMS switches should be in their second states).

It may be that the said MEMS controller is further configured to implement the said determined configuration by way of control signals (e.g. to cause the said MEMS switches which should be in their first states to remain in, or change state to, their first states and/or to cause the said MEMS switches which should be in their second states to remain in, or change state to, their second state (e.g. by applying, continuing to apply, removing or continuing to not apply an electrostatic actuation voltage to the said switches)). In the event that control signals are configured to cause one or more switches to remain in their first or second states, it may be that the MEMS controller is configured to provide (typically DC) control signals of alternating polarity to thereby cause the said one or more switches to remain in their first or second states. This helps to reduce charge build up (and stiction) on the MEMS bridges. Thus, the MEMS controller may be configured to control (and typically adjust) a polarity of control signal applied to the MEMS switches to thereby reduce stiction. The MEMS controller may also transmit control signals to switch the antenna array between transmitting and receiving, and vice versa.

It may be that the MEMS controller (or the control circuitry) comprises memory. It may be that the memory stores a plurality of control signal data portions each of which is associated with a phase shift and/or signal amplitude and/or signal gain and/or steering direction in the memory, each of the control signal data portions being suitable for controlling one or more of the said MEMS switches to cause the said phase shift and/or signal amplitude and/or signal gain and/or steering direction. It may be that the MEMS controller (or the control circuitry) is configured to receive a target phase shift and/or signal amplitude and/or signal gain and/or steering direction as an input and to select a control signal data portion from the memory associated with the received input. It may be that the said MEMS control circuitry is configured to implement the target phase shift and/or signal amplitude and/or signal gain and/or steering direction in dependence on the said selected control signal portion.

It may be that the memory stores computer program instructions for implementing one or more algorithms for determining control signals for one or more MEMS switches to achieve a target phase shift and/or a target steering direction and/or a target gain and/or a target signal amplitude received as inputs. It may be that the MEMS controller (or the control circuitry) is configured to retrieve computer program instructions for implementing one or more said algorithms from the memory and to execute them to determine a configuration of the MEMS switches (e.g. for implementing the target phase shift and/or steering direction and/or gain and/or signal amplitude to a signal carried by the signal conductor); and to implement the determined states by sending control signals to the respective MEMS switches.

It may be that the signal processing circuitry comprises a (e.g. semiconductor, e.g. CMOS) power amplifier configured to amplify RF signals to be transmitted by the antenna. It may be that the signal processing circuitry comprises a (e.g. semiconductor, e.g. CMOS) low noise amplifier configured to amplify RF signals received by the antenna. It may be that the signal processing circuitry comprises an analogue to digital converter configured to convert an analogue signal received by the antenna into a digital signal and/or a digital to analogue converter configured to convert a digital signal into an analogue signal for transmission by the antenna. It may be that the signal processing circuitry comprises a digital interface configured to interface with external (i.e. external to the array comprising the antenna apparatus) digital circuitry (e.g. digital baseband circuitry in a portable wireless communications device comprising the antenna or an overall system processor or controller or a controller of a small, micro or femto cell or (typically wireless) backhaul, transmitter, receiver or transceiver). It may be that the signal processing circuitry comprises a (e.g. semiconductor, e.g. CMOS) attenuator configured to (typically individually and selectively) attenuate signals received and/or to be transmitted by the antenna.

Typically the antenna apparatuses of any aspect of the invention are provided as part of a phased antenna array comprising a plurality of said antenna apparatuses (or modules). Typically each antenna of the array is conductively connected to a respective signal conductor.

The invention extends in to a phased antenna array comprising a plurality of said antenna apparatuses (or modules). It may be that the antenna modules of the array are identical to each other. Alternatively, it may be that the antenna modules are not identical to each other. For example, the array may comprise a plurality of sub-arrays of antenna modules, wherein the antenna modules of different sub-arrays differ from each other. For example, the antennas of the antenna modules of one sub-array may have a different polarity from those of another sub-array (e.g. a neighbouring sub-array) to reduce interference (and therefore boost performance). One sub-array may be used for signal transmission and another (e.g. neighbouring sub-array) used for receiving signals.

It may be that the phased antenna array is a multiple input and/or multiple output (MIMO) phased antenna array. It may be that a plurality of inputs are provided by respective said sub-arrays and/or it may be that a plurality of outputs are provided by respective said sub-arrays.

It may be that the antennas of the array share a common ground plane.

It may be that the phased antenna array further comprises one or more (typically CMOS) integrated circuits (ICs) formed on a semiconductor (typically semiconducting) IC substrate, the said one or more ICs comprising one or more MEMS controllers configured or together configured to control the said one or more MEMS switches, and/or (typically active) signal processing circuitry (e.g. transmitter, receiver or transceiver circuitry) configured to process signals received and/or to be transmitted by the antenna. It may be that one or more of the ICs (e.g. MEMS controller) comprise memory.

It may be that the antenna modules and integrated circuits are supported by a common carrier substrate comprising (e.g. on which are formed) any one or more of the group comprising (or consisting of): the antennas of the antenna modules; the MEMS switches of the antenna modules; and the said one or more integrated circuits.

The invention extends to a (e.g. cellular mobile) wireless telecommunications base station or a small, micro or femto cell infrastructure, or (typically wireless) backhaul, transmitter, receiver or transceiver comprising said antenna apparatus (or one or more antenna modules) or said phased antenna array.

The invention extends to a portable personal mobile wireless telecommunications device comprising one or more said antenna modules or a said phased antenna array.

The invention extends in a second aspect to a method of manufacturing antenna apparatus, the antenna apparatus comprising an antenna, one or more radio frequency (RF) microelectromechanical (MEMS) switches, providing a MEMS substrate, forming the MEMS switches on the MEMS substrate; providing a capping substrate comprising a capping portion; and connecting the capping portion to the MEMS substrate.

The method may comprise forming at least a portion of a signal conductor on the MEMS substrate. The signal conductor may be conductively connected to the signal conductor.

Connecting the capping portion to the MEMS substrate may form an enclosed volume around the said MEMS switches between the capping portion and at least a portion of the MEMS substrate.

The method may further comprise forming one or more through substrate vias which extend through the MEMS substrate or the capping portion.

It may be that the one or more through substrate vias connect the signal conductor to a MEMS controller or RF signal processing circuitry external to the enclosed volume. It may be that at least one, or each, said through substrate via is hermetic. I It may be that at most six through substrate vias extending into the enclosed volume are formed.

The method may further comprise forming at least one non-hermetic through-substrate via not extending into the enclosed volume to connect the MEMS switches to one or more ICs.

The method may comprise forming a seal between the capping substrate and the MEMS substrate, such that at least one digital control signal line extends out of the enclose volume under the seal on the surface of the capping substrate or MEMS substrate, the at least one digital control signal line conducting digital signals used to control the actuation of the MEMS switches in use.

The method may further comprise forming a seal between the capping substrate and the MEMS substrate, wherein at least one MEMS switch control signal line extends out of the enclosed volume under the seal on the surface of the capping substrate or MEMS substrate, the at least one MEMS switch control signal line extending to a MEMS controller external to the enclosed volume and conducting MEMS switch control signals in use.

It may be that in use, each RF signal extending into the enclosed volume is conducted through a said through substrate via.

The method may comprise forming the antenna on the capping substrate and the antenna is conductively connected to the signal conductor by way of a through via which extends through the capping substrate.

The capping substrate may be a CMOS capping substrate.

The method may further comprise forming a controller portion in or on the capping portion.

The capping substrate thereby formed may be a single layered capping substrate.

The invention also extends to a method of manufacturing antenna apparatus (e.g. an antenna module), the antenna apparatus comprising an (e.g. RF) antenna, one or more RF microelectromechanical (MEMS) switches and a signal conductor, the antenna being conductively connected to the signal conductor, the method comprising: providing a (e.g. crystalline) MEMS substrate; providing (e.g. forming) the MEMS switches and at least a portion of the signal conductor on the crystalline MEMS substrate; providing a (typically semiconductor) capping substrate comprising a capping portion; forming the antenna (and/or a MEMS controller) in or on the capping substrate; and connecting (e.g. mounting, typically stacking, typically bonding, e.g. flip-chip bonding, or encapsulating) the capping portion to the crystalline MEMS substrate such that an enclosed volume is formed around the MEMS switches between the capping portion and at least a portion of the crystalline MEMS substrate.

The invention also extends to a method of manufacturing antenna apparatus (e.g. an antenna module), the antenna apparatus comprising an (e.g. RF) antenna, one or more RF microelectromechanical (MEMS) switches and a signal conductor, the antenna being conductively connected to the signal conductor, the method comprising: providing a (typically crystalline) MEMS substrate; providing (e.g. forming) the MEMS switches and at least a portion of the signal conductor on the MEMS substrate; providing a (typically single layered) capping substrate comprising a capping portion; forming the antenna (or a MEMS controller) in or on the capping substrate; and connecting (e.g. mounting, typically stacking, typically bonding, e.g. flip chip bonding, or encapsulating) the capping portion to the MEMS substrate such that an enclosed volume is formed around the MEMS switches between the capping portion and at least a portion of the MEMS substrate.

The method may further comprise conductively connecting the antenna to the signal conductor (e.g. by way of a through via, e.g. extending at least part of the way (or fully) through the capping substrate).

It may be that the method comprises forming the said at least a portion of the signal conductor on the said MEMS substrate such that the said signal conductor is in electromagnetic communication with the MEMS substrate.

Typically the MEMS switches and the signal conductor are formed on the MEMS substrate by serial (e.g. modified) semiconductor (e.g. CMOS) fabrication processes, e.g. comprising any one or more of: deposition of material onto the MEMS substrate; patterning (e.g. photolithography) of the deposited material; and etching.

Typically the capping substrate comprises a first surface which is connected (e.g. bonded) to the MEMS substrate and a second surface opposite the first surface.

Typically the step of forming the antenna in or on the capping substrate comprises forming the antenna on the second surface of the capping substrate.

It may be that the step of forming the antenna in or on the capping substrate comprises forming the antenna in or on the capping portion of the capping substrate. It may be that the step of forming the antenna in or on the capping substrate comprises forming the antenna on the capping substrate laterally offset from the capping portion (e.g. in a direction having a component in a plane perpendicular to a stacking direction of the capping portion on the MEMS substrate).

Typically the step of forming the antenna in or on the capping substrate comprises forming the antenna on the second surface of the (e.g. capping portion of the) capping substrate. It may be that the step of forming the antenna comprises depositing and patterning (e.g. by photolithography) metal (e.g. on the second surface of the capping substrate).

It may be that the method comprises connecting (e.g. mounting) the capping portion to the MEMS substrate such that the said enclosed volume is formed around the MEMS switches between the capping portion and the at least a portion of the MEMS substrate; and evacuating the enclosed volume between the capping portion and the said at least a portion of the MEMS substrate, e.g. to substantially a vacuum (e.g. by placing the capping portion and the MEMS substrate in a vacuum chamber). In some embodiments, one or more antennas are thereby encapsulated. In some embodiments, the enclosed volume may or may not cover the antenna. In some embodiments, the antenna is formed on the MEMS substrate and in contact with the capping portion or formed on the capping portion and in contact with the MEMS substrate. The capping portion may dielectrically load the antenna, substantially reducing external effects.

It may be that the method comprises connecting (e.g. mounting) the capping portion to the MEMS substrate such that the said enclosed volume is formed around the MEMS switches between the capping portion and the at least a portion of the MEMS substrate; and filling the enclosed volume with an inert gas or nitrogen (e.g. by placing the capping portion and the at least a portion of the MEMS substrate in a chamber and filling the chamber with pressurised inert or nitrogen gas, typically at atmospheric pressure or at a pressure intermediate vacuum and atmospheric pressure, for example between 25% and 75% of atmospheric pressure).

Typically the method comprises bonding the capping portion to the MEMS substrate.

Typically the step of connecting the capping portion to the MEMS substrate comprises: providing a seal (e.g. one or more sealing rings such as one or more metallic sealing rings) between the capping portion and the at least a portion of the MEMS substrate; melting the seal; and cooling (thereby solidifying) the seal to bond the capping portion to the MEMS substrate. Typically the seal extends around the MEMS switches on the MEMS substrate.

It may be that the MEMS substrate and/or the capping portion comprises one or more grooves configured to receive reflowed material (e.g. metal) from the seal during bonding. It may be that the grooves are provided between the seal and the MEMS switches. Typically the method comprises grooves inhibiting (preferably preventing) reflowed material from coming into contact with the MEMS switches during melting of the seal. It may be that the method further comprises (typically vertically, or along an axis defined by the stacking direction in which the capping substrate is stacked on the MEMS substrate) aligning the MEMS substrate with the capping substrate using the said grooves.

It may be that the method further comprises providing a semiconductor (typically semiconducting) integrated circuit (IC) substrate. It may be that the method further comprises forming one or more (typically CMOS) ICs on the semiconductor IC substrate by serial semiconductor (typically high voltage CMOS) fabrication processes (typically comprising any one or more (or all) of: material deposition, patterning, etching and doping). Typically the ICs comprise a MEMS controller configured to control the said one or more MEMS switches and/or (typically active) signal processing circuitry (e.g. transmitter, receiver or transceiver circuitry) configured to process signals received and/or to be transmitted by the antenna. It may be that the MEMS controller comprises a memory.

It may be that the method comprises stacking the capping substrate on a first surface of the MEMS substrate internal to the enclosed volume (or vice versa). It may be that the method comprises stacking the (typically discrete) semiconductor IC substrate on a second surface of the MEMS substrate opposite the first surface of the MEMS substrate (and typically external to the enclosed volume) or vice versa. It may be that the method comprises arranging the capping substrate, the MEMS substrate and (in some embodiments, where provided) the semiconductor IC substrate together in a stack (e.g. stacked one on top of the other).

It may be that the method comprises conductively connecting the MEMS controller to the MEMS switches by way of one or more conductive paths (e.g. provided by (typically deposited and/or patterned, typically digital, typically high voltage) signal tracks and/or one or more conductive through substrate vias which carry signals between the said MEMS controller and the MEMS switches). It may be that the method comprises forming one or more conductive through substrate vias at least part of the way (or fully) through the MEMS substrate and/or the semiconductor IC substrate (e.g. by etching and deposition) to thereby conductively connect the MEMS controller and the MEMS switches.

It may be that the method comprises conductively connecting the signal processing circuitry to the signal conductor by way of one or more conductive paths (e.g. provided by (typically deposited and/or patterned, typically digital, typically high voltage) signal tracks and/or one or more conductive through substrate vias which carry signals between the said signal processing circuitry and the signal conductor). It may be that the method comprises forming one or more conductive through substrate vias at least part of the way (or fully) through the MEMS substrate and/or the semiconductor IC substrate (e.g. by etching and deposition) to thereby conductively connect the signal processing circuitry to the signal conductor.

It may be that the method comprises conductively connecting one or more of the said ICs to one or more of the MEMS switches by way of a redistribution layer of the capping and/or MEMS substrate. Typically the redistribution layer redistributes one or more conductive pads of one or more said ICs towards one or more conductive pads of the MEMS substrate (typically in communication with the MEMS switches).

It may be that the method comprises forming one or more through vias extending at least part of the way (or fully) through the capping substrate and/or through the MEMS substrate and/or through the semiconductor IC substrate (e.g. by etching and deposition) to thereby conductively connect one or more of the ICs (e.g. comprising signal processing circuitry) to the signal conductor or to the MEMS switches.

It may be that the semiconductor IC substrate comprises a first surface connected (e.g. bonded) to the MEMS substrate and a second surface opposite the first surface. It may be that at least a portion of one or more of the ICs are provided on the first surface of the semiconductor IC substrate. It may be that at least a portion of one or more of the ICs are provided on the second surface of the semiconductor IC substrate. It may be that at least a portion of a first IC is provided on the first surface of the semiconductor IC substrate and at least a portion of a second IC (or a different portion of the first IC) is provided on the second surface of the semiconductor substrate.

The invention also extends to a method of manufacturing antenna apparatus (e.g. an antenna module), the antenna apparatus comprising an antenna and one or more RF microelectromechanical (MEMS) switches, the method comprising: providing a (typically crystalline) MEMS substrate; forming the MEMS switches on the MEMS substrate; providing a (e.g. semiconductor) capping substrate comprising a capping portion; providing (e.g. forming) one or more (typically CMOS) integrated circuits (ICs) in or on the (e.g. semiconductor) capping substrate, the one or more ICs comprising a MEMS controller configured to control the said one or more MEMS switches and/or (typically active) signal processing circuitry (e.g. transmitter, receiver or transceiver circuitry) configured to process signals received and/or to be transmitted by the antenna; and connecting (e.g. mounting, typically stacking, typically bonding, e.g. flip-chip bonding, or encapsulating) the capping portion to the MEMS substrate such that an enclosed volume is formed around the MEMS switches between the capping portion and at least a portion of the MEMS substrate.

It may be that the antenna apparatus further comprises a signal conductor conductively connected to the antenna, at least part of the signal conductor being provided (e.g. formed) on the MEMS substrate.

Typically the MEMS switches and the signal conductor are formed on the MEMS substrate by serial semiconductor (e.g. CMOS) fabrication processes. Typically the MEMS switches and the signal conductor are formed on the MEMS substrate by serial semiconductor (e.g. CMOS) fabrication processes comprising any one or more or each of: deposition of material onto the MEMS substrate; patterning of the deposited material; and etching.

Typically the capping substrate comprises a first surface bonded to the MEMS substrate and a second surface opposite the first surface.

It may be that the MEMS substrate comprises a first surface bonded to the first surface of the capping substrate. It may be that the MEMS substrate comprises a second surface opposite its first surface.

It may be that the method comprises connecting (e.g. mounting, e.g. bonding) the capping portion to the MEMS substrate such that the said enclosed volume is formed around the MEMS switches; and evacuating the enclosed volume between the capping portion and the at least a portion of the MEMS substrate, e.g. to substantially a vacuum (e.g. by placing the capping portion and the at least a portion of the MEMS substrate in a vacuum chamber).

It may be that the method comprises connecting (e.g. mounting, e.g. bonding) the capping portion to the MEMS substrate such that the said enclosed volume is formed around the MEMS switches; and filling the enclosed volume with an inert gas or nitrogen (e.g. by placing the capping portion and the at least a portion of the MEMS substrate in a chamber filled with pressurised inert or nitrogen gas).

Typically the step of bonding the capping portion to the MEMS substrate comprises: providing a seal (e.g. one or more sealing rings such as one or more metallic sealing rings) between the capping portion and the MEMS substrate; melting the seal; and cooling (thereby solidifying) the seal to bond the capping portion to the MEMS substrate. Typically the seal extends around the MEMS switches on the MEMS substrate.

It may be that the MEMS substrate and/or the capping portion comprises one or more grooves configured to receive reflowed material (e.g. metal) from the seal during bonding. It may be that the grooves are provided between the seal and the MEMS switches. Typically the grooves thereby inhibit (preferably prevent) reflowed material from coming into contact with the MEMS switches during manufacture. It may be that the method further comprises (typically vertically, or along an axis defined by the stacking direction in which the capping substrate is stacked on the MEMS substrate) aligning the MEMS substrate with the capping substrate using the said grooves.

It may be that the step of forming one or more ICs on the semiconductor IC substrate is performed by serial semiconductor (e.g. high voltage CMOS) fabrication processes (typically comprising any one or more or each of: material deposition; patterning; etching; and doping).

It may be that the method comprises conductively connecting one or more of the said ICs to one or more of the MEMS switches by way of a redistribution layer of the MEMS substrate and/or of the capping substrate. Typically the redistribution layer redistributes one or more conductive pads of one or more said ICs towards one or more conductive pads of the MEMS substrate (typically in communication with the MEMS switches).

It may be that the method comprises forming the antenna on the (e.g. second surface of the) capping portion (e.g. by depositing and/or patterning conductive material on the said (e.g. second surface of the) capping portion).

It may be that the method comprises forming the antenna on the (e.g. first or second surface of the) MEMS substrate.

It may be that the method comprises forming the antenna on an antenna substrate discrete from the MEMS substrate and the capping substrate. It may be that the method comprises arranging (and typically bonding) the antenna substrate and the MEMS substrate together in a stack (e.g. stacked one on top of the other). It may be that the method comprises stacking the antenna substrate on the (e.g. the second surface of the) MEMS substrate or vice versa. It may be that the method comprises stacking the MEMS substrate on the antenna substrate (e.g. on a first surface of the antenna substrate opposite a second surface of the antenna substrate on which the antenna is provided) or vice versa. It may be that the antenna substrate is a semiconductor substrate. It may be that the antenna is a laminate substrate. It may be that the antenna is a LTCC substrate. It may be that the antenna substrate is crystalline (e.g. monocrystalline or polycrystalline). It may be that the antenna substrate is single layered. It may be that the antenna substrate is monolithic. It may be that the antenna substrate is a high temperature co-fired ceramic (HTCC) substrate, an organic substrate, a multi-layer organic substrate (such as a multi-layer organic substrate from Rogers Corporation), a glass substrate, a ceramic substrate, a glass ceramic substrate, or an insulating substrate such as an alumina substrate.

It may be that the method comprises arranging the capping substrate, the MEMS substrate and (in some embodiments where provided) the antenna substrate together in a stack (e.g. stacked one on top of the other).

Typically the method further comprises conductively connecting the antenna to the signal conductor.

It may be that the method further comprises conductively connecting the MEMS controller to the MEMS switches by way of one or more conductive paths (e.g. provided by (e.g. deposited and/or patterned, typically digital, typically high voltage) signal tracks and/or one or more conductive through substrate vias (e.g. one or more conductive through substrate vias extending or together extending at least part of the way (or fully) through the capping substrate) which carry signals between the MEMS controller and the MEMS switches).

It may be that the method comprises conductively connecting the said signal processing circuitry to the signal conductor by way of one or more conductive through substrate vias extending (or together extending) at least part of the way (or fully) through the semiconductor capping substrate and/or through the MEMS substrate and/or through the semiconductor antenna substrate.

Typically the method further comprises conductively connecting the antenna to the signal conductor (e.g. by way of a through via, e.g. extending at least part of the way (or fully) through the capping substrate and/or at least part of the way (or fully) through the MEMS substrate and/or at least part of the way (or fully) through the antenna substrate).

In any of the above aspects of the invention it may be that the antenna is configured to transmit and/or receive RF electromagnetic signals at frequencies greater than 0.6 GHz, in some cases greater than 1 GHz, in some cases greater than 5 GHz, in some cases greater than 10 GHz, in some cases greater than 20 GHz, in some cases greater than 50 GHz, in some cases greater than 60 GHz, in some cases greater than 70 GHz.

Typically the capping substrate is discrete from the MEMS substrate.

The invention extends in a third aspect to phased array antenna apparatus comprising a plurality of (e.g. RF or microwave) antennas configured to wirelessly transmit and/or receive electromagnetic (e.g. RF or microwave) radiation, signal processing circuitry (e.g. transmitter, receiver or transceiver circuitry) configured to process signals received and/or to be transmitted by the said antennas; and the signal processing circuitry comprising one or more MEMS phase shifters or attenuators, the MEMS phase shifter or attenuators comprising MEMS switches, and configured to individually adjust the amplitudes of electromagnetic signals received and/or to be transmitted by each of the antennas of the array; one or more electromagnetic signal dividers and/or combiners; and a MEMS controller configured to control the MEMS switches of each of a plurality of antennas.

The invention extends in a fourth aspect to a method of operating a phased antenna array comprising a plurality of antennas, each of the said antennas configured to transmit and/or receive (e.g. radio frequency or microwave) electromagnetic signals, the method comprising: individually adjusting the power of electromagnetic signals received or to be transmitted by each of the said plurality of antennas.

The invention extends in a fifth aspect to a method of manufacturing phased antenna array apparatus, the method comprising: providing a plurality of antennas; and conductively coupling antenna signal processing circuitry to the said antennas, the antenna signal processing circuitry being configured to individually adjust the power of electromagnetic signals received and/or to be transmitted by each of the said plurality of antennas.

Although various aspects and embodiments of the present invention have been described separately above, any of the aspects and features of the present invention can be used in conjunction with any other aspect, embodiment or feature where appropriate. For example apparatus features may where appropriate be interchanged with method features.

DESCRIPTION OF THE DRAWINGS

An example embodiment of the present invention will now be illustrated with reference to the following Figures in which:

FIG. 1 is a schematic diagram of an antenna module comprising an antenna conductively connected to a MEMS phase shifter;

FIG. 2 is a schematic sectional view of a capacitive MEMS switch of the MEMS phase shifter of FIG. 1 having a bridge in a first (up) state;

FIG. 3 shows the switch of FIG. 2 with the bridge in a second (down) state;

FIG. 4 shows the antenna module of FIG. 1 stacked on a semiconductor IC substrate;

FIG. 5 is a schematic view of a portion of a phased antenna array having a plurality of antenna modules as shown in FIGS. 1 to 4 and having a common semiconductor IC substrate which carries the antenna modules of the array;

FIG. 5b is a schematic view of a portion of a similar array to FIG. 5 but with common MEMS and capping substrates;

FIG. 8 is a schematic diagram of an alternative phased antenna array to that shown in FIG. 5 wherein the antenna modules have a common antenna substrate which carries the antenna modules of the array (rather than a common semiconductor IC substrate);

FIG. 9 shows a similar phased array to that of FIG. 8 but with discrete interposer caps provided between the MEMS substrates and the carrier substrate;

FIG. 10 shows an alternative antenna module to that of FIGS. 1 to 4 where the semiconductor IC substrate comprises the antenna;

FIG. 11 is a sectional view through the module of FIG. 10;

FIG. 12 is a schematic diagram showing a portion of a phased antenna array having a plurality of the antenna modules of FIG. 10, with the antenna modules of the array having a common semiconductor IC substrate comprising the antennas of the array;

FIG. 13 is a schematic diagram of an alternative antenna module where the antenna is provided on the reverse side of the MEMS substrate from the MEMS switches;

FIG. 24 is a plan view of a phased antenna array having four sub-arrays the MEMS switches of the antenna modules within each sub-array being controlled by a common integrated circuit;

FIG. 25 is a plan view of a similar phased array to FIG. 24, but with the sub-arrays arranged in a grid;

DETAILED DESCRIPTION OF AN EXAMPLE EMBODIMENT

Figure 3A:
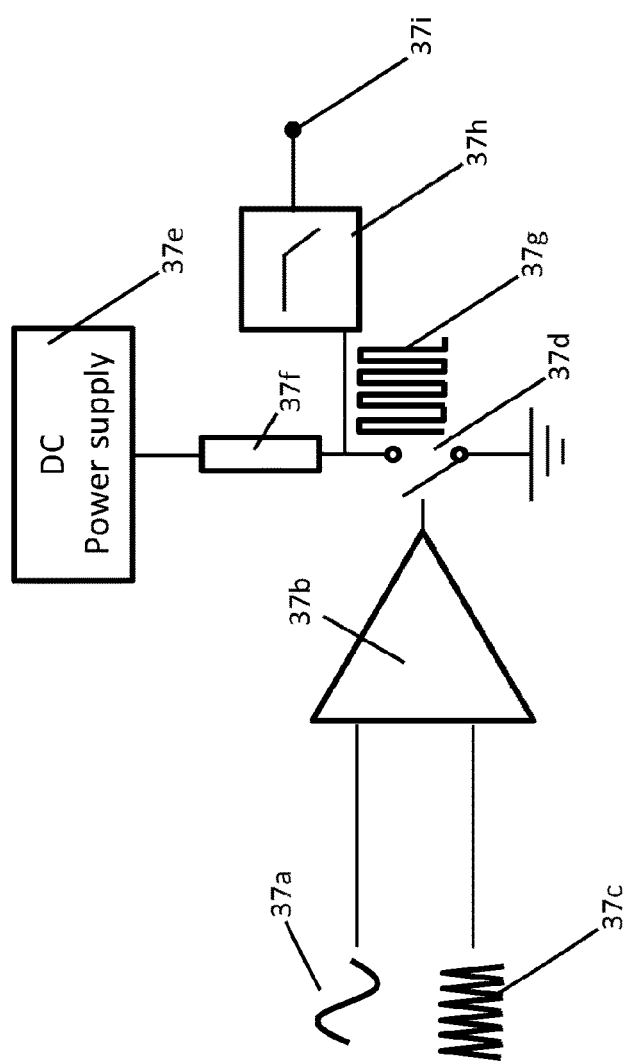
FIG. 3a is a schematic circuit diagram of a pulse width modulation (PWM) amplifier.

FIG. 1 shows an antenna module 1 of a phased antenna array, the antenna module having a (typically crystalline) semiconductor MEMS substrate (or wafer) 2 having a first surface 4 and a second surface 6 opposite the first surface 4, the first surface 4 supporting an electromagnetic (e.g. RF) signal conductor 14 together with a pair of ground conductors 15 which form a co-planar waveguide with the signal conductor 14 (although it is not necessary for a co-planar waveguide arrangement to provided; any suitable alternative arrangement may be provided, such as a microstrip arrangement in which a microstrip signal conductor 14 is provided on the first surface 4 of the substrate 2), and a plurality of reconfigurable MEMS switches, two of which 16, 18 are shown schematically in FIG. 1.

A first one of the MEMS switches 16 is shown more clearly in section in FIGS. 2 and 3. More specifically, the MEMS switch 16 is a capacitive switch comprising a conductive bridge 24 provided above and extending across the signal conductor 14, the bridge 24 having first and second conductive flexures extending from respective conductive anchors 20, 22 on the first surface 4 of the substrate 2 on either side of the signal conductor 14 where they are fixed (although alternatively the bridge may be cantilevered). A dielectric layer 28 comprising solid dielectric material is provided between the bridge 24 and the signal conductor 14 (in this case the dielectric layer 28 is provided on the signal conductor 14) to prevent a short circuit occurring between them and to provide the switch with the required capacitances. The bridge 24 is moveable by elastic deformation of the flexures between a first (up) relaxed state shown in FIG. 2 in which it is spaced from the dielectric layer 28 provided on the conductor 14 and a second (down) deformed state shown in FIG. 3 in which the bridge 24 engages the dielectric layer 28. The capacitance of the switch is greater in the second (down) state than in the first (up) state.

The MEMS switches 16, 18 comprise a plurality of capacitive MEMS switches of a reconfigurable MEMS phase shifter which helps to control a steering direction of the phased antenna array. By adjusting which of the MEMS switches 16, 18 are in their first states and which are in their second states, the phase of electromagnetic signals propagating on the electromagnetic signal conductor 14 can be adjusted. The capacitive MEMS switches can thus be controlled to individually and selectively adjust the phase of electromagnetic signals propagating on the electromagnetic signal conductor 14. Although only two MEMS switches 16, 18 are shown in FIG. 1, it will be understood that any suitable number of MEMS switches could be employed to achieve phase shifts of a required range and granularity. Indeed, typically, the MEMS substrate 2 supports 127 capacitive MEMS switches in order to provide up to a 360° phase shift with a granularity of around 2.8°. In this case, the capacitive MEMS switches of the phase shifter are grouped together to form seven groups of MEMS switches to thereby provide a 7-bit MEMS phase shifter. Specifically, the anchors 22 of respective groups of 64, 32, 16, 8, 4 and 2 different ones of the switches are conductively connected to each other so that applying a DC voltage to the groups of switches provides phase shifts of 181.42°, 90.7°, 45.35°, 22.68°, 11.33° and 5.67° respectively. The remaining group comprises a single capacitive MEMS switch which provides a phase shift of 2.83°. In this case, seven vias 32 are provided through the MEMS substrate 2 to connect the respective groups to MEMS control circuitry (see below).

The MEMS switches 16, 18 further comprise one or more MEMS switches of a variable gain attenuator configured to attenuate RF signals propagating on the signal conductor 14 to thereby provide individual and selective control of the amplitude of signals transmitted or received by the antenna module 1. The attenuator switches are typically adjacent to the phase shifter switches. The attenuator switches are typically ohmic and may, for example, be similar to the switch 16 described above but omitting the solid dielectric material in the dielectric layer 28 provided between the conductive bridge and the signal line. When the bridge engages the signal line, the length and therefore the impedance of the signal path increases, such that the signal is attenuated. Alternatively, the attenuator switches may be capacitive, in which case they typically have a relatively low capacitance in their off (up) states and a much greater capacitance in their on (down) states such that, when they are in their on (down) states, the capacitance of the switch causes attenuation of the signal. It may be that the attenuator switches cause some phase shift, which can be compensated for by the phase shifter. For example, any phase shift provided by MEMS attenuator switches can be accounted for by actuating fewer or more phase shifter switches in order to achieve a target phase shift and amplitude (or specific gain) for signals received and/or to be transmitted by the antenna module 1.

Each of the switches 16, 18 is actuated electrostatically from the first state to the second state by way of a DC voltage applied to one (or both) of the conductive anchors 20, 22 which causes a DC potential difference to be provided between the flexures of the bridge 24 and the ground conductors 15, thereby causing the flexures to deflect downwards. It will be assumed in the following description that the DC voltage is applied only to anchor 22. The DC voltage is applied to the anchor 22 by way of a conductive through substrate via 32 which extends (fully) through the MEMS substrate 2 from the second surface 6 to the first surface 4 to conductively connect the anchor 22 to MEMS control circuitry (see below with reference to FIG. 4). To move the bridge from the second (down) state to the first (up) state, the DC voltage signal is removed from the anchors 22, and the restoring elastic force of the flexures causes the bridge to move back to the first (up) state.

In some cases, the MEMS switches 16, 18 may additionally or alternatively comprise one or more MEMS switches of a MEMS power amplifier or a MEMS low noise amplifier configured to amplify electromagnetic signals to be transmitted and/or electromagnetic signals received by the antenna module 1. For example, a MEMS power amplifier or a MEMS low noise amplifier may comprise a MEMS amplifier based on the ones described in "The MEMSamp: using (RF-)MEMS switches for the microelectromechanical amplification of electronic signals", W Merlijn van Spengen, Sander B Roobol, Wouter P Klaassen and Tjerk H Oosterkamp, J. Micromech. Microeng. 20 (2010) 125011 (van Spengen) which is incorporated herein in full by reference. In this case, the MEMS amplifier is based on the circuit shown in FIG. 3b (which is a generic pulse width modulation based amplifier circuit). The input signal 37a to be amplified is input to a comparator 37b together with a pulse width modulation signal (typically a triangle wave) 37c. The triangle wave 37c causes a switch 37d to be turned on and off at the frequency of frequency of the triangle wave. The switch 37d is connected to a DC power supply 37e through impedance 37f. When the switch 37d turns on and off, a pulse train 37g is generated from the DC power source which has a higher power than the signals provided to the comparator inputs. The (non-zero) input signal 37a causes the moment of switching (and thus the pulse train 37g) to change. The pulse train (with changed moment) is passed through a low pass filter 37h to provide an output 37i, the output 37i having the same frequency and phase but greater amplitude than the input signal 37a.

Figure 3B:
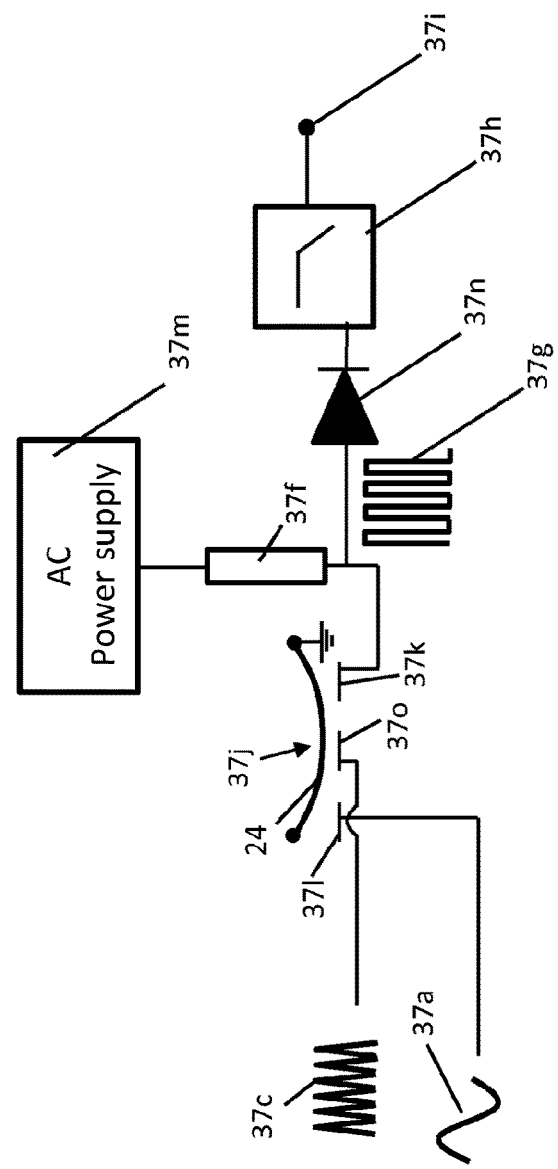
FIG. 3b is a schematic circuit diagram of a PWM amplifier using a capacitive MEMS switch.

FIG. 3b shows a similar circuit to that of FIG. 3a. Identical features will be allocated the same reference numerals. In this case, the input signal to be amplified is the signal 37a. A capacitive MEMS switch 37j comprising a conductive bridge which extends over the signal line 14 is provided. The MEMS bridge 24 is moveable between first (up) and second (down) states as described above. Electrodes 37k, 37l, 37o are provided under the bridge 24 of the MEMS switch 37j such that the capacitance between the bridge 24 and the electrodes 37k, 37l, 37o is greater when the bridge 24 is in the second state than when it is in the first state. The bridge 24 is grounded. A dielectric layer comprising solid dielectric material may be provided between the bridge 24 and one or each of the electrodes 37k, 37l, 37o to prevent a short circuit from occurring between the bridge and the electrode(s) (and/or to provide the required capacitance); alternatively, the bridge 24 may be controlled such that an air gap remains between the bridge 24 and the electrodes 37k, 37l, 37o when the bridge is in the second state. Signal 37a is applied to electrode 37l, while the triangle wave 37c described above is combined with a DC bias signal and applied to electrode 37o. A high frequency AC power supply 37m (rather than the DC power supply of FIG. 3a) is connected to the electrode 37k through impedance 37f. When the bridge 24 is in its first (up) state, the voltage at the opposing side of the impedance 37f from the AC power supply 37m is almost equal to that of the AC power supply 37m. When the switch 37j is in its second (down) state, a large fraction of the AC signal will be transmitted through electrode 37k. Thus, movement of the bridge 24 between the first and second states causes amplitude modulation of the AC signal from the power supply 37m. The triangle wave 37c (together with DC bias) applied to electrode 37o causes the bridge to be electrostatically switched up and down at the frequency of the triangle wave, resulting in a train of high frequency AC pulses at the frequency of the triangle wave. The duty cycle of the pulses is determined by the input voltage of the amplifier (i.e. the voltage of the signal 37a). The power in the pulses is determined by the AC voltage 37m, the impedance 37f and the properties of the switch 37j, rather than by the input signal. By rectifying the pulses (by way of diode 37n) and passing them through the low pass filter 37h, an amplified version of the original input signal 37a is provided. Alternative approaches are possible (and indeed described in van Spengen) with metal-to-metal contact MEMS switches.

The MEMS switches 16, 18 are thus configured to individually and selectively adjust the phase (and thus the steering direction) and/or gain and/or signal amplitude of electromagnetic signals propagating on the signal conductor 14.

By providing the signal conductor 14 on a crystalline MEMS substrate, electromagnetic (typically RF) signals propagating on the signal conductor 14 will experience low losses due to the substantially uniform (relatively defect free) structure of the crystalline substrate; this is particularly important at high signal frequencies (e.g. signal frequencies greater than 0.6 GHz, greater than 2 GHz, greater than 5 GHz, greater than 8 GHz, greater than 20 GHz, greater than 50 GHz or greater than 70 GHz). Although it may be that the crystalline MEMS substrate is polycrystalline, it is preferable that the MEMS substrate is monocrystalline or at least that the signal conductor is provided on a monocrystalline surface of the MEMS substrate (or at least the signal conductor is provided in electromagnetic communication with a monocrystalline MEMS substrate or a monocrystalline portion of the MEMS substrate). This is because monocrystalline structures are more uniform, which leads to more uniform propagation of electromagnetic signals over the substrate, thereby keeping signal losses low. In one example, the MEMS substrate 2 is a silicon-on-sapphire substrate comprising a layer of (typically monocrystalline) silicon grown on a (typically monocrystalline) layer of sapphire. In this case, the silicon layer is etched and the signal conductor 14 is formed or deposited on the etched portion, either directly on the sapphire layer (the silicon layer having been etched away) or on a thin (e.g. less than 5 µm, less than 3 µm, typically 1-2 µm thick) layer of silicon provided over the sapphire such that the signal conductor 14 is in electromagnetic communication with the sapphire portion of the substrate. In this way, the signal conductor 14 obtains the benefit of the sapphire portion of the substrate (which is less lossy than silicon at higher signal frequencies), even if a thin layer of silicon remains between the signal conductor 14 and the sapphire portion.

A MEMS controller is provided by an Integrated (typically complementary metal oxide semiconductor (CMOS)) Circuit (IC) 49 and is configured to control the states of the MEMS switches 16, 18. In the embodiment shown in FIG. 4 (which otherwise has the same structure as the arrangement of FIG. 1; common features are allocated the same reference numerals), the integrated circuit 49 is provided on a semiconductor (and semiconducting) integrated circuit (IC) substrate (or wafer) 50 stacked on and bonded to the second surface 6 of the MEMS substrate 2. The semiconductor IC substrate 50 has a first surface 52 bonded to the second surface 6 of the MEMS substrate 2 and a second surface 54 opposite the first surface 52 and the integrated circuit 49 is formed on the second surface 54. By stacking the semiconductor IC substrate 50 on the MEMS substrate 2, a compact arrangement is provided which saves cost, space and keeps the lengths of the conductive connections between the integrated circuit and the MEMS switches 16, 18 short. This allows control signals to be routed from the MEMS controller to the respective MEMS switches 16, 18 (in order to implement a target phase shift and/or steering direction and/or gain and/or signal amplitude) by way of conductive through substrate vias 58, 32 which together extend through the semiconductor IC substrate 50 and the MEMS substrate 2 between the MEMS controller and the DC anchors 22 of the respective groups of MEMS switches.

It may be that the MEMS controller receives as an input control signals 59 from circuitry 62 which specify which of the MEMS switches 16, 18 (or groups of MEMS switches) should be in their first (up) states and which of the MEMS switches 16, 18 (or groups of MEMS switches) should be in their second (down) states in order to achieve a target phase shift and/or steering direction and/or gain and/or signal amplitude. It may be that the circuitry 62 is external to the array. The MEMS controller is required to interface with circuitry 62 (e.g. by way of an industry standard interface such as an industry standard RF Front End (RFFE) interface or Serial Peripheral Interface (SPI) etc.) to receive control signals for controlling the MEMS switches 16, 18, boost the system voltage (e.g. 3.3V) to a higher DC voltage (e.g. 30V or 40V) required for actuation of the MEMS switches (which is typically done using one or more charge pumps of the controller or the combination of one or more charge pumps of the controller and one or more energy storage elements (e.g. capacitors) which may or may not be provided in the same integrated circuit as the controller and may or may not be on the same substrate as the controller) and route the boosted, relevant control signals to the correct MEMS switches 16, 18 or groups of MEMS switches to implement the determined configuration (typically comprising setting one or more bits of the 7-bit phase shifter to digital "0" (no DC bias) and one or more bits of the phase shifter to digital "1" (DC bias applied)). In this case, the determination of which switches 16, 18 should be in which states is performed in circuitry 62 responsive to a target phase shift and/or steering direction and/or gain and/or signal amplitude.

In other embodiments, it may be that the circuitry 62 is part of the MEMS controller which in this case is also configured to receive as inputs target phase shifts and/or steering directions and/or gains and/or signal amplitudes to be applied by the MEMS switches 16, 18 of the antenna module 1 (e.g. from circuitry external to the array) and to determine from the inputs configurations of the MEMS switches needed to implement the required phase shift and/or steering direction and/or gain and/or signal amplitude.

In either case, one MEMS controller may be provided per antenna module. Alternatively, one MEMS controller may be provided per sub-array of antenna modules. In one embodiment, one MEMS controller may be provided per four antenna modules (e.g. 2×2 sub-array). In another embodiment, one MEMS controller may be provided for all of the antenna modules of the array. In one embodiment, one MEMS controller may be provided for sixteen antenna modules (e.g. 4×4 array). In embodiments where one MEMS controller is provided for a plurality of antenna modules, it may be that the controller requires one or more additional charge pump(s) and/or one or more larger storage element(s) may need to be provided to enable the controller to boost the system voltage for each of the plurality of antenna modules, but typically one or more of the same charge pump(s) and/or storage elements may be re-used for the MEMS switches of a plurality of the antenna modules.

In another alternative it may be that the MEMS controller provided by integrated circuit 49 is a local MEMS controller and the circuitry 62 comprises a master MEMS controller of the array, the master MEMS controller being configured to control the local MEMS controller. In this case, the master MEMS controller is typically configured to receive as inputs target phase shifts and/or steering directions and/or gains and/or signal amplitudes to be applied by the MEMS switches 16, 18 of the antenna module 1 (e.g. from circuitry external to the array), to determine from the inputs configurations of the MEMS switches needed to implement the required phase shift and/or steering direction and/or gain and/or signal amplitude, and to apply signals to the local controller 49. In this case, the local controller is required to interface with circuitry 62 (e.g. by way of an industry standard interface such as an industry standard RF Front End (RFFE) interface or Serial Peripheral Interface (SPI) etc.) to receive control signals for controlling the MEMS switches 16, 18, boost the system voltage (e.g. 3.3V) to a higher DC voltage (e.g. 30V or 40V) required for actuation of the MEMS switches (which is typically done using one or more charge pumps of the local controller or the combination of one or more charge pumps of the local controller and one or more energy storage elements (e.g. capacitors) which may or may not be provided in the same integrated circuit as the local controller and may or may not be on the same substrate as the local controller) and route the boosted, relevant control signals to the correct MEMS switches 16, 18 or groups of MEMS switches to implement the determined configuration (typically comprising setting one or more bits of the 7-bit phase shifter to digital "0" (no DC bias) and one or more bits of the phase shifter to digital "1" (DC bias applied)).

A plurality of local controllers may be provided, each being configured to control the states of the MEMS switches of a respective one or more of the antenna modules of the array (e.g. each local controller may be configured to control the states of the MEMS switches of any of: a respective one of the antenna modules of the array; a plurality of antenna modules of the array; the antenna modules of a sub-array; all of the antenna modules of the array; four antenna modules of the array; and sixteen antenna modules of the array). In this case, only the master MEMS controller is (and not the local controllers are) required to communicate with circuitry external to the array, and each of the local controllers can be relatively simple. In addition, the master MEMS controller can receive as inputs target phase shifts and/or steering directions and/or gains and/or signal amplitudes to be applied by the MEMS switches 16, 18 of each of a plurality of antenna modules 1 of the array (e.g. all of the antenna modules of the array) and to determine from the inputs configurations of the MEMS switches of the plurality of antenna modules to implement the required phase shifts and/or steering directions and/or gains and/or signal amplitudes, and to apply signals to the local controllers 49 to implement the determined configurations (typically comprising setting one or more bits of the 7-bit phase shifter to digital "0" (no DC bias) and one or more bits of the phase shifter to digital "1" (DC bias applied)). This helps reduce complexity and cost.

In embodiments having a master MEMS controller and local MEMS controllers, instead of (or in addition to) the local MEMS controllers comprising the said charge pump(s) and/or the combination of the said charge pump(s) and energy storage element(s), it may be that the master MEMS controller comprises the said charge pump(s), or charge pump(s) and energy storage element(s). In this case, one or more of the charge pump(s) and, where provided, one or more of the energy storage element(s) can be re-used between a plurality of antenna modules. It will be understood that larger energy storage elements and/or additional charge pumps may required than, for example, embodiments in which the system voltage boosting is performed by local controllers provided for individual antenna modules to enable the master controller to boost the system voltage for each of the antenna modules. Alternatively, it may be that the master controller does not comprise charge pumps.

It may be that the MEMS controller 49 comprises a memory 49*a* and a (e.g. analogue or digital) processor or control logic 49*b*. In this case, it may be that the memory 49*a* includes a look-up table specifying a plurality of MEMS switch configuration data portions each of which is associated with a respective phase shift and/or steering direction and/or gain and/or signal amplitude. The MEMS switch configuration data portions provide control data for selectively causing the respective MEMS switches 16, 18 (or groups thereof) to be in their first or second states in order to implement the phase shift and/or steering direction and/or gain and/or signal amplitude with which the respective configuration data portion is associated. Accordingly, the processor or control logic 49*b* (which is in communication with the memory 49*a*) receives the target phase/steering direction/gain and/or signal amplitude inputs and selects one or more configuration data portion(s) associated with the inputs (e.g. a first configuration data portion to implement the phase shift a second configuration data portion to implement the signal gain, or a single configuration data portion to implement the phase shift and the signal gain). The processor (or control logic) 49*b* then outputs signals to the MEMS switches 16, 18 derived from or specified by the configuration data portion(s) by way of the vias 58, 32 in order to implement the target phase shift.

In another example, the memory 49*a* includes computer program instructions for implementing one or more algorithms for determining a MEMS switch configuration for achieving a target phase shift and/or a target steering direction and/or a target gain and/or signal amplitude based on inputs 59 specifying the target phase shift and/or steering direction and/or target gain and/or signal amplitude and for generating control signal data portions for routing to the MEMS switches 16, 18 to implement the MEMS switch configuration. In this case, the processor or control logic 49*b* is configured to receive the target phase shift and/or steering direction and/or target gain and/or signal amplitude inputs 59, retrieve the computer program instructions from the memory 49*a*, and run the computer program instructions together with the inputs 59 to determine and implement (by outputting to the respective DC anchors 22) the switch configuration. The algorithm may for example comprise the steps of receiving a target phase shift and/or steering direction and/or target gain and/or signal amplitude, retrieving data (e.g. from the memory) indicative of the phase shifts and/or signal gains provided by each of the MEMS switches 16, 18 (or by the respective groups of MEMS switches), and determining configurations of the MEMS switches to achieve the target phase shift and/or steering direction and/or target gain and/or signal amplitude taking into account the retrieved data. The algorithms typically further comprise generating control data for implementing the configuration; and outputting signals to the respective MEMS switches 16, 18 (or groups of MEMS switches) in accordance with the control data to implement the target phase shift and/or steering direction and/or target gain and/or signal amplitude.

The memory 49*a* may additionally or alternatively include computer program instructions for implementing one or more algorithms for determining a MEMS switch configuration for improving signal quality or for tracking and/or locking on to a particular electromagnetic signal, e.g. from a cellular mobile wireless telecommunications base station or a small, micro or femto cell infrastructure, or wireless backhaul, transmitter, receiver or transceiver or a portable mobile wireless telecommunications device, based on feedback (e.g. link quality, quality of service, received signal strength) provided to the controller. For example the controller may be configured to perform a fine tuning scan (i.e. by fine tuning the direction of the beam, e.g. by changing one or more phase shifts of signals received and/or to be transmitted by the antennas and/or by adjusting the signal gains applied to signals received and/or to be transmitted by the antennas, e.g. by signal attenuators or signal boosting amplifiers)) to improve the connection if the connection has fallen below a first quality threshold (or to perform a wider tuning scan to improve the connection if the connection has fallen below a second quality threshold). In another example, the controller may be configured to increase one or more signal gains (e.g. by one or more power amplifiers or one or more low noise amplifiers) or reduce signal attenuation by one or more attenuators. This helps to increase the scanning range which can be beam formed (or steered) by adjusting the phases of the signals received and/or to be transmitted by the antennas of the array, which can reduce the magnitudes of one or more grating lobes and boost the gain of the signal (e.g. the main beam) received and/or to be transmitted by the antennas. Increasing signal gain can therefore maintain the wireless connection at a desired quality level (which may be variable depending on circumstances, such as the type of service being provided, the provider, atmospheric conditions and so on).

It may be that the memory 49a also comprises actuation and hold DC voltage values for the MEMS switches, the actuation voltage being the DC voltage which needs to be applied to the switch to cause the bridge to move from a first state to a second state and the hold voltage being the DC voltage required to hold the bridge in the second state. The hold voltage is typically less than the actuation voltage. It may be that the processor or control logic 49b is configured to reduce the DC voltage applied to one or more MEMS switches from the actuation voltage to the hold voltage after the switch(es) has (have) been actuated from the first state to the second state. This reduces charging effects and increases the reliability of the MEMS bridges of the switches by reducing or eliminating the possibility for stiction due to charging.

In alternative embodiments, the master MEMS controller comprises the memory storing the look-up table and/or algorithms. In this case, the master MEMS controller is configured to determine the configurations of the MEMS switches of the antenna modules using the look-up table and/or algorithms.

The MEMS switches 16, 18 are enclosed in a volume between the first surface 4 of the MEMS substrate 2 and a first surface 33 of a capping portion of a capping substrate (or wafer) 34 (which is a monolithic semiconductor substrate in this example, but may alternatively be a laminate or ceramic substrate—e.g. a low temperature co-fired ceramic (LTCC) substrate or high temperature co-fired ceramic (HTCC) substrate—organic or multi-layer organic substrate (such as a multi-layer organic substrate from Rogers Corporation), a glass substrate, a ceramic substrate, a glass ceramic substrate or an insulating substrate such as an alumina substrate) which is stacked on and bonded to the MEMS substrate 2. The MEMS switches 16, 18 are thus provided between the capping portion of the capping substrate 34 and the MEMS substrate 2. The MEMS substrate 2 is sandwiched between the semiconductor IC substrate 50 and the capping portion of the capping substrate 34. The first surface 33 of the capping substrate 34 is provided with a cavity 36 which ensures that the bridges of the MEMS switches 16, 18 can (selectively) move between their first and second states unimpeded. It may be that the cavity comprises conductive tracks configured to route signals (e.g. to and/or from one or more integrated circuits, to and/or from the antenna (see below), to and/or from the signal conductor, or to and/or from the MEMS switches). The capping substrate 34 comprises end portions 34a, 34b at opposite ends of the cavity (and which align with ends 10, 12 of the MEMS substrate 2) which enclose the cavity 36. A hermetic seal is provided between the MEMS and capping substrates 2, 34. The enclosed volume between the MEMS substrate 2 and the capping substrate 34 is either evacuated to close to a vacuum or (in some cases preferably) it is filled with nitrogen (or an inert gas) at atmospheric pressure. By filling the volume with nitrogen at atmospheric pressure, the probability of a leak occurring in the seal is reduced because there is a lower pressure differential across it. The capping substrate 34 protects the MEMS switches 16, 18. Alternatively, it may be that the enclosed volume between the capping portion and the MEMS substrate is at a pressure intermediate vacuum and atmospheric pressure (e.g. between 10% and 90% of atmospheric pressure, e.g. between 25% and 75% of atmospheric pressure, e.g. substantially 50% of atmospheric pressure) in order to reduce seal leakage (as compared to vacuum pressure) and to increase switching speed (as compared to atmospheric pressure) of the MEMS switches 16, 18.

The capping portion of the capping substrate 34 has a second surface 38 opposite the first surface 33. The second surface 38 of the capping portion of the capping substrate 34 carries an antenna 40 (which is formed thereon and) which is conductively connected to the signal conductor 14 by way of a conductive through substrate via 42 which extends (fully) through the capping portion of the capping substrate and a conductive pillar 43 (aligned with via 42) provided on a first (front—i.e. adjacent to the antenna) end of the signal conductor 14. Via 42 and pillar 43 carry radio frequency signals between the antenna 40 and the signal conductor 14. A further conductive through substrate via 44 is conductively connected to a second (back—i.e. further from the antenna than the said front end) end of the signal conductor 14 in order to carry RF signals to or from the signal conductor 14, the via 44 extending (fully) through the MEMS substrate to a further through substrate via 45 extending through the semiconductor substrate 50 and being conductively connected to the via 44 for receiving or outputting RF signals. The first surface 33 of the capping substrate 34 comprises a ground plane for the (typically patch-type) antenna 40, although typically an insulating portion is provided around the vias extending through the capping substrate to avoid them shorting to the ground plane.

By providing the antenna 40 on the capping substrate 34, the antenna, signal conductor and MEMS switches 16, 18 are provided close together in a compact arrangement, thereby keeping the lengths of signal propagation paths short, thus keeping parasitic and signal losses low. There is also no need for a separate cap for the MEMS switches 16, 18; this reduces material costs and helps to reduce the quantity of processing required during manufacture, thereby helping to reduce the overall cost of the antenna module 1.

It will be understood that, instead of the MEMS switches and the MEMS controller being provided on different substrates stacked on top of each other, they may alternatively be manufactured on (e.g. different layers of) the same substrate.

As indicated above, the antenna module 1 is typically provided as part of a (typically MIMO) phased antenna array, such as the phased antenna array 100, a portion of which is shown in FIG. 5. Although the array 100 shown in FIG. 5 is typically a 4×4 array comprising sixteen antennas, only a 2×2 portion of the array is shown, each antenna being provided as part of an antenna module 1 as shown in FIG. 4. The phased antenna array 100 may in turn be provided in a wireless electromagnetic signal communications device, such as a cellular mobile wireless telecommunications base station or a small, micro or femto cell infrastructure, or wireless backhaul, transmitter, receiver or transceiver or a portable mobile wireless telecommunications device. The relative phases of electromagnetic signals received or to be transmitted by respective antennas of the array are individually and selectively controlled by the phase shifters of the antenna modules 100 to effectively "steer" the antennas in one or more desired directions. Similarly, the amplitudes of electromagnetic signals received and/or to be transmitted by the antennas of the array are individually and selectively controlled by the MEMS attenuator switches and/or the MEMS switches of the power/low noise amplifiers of the antenna modules (where provided). By providing selective individual control of the phase and amplitude of signals received and/or to be transmitted by each antenna of the array, accurate and fine control over the directionality of combinations of the antennas by beamforming is provided. As the power control (either attenuation or amplification) is provided by MEMS switches, low noise, broadband performance is achieved.

As shown in FIG. 5 (where the ground conductors 15 are omitted for clarity), the semiconductor IC substrate 50 is a common carrier substrate comprising the integrated circuits 49 (which in this embodiment comprises individual integrated circuits 49 for each antenna module) and supporting (carrying) the MEMS substrates 2 and the capping substrates 34 of each of the antenna modules 1 of the array, the MEMS and capping substrates 2, 34 of each module 1 being discrete from the other antenna modules. In embodiments comprising a master MEMS controller controlling local MEMS controllers (as discussed above), the master MEMS controller is typically formed on the common carrier substrate 50 and is provided in electrical communication with the local MEMS controllers by way of signal tracks supported by (and typically formed on) the common carrier substrate 50. The discrete MEMS substrates 2 are stacked on the carrier substrate 50 and the discrete capping substrates 34 are stacked on the MEMS substrates 2 of the respective modules.

In order to make the MEMS substrate 2, MEMS switches 16, 18 and signal conductor 14 as small and as close together as possible, the MEMS substrate 2 may comprise or consist of material with a (relatively high) dielectric constant (Er) greater than 3, more preferably greater than 5, such as Gallium Nitride (Er=9.7), more preferably greater than 10, such as Silicon (Er=11.7), Sapphire (Er=9.5-12), Gallium Arsenide (Er=12.9) or Zircon (Er=10-12), and in some cases greater than 20, such as Tantalum Oxide (Er=27), Zirconium Oxide (Er=24.7), Hafnium Oxide (Er=40), PZT (Er=300 to 3850), barium titanate (Er=130 to 1000), lead titanate (Er=200 to 400), Tungsten oxide (Er=42), Lanthanum Oxide (Er=20.8) or borosilicate glass (such as Schott MEMpax® (Er=4.8), Schott Borofloat® or Schott D263® (Er=6.7)). By using material with a high dielectric constant, the electrical (and thus the physical) length of conductive structures formed thereon can be kept low, while structures can also be provided closer together, thereby helping to keep parasitic and signal losses low. It may be that the MEMS switches 16, 18 are formed directly on the said material with the high dielectric constant; alternatively, it may be that the MEMS switches 16, 18 are formed on a relatively thin layer of another (typically crystalline) material provided on the said high dielectric material (e.g. silicon on sapphire). The capping substrate 34 may also comprise or consist of material having a high dielectric constant, even though it may reduce the antenna efficiency. This can be beneficial because a substrate with a higher dielectric constant allows more complex structures to be formed thereon. In some embodiments, the MEMS substrate comprises a semiconductor substrate, a glass substrate, a ceramic substrate or a glass ceramic substrate.

The antennas 40 of the array 100 are connected together to form a plurality of independent sub-arrays of antenna modules 1 configured to wirelessly communicate with different external electromagnetic signal sources/receivers independently from each other (e.g. along different paths), or with (e.g. respective different sub-arrays of) the same external signal sources/receivers along different paths. As shown in FIG. 5 an electromagnetic signal divider and/or combiner 70 is formed on and supported by the first surface 52 of the carrier substrate 50, the electromagnetic signal divider and/or combiner 70 being configured to divide an (typically RF) electromagnetic signal from an RF port 74 between a plurality of antenna modules 1 of the array 100 and/or to combine electromagnetic signals received from a plurality of antenna modules of the array to the RF port 74. The said plurality of antenna modules of the array are typically the antenna modules of a respective sub-array, with respective electromagnetic signal dividers and/or combiners and RF ports 74 being provided for each sub-array. In each case, the electromagnetic signal divider and/or combiner 70 comprises a plurality of conductive branches 72 each of which connects to the signal conductor 14 of a respective antenna module 1 by way of respective through vias 44, 45. The conductive branches 72 link to the RF port 74 which carries electromagnetic signals to and from the carrier substrate 50 by way of a surface mount connection (e.g. land grid array). The electromagnetic signal divider and/or combiner 70 is provided on the first surface 52 of the semiconductor IC substrate (i.e. on the same surface that the MEMS substrates of the antenna modules 1 are stacked), thereby avoiding the need to route electromagnetic signals through the carrier substrate which could lead to undesirable signal losses. A ground plane for the electromagnetic signal divider and/or combiner 70 is typically provided on the second surface 54 of the carrier substrate 52.

The semiconductor IC substrate 50 typically further comprises (typically analogue, typically RF) integrated (typically semiconductor) signal processing circuitry (e.g. comprised in or adjacent to the integrated circuits 49, or in other integrated circuitry formed elsewhere on the semiconductor IC substrate 50—e.g. laterally offset from the antennas 40 and/or the MEMS switches 16, 18) configured to process signals received and/or to be transmitted by the antennas 40. Typically the signal processing circuitry comprises transmitter, receiver or transceiver circuitry. For example, the signal processing circuitry may comprise any one or more of: one or more semiconductor (e.g. CMOS) phase shifters (e.g. as an alternative to implementing the phase shifters in MEMS as described above) configured to individually and selectively adjust the phase of electromagnetic signals received and/or to be transmitted by each of the antennas of the array; one or more semiconductor (e.g. CMOS) attenuators (e.g. as an alternative to implementing the attenuators in MEMS as described above) configured to individually adjust the amplitudes of electromagnetic signals received and/or to be transmitted by each of the antennas of the array; one or more semiconductor power amplifiers configured to (e.g. individually) adjust the power amplification of electromagnetic signals to be transmitted by the antennas of the array; one or more semiconductor low noise amplifiers configured to (e.g. individually) adjust the power amplification of electromagnetic signals received by the antennas of the array; mixed signal circuitry such as an analogue to digital converter (ADC) configured to convert analogue signals received by the antennas to digital signals or a digital to analogue converter (DAC) configured to convert digital signals into analogue signals to be transmitted by the antennas; a digital interface configured to interface with (e.g. receive commands from) external digital circuitry (e.g. such as an overall system processor or controller); and one or more RF filters configured to filter signals received and/or to be transmitted by each of the antennas 40. The signal processing circuitry is electrically connected to the back end of the signal conductor 14 by vias 44, 45.

Figure 5A:
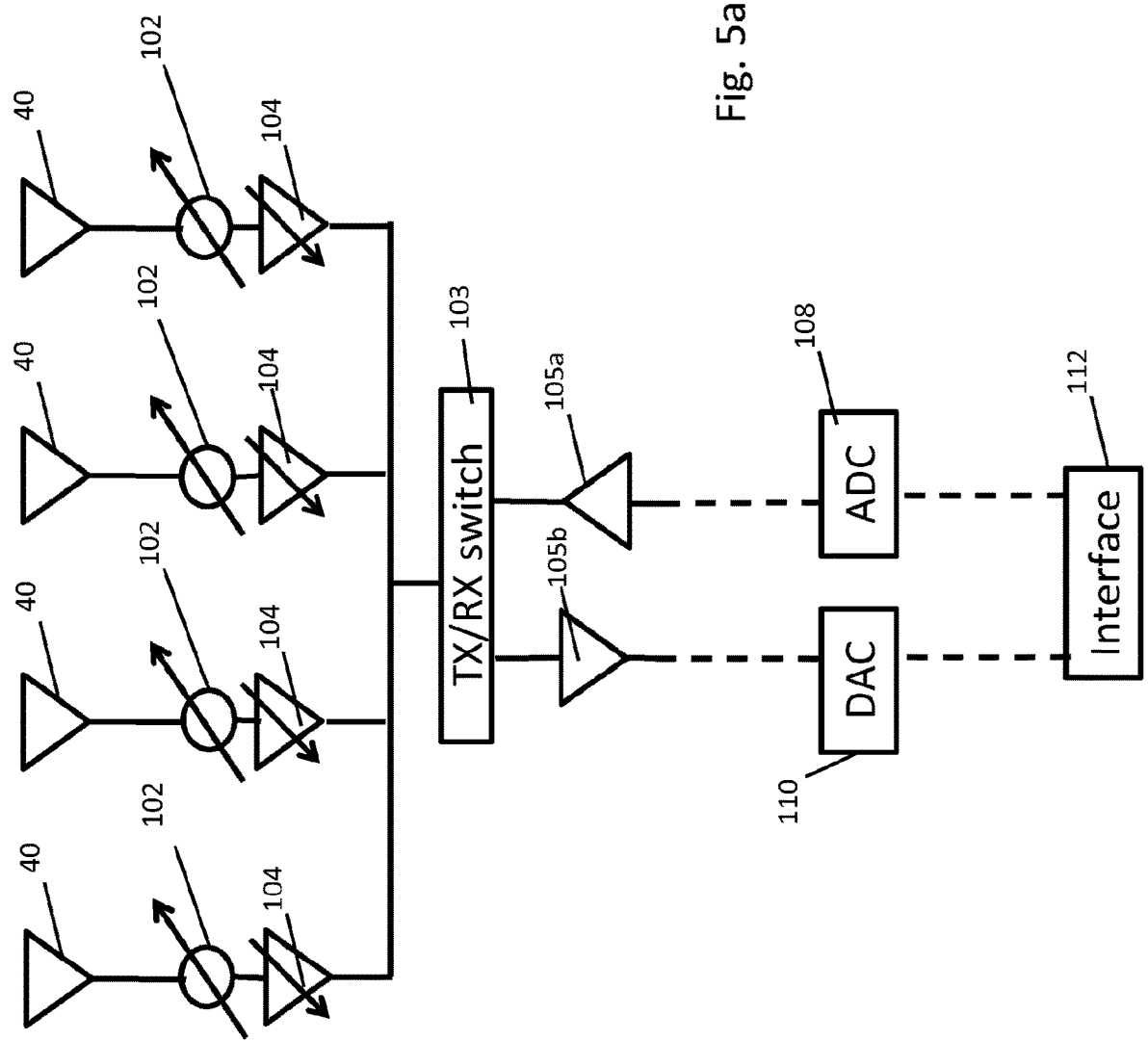
FIG. 5a is a schematic circuit diagram of a sub-array of the phased antenna array, wherein a single power amplifier and a single low noise amplifier are provided to amplify signals received and/or to be transmitted by antennas of a sub-array of the array.

FIG. 5a is a schematic circuit diagram of an example sub-array configured in an hybrid beam forming architecture in which a single semiconductor power amplifier 105a and a single semiconductor low noise amplifier 105b are provided for the sub-array. Individual and selective control of the amplitudes of RF signals received and/or to be transmitted by the antennas 40 is achieved by the respective variable gain MEMS attenuators 104 (implemented by MEMS switches 16, 18 of each respective antenna module as discussed above). The MEMS phase shifters 102 (comprising reconfigurable MEMS capacitive switches as described above) provide individual and selective control of the phases of electromagnetic signals received and/or to be transmitted by each of the antennas 40. In addition, a digital to analogue converter (DAC) is provided between the low noise amplifier 105b and digital interface circuitry 112 configured to interface with external digital circuitry (e.g. digital circuitry not supported by the common substrate, such as baseband circuitry). An analogue to digital converter 108 is provided between the said digital interface circuitry 112 and the power amplifier 105a. A transmission/reception selection switch 103 is provided between the phase shifters 102/attenuators 104 and the amplifiers 105a, 105b, the switch 103 selecting one of a transmission mode and a reception mode. In the transmission mode, the combination of the ADC and power amplifier is selected so as to convert digital signals from the digital interface 112 into an amplified analogue signal for transmission by the antennas. In the reception mode, the combination of the DAC and the low noise amplifier is selected to amplify analogue signals received by the antennas and to convert them to digital signals for further processing. A similar arrangement may be provided for each sub-array of the array. Alternatively, a single power amplifier and low noise amplifier 105a, 105b (and/or ADC and/or DAC and/or interface) may be provided to serve all of the antennas of the array 100 in an analogue beam forming architecture. The signal processing circuitry may further comprise other RF components (e.g. RF front end components) not shown in FIG. 5a such as RF filters (which are typically common to the antennas 40 of each sub-array, but may alternatively be common to all of the antennas 40 of the array or individual to specific antennas of the array).

Figure 7:
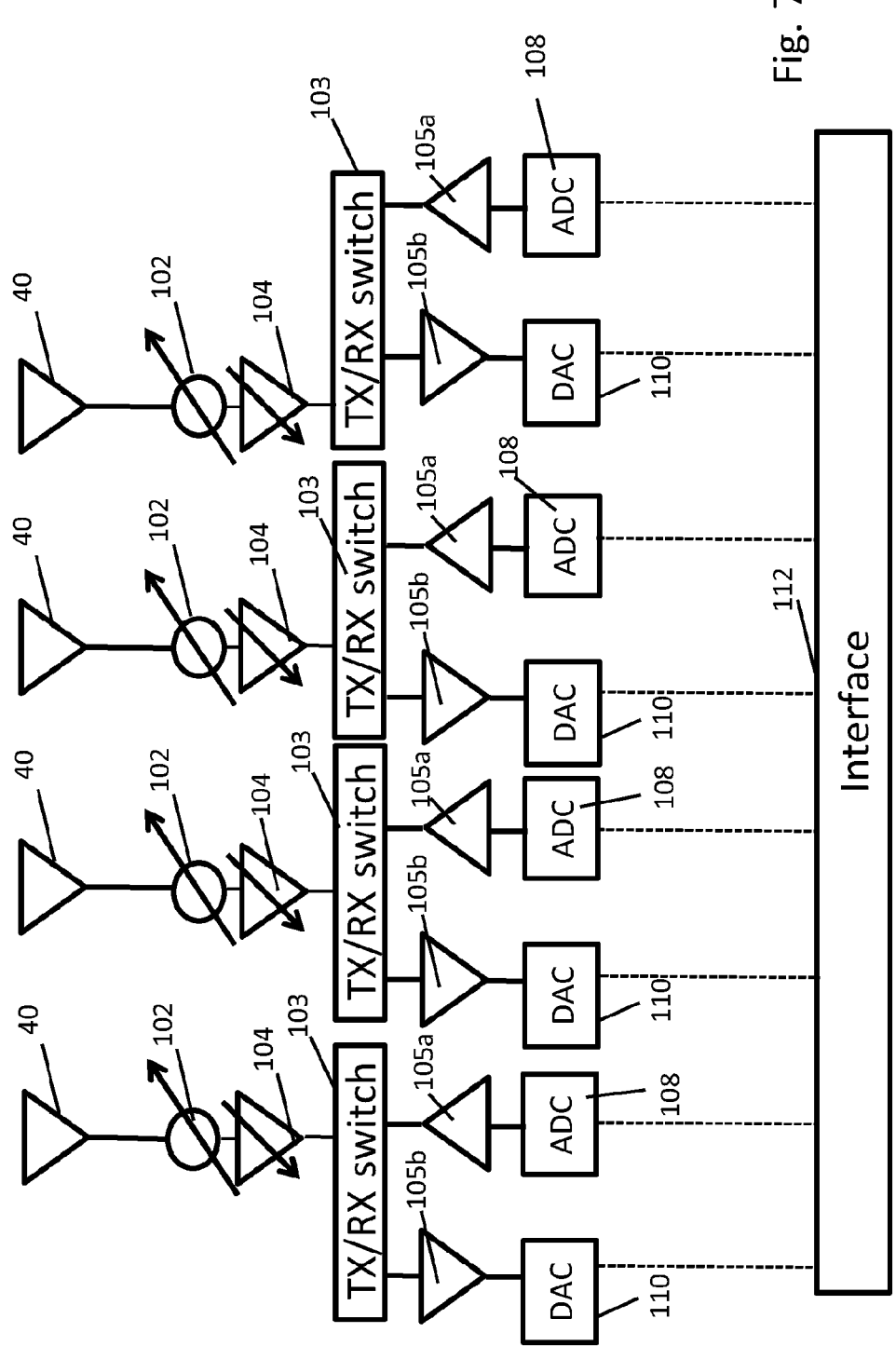
FIG. 7 is a schematic circuit diagram of a sub-array of the phased antenna array, wherein each of the antennas of the sub-array have individually controllable reconfigurable phase shifters, individually controllable variable gain attenuators, individually controllable power amplifiers and individually controllable low noise amplifiers.

FIG. 7 is a schematic circuit diagram of an example sub-array configured in an alternative digital beam forming architecture in which one variable gain power amplifier 105a is provided per antenna module 1 of the (e.g. 4×4) sub-array and one variable gain low noise amplifier 105b is provided per antenna module 1 of the sub-array. In this case, the individual power and low noise amplifiers are typically MEMS based amplifiers as discussed above; alternatively, they may be semiconductor amplifiers formed on the semiconductor IC substrate 50. By providing individual power amplifiers 105a/low noise amplifiers 105b, more specific control is provided over the power of electromagnetic signals received and/or to be transmitted by the individual antennas 40 (as compared to having a single power amplifier/low noise amplifier for the sub-array or for the entire array), although it will be appreciated that having a variable gain attenuator 104 for each antenna module 1 also provides some specific control (independently from the power amplifier/low noise amplifier) over the amplitudes of signals received and/or to be transmitted by the individual antennas 40. Individual control of the signal amplitudes transmitted and/or received by the antennas 40 of the array provides finer and more accurate control over the directionality of combinations of antennas by beamforming. By implementing this control by way of MEMS amplifiers, lower noise and broader band performance can be achieved. Although FIG. 7 shows both individual attenuators and individual power amplifiers/low noise amplifiers per antenna module, the individual attenuators may in this case be omitted, given that individual (and selective) power control is provided by the individual power amplifiers/low noise amplifiers. As shown in FIG. 7, separate transmission/reception switches 103 are provided per antenna module 1 of the sub-array to select whether the combination of the ADC 108 and power amplifier 105a is selected (transmission mode) or whether the combination of the DAC 110 and the low noise amplifier 105b are selected. The said multiple transmission/reception switches may be replaced by a single transmission/reception switch configured to control which said combination is selected for each antenna module of the sub-array.

Individual analogue to digital converters and digital to analogue converters 108, 110 may be provided per antenna module (FIG. 7), or per sub-array (FIG. 5a), or single analogue to digital converters and digital to analogue converters 108, 110 may serve the entire array (analogue architecture). Similarly, RF filters may be provided for each antenna module (digital architecture), or per sub-array (hybrid architecture), or one may be provided for the entire (e.g. 4×4 or 16×16) array (analogue architecture).

To transmit signals, digital signals are provided to the digital interface circuitry 112 from which they are passed to the digital to analogue converter 110 (the transmission/receive switch(es) 103 being configured in transmit mode). After the signals are modulated (which may be done digitally or in analogue) the modulated signal is passed to the power amplifier(s) 105a which amplifies the modulated signal and passes it to the respective signal conductors 14 on the MEMS substrates 2, typically by way of through substrate vias 44, 45. In embodiments comprising a single power amplifier 105a per sub-array (FIG. 5a), the electromagnetic signal is divided between the antenna modules 1 of the sub-array after it has been amplified by the power amplifier 105a; in embodiments in which individual power amplifiers 105a are provided for each antenna module 1 (FIG. 7), the electromagnetic signal is divided between the antenna modules 1 prior to amplification by the respective power amplifiers 105a. Next the amplified signals propagate down the respective signal conductors 14 where they are phase shifted and/or attenuated and/or amplified and passed towards through substrate vias 42 which feed the signals to the antennas 40 for transmission. To receive signals, RF signals are detected by the antennas 40 which transfer the RF signal to the signal conductors 14 on the MEMS substrates 2 by way of through substrate vias 42 and pillars 43 (with the transmission/reception switch(es) 103 in receive mode). The RF signals propagate along the signal conductors 14 where they are phase shifted and/or attenuated and/or amplified by the MEMS switches 16, 18 and passed to the low noise amplifier(s) 105b. In embodiments comprising a single low noise amplifier 105b per sub-array, the electromagnetic signals received by the antennas 40 of the sub-array are combined prior to amplification by the low noise amplifier 105*b*; in embodiments in which individual low noise amplifiers 105*b* are provided for each antenna module 1, the electromagnetic signals received by each of the antennas of the sub-array are amplified by the respective low noise amplifiers prior to being combined. The combined amplified signal is then demodulated and converted to a digital signal in an analogue to digital converter 108 and passed to the digital interface circuitry 112 for further processing.

FIG. 5*b* shows a similar phased antenna array to FIG. 5, but in this case the MEMS switches 16, 18 and signal and ground conductors 14, 15 of each antenna module of the array are supported by and formed on a shared common MEMS substrate 2'. Similarly, the capping portions of each of the antenna modules of the array are provided by a shared common capping substrate 34'. Ground conductors 15 and MEMS switches 16, 18 (although present) are not shown in FIG. 5*b* for clarity. The common MEMS substrate 2' is stacked on the carrier semiconductor IC substrate 50', while the common capping substrate 34' is stacked on the common MEMS substrate 2'. The electromagnetic signal divider and/or combiner 70 is in this case provided on the first surface 4' of the MEMS substrate 2', the electromagnetic signal divider and/or combiner being connected to an RF input and/or output pad by way of conductive through substrate vias 99*a*, 99*b* which together extend through the MEMS substrate 2' and the semiconductor IC substrate 50'. A ground plane for the electromagnetic signal divider and/or combiner is provided on the second surface 6' of the common MEMS substrate 2' (opposite the first surface 4' on which the MEMS switches are provided). Typically the electromagnetic signal divider and/or combiner 70 is electrically isolated from the antenna ground plane provided on the second surface 33' of the capping substrate 34'. This may be done by providing an insulating layer between the antenna ground plane and the electromagnetic signal divider and/or combiner.

The electromagnetic signal divider and/or combiner 70 may alternatively be provided on the second surface 6' of the MEMS substrate 2', in which case it may be conductively connected to the signal conductors 14 by way of through substrate vias extending through the MEMS substrate 2'. In this case, it may be that the antennas 40 and the electromagnetic signal divider and/or combiner 70 share a common ground plane provided on the first surface 33' of the capping substrate 34'. As another alternative, the electromagnetic signal divider and/or combiner 70 may be provided on the second surface 38' of the capping substrate 34' (i.e. on the same surface as the antennas 40). In this case, the electromagnetic signal divider and/or combiner 70 is typically conductively connected to the signal conductors 14 by way of through substrate vias extending through the capping substrate and again the antennas and divider/combiner share a common ground plane (e.g. provided on the first surface 33' of the capping substrate 34').

As another alternative to the embodiment of FIG. 5*b*, the MEMS substrate 2' is flipped so that the semiconductor IC substrate 50' provides the caps over the MEMS switches 16, 18 and the second surface 6' of the MEMS substrate 2' engages the ground plane on the bottom surface of the antenna substrate 34' (which would typically not comprise cavities in this case). In this case, within each of the antenna modules, the via 42 extends fully through the antenna substrate 34' and an insulating gap is provided in the ground plane so that the antenna 40 is not shorted to the ground plane. A further through via extends through the MEMS substrate to the signal conductor 14, the said further through via being conductively connected to the via 42 to thereby connect the antenna 40 to the signal conductor 14. The semiconductor IC substrate 50' in this case comprises cavities to form enclosed volumes around the MEMS switches. The electromagnetic signal divider and/or combiner 70 may still be provided on the first surface 4' of the MEMS substrate 2'. The antennas 40 and divider/combiner may share a common ground plane provided on the second surface 6' of the MEMS substrate 2' or on the first surface 33' of the antenna substrate 34'. In this arrangement, discrete semiconductor IC substrates 50 (comprising respective MEMS controllers) may instead be provided for each antenna module (instead of a common IC substrate) or discrete semiconductor IC substrates 50 may be provided for each sub-array (each comprising a MEMS controller configured to control the MEMS switches of the antenna modules of the sub-array). Alternatively, the discrete (i.e. discrete to the sub-arrays or to the individual antenna modules) semiconductor IC substrates 50 may be mounted or formed on the common MEMS substrate 2 (typically spaced laterally from the MEMS switches and connected thereto by patterned signal tracks). In this case, either a common interposer cap or discrete interposer caps may be provided to form respective enclosed volumes around the MEMS switches.

Figure 6:
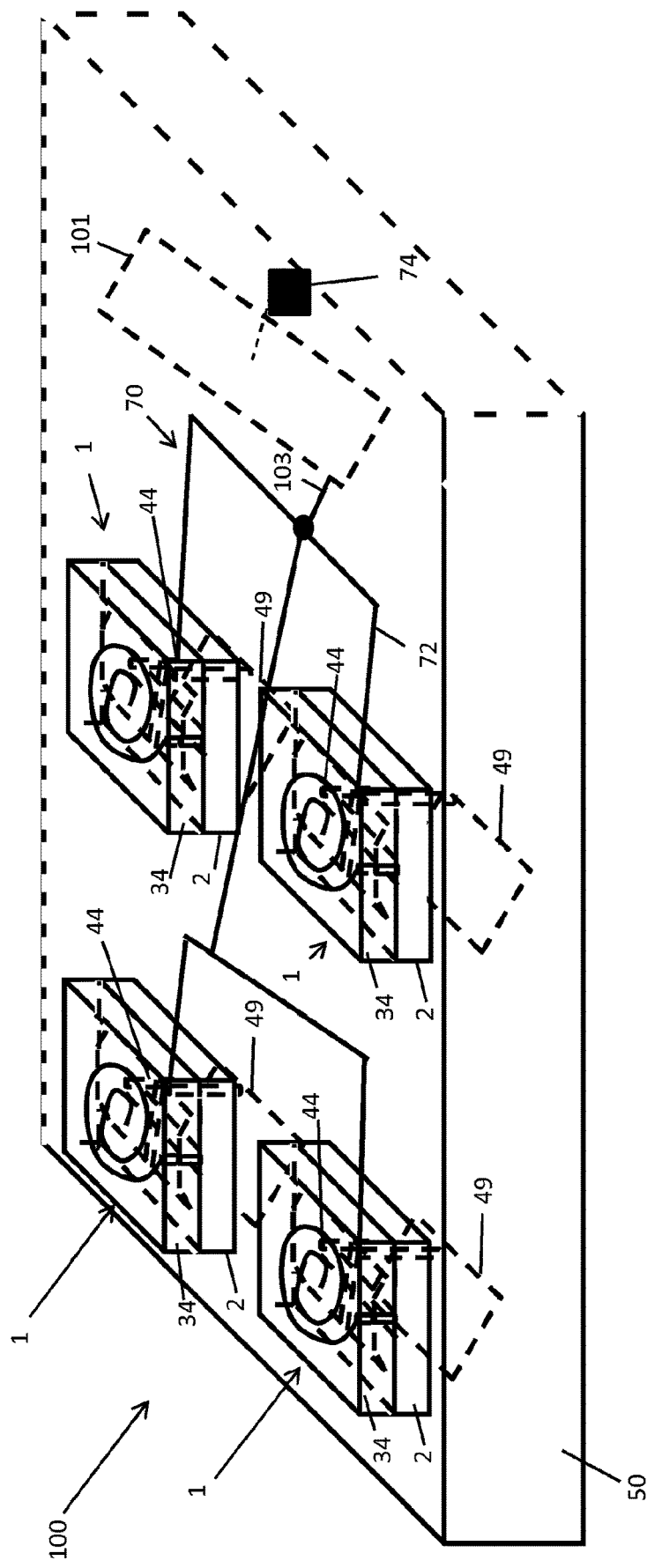
FIG. 6 shows the array of FIG. 5 together with integrated circuitry offset from the antenna modules.

As shown in FIG. 6, signal processing circuitry which is common to the antenna modules of a sub-array (e.g. power amplifier(s), low noise amplifier(s), analogue to digital converter, digital to analogue converter, interface, filters) may be provided in integrated circuitry 101 formed on the common carrier semiconductor substrate 50 between connection 74 and the electromagnetic signal divider and/or combiner 70. In the example of FIG. 6 the integrated circuitry 101 is laterally offset from the antenna modules 1 of the array 100. Respective said integrated circuitry 101 is typically provided for each sub-array of the array 100. As indicated above, in other embodiments, the same integrated circuitry 101 may serve all of the sub-arrays of the array. The integrated circuitry 101 may comprise a master MEMS controller configured to control a plurality of local MEMS controllers specific to the respective antenna modules as discussed above.

FIG. 8 shows an alternative array 118 to that shown in FIGS. 5, 6 in which the capping substrate 34' is the carrier substrate rather than the semiconductor IC substrate 50. In this case, the capping substrate 34' has respective capping portions which form the hermetically sealed enclosed volumes together with the MEMS substrates 2 which enclose the MEMS switches 16, 18 in the antenna modules 1. In the example illustrated in FIG. 8, the antennas 40 are provided on the second surfaces 38' of the capping portions of the capping substrate 34'. However, the antennas 40 could alternatively be (laterally) offset from the capping portions on the capping substrate 34'. For example, it may be that the antennas are patch type antennas, which require ground conductors to be provided directly underneath them; in this case, the capping portion and the MEMS switches 16, 18 (and typically cavity 36) may be (laterally) offset from the antennas 40. This enables the ground conductors to be provided directly underneath the antennas 40 (on the second surface 38 of the capping substrate 34) and also provides an increased distance between the via 42/conductive pillar 43 and the MEMS switches 16, 18 (which are typically provided in the cavity 36), thereby reducing interference between the antennas 40 and the MEMS switches. Further conductive connections are required to connect the vias 42 (which still provide part of the conductive path between the signal conductor 14 and the antenna 40) to the antenna 40, such as deposited and/or patterned signal tracks. Typically a common ground plane is provided for the antennas 40 and the electromagnetic signal divider and/or combiner 70 between the second surface 38' and the first surface 33' of the capping substrate 34'. Typically the common ground plane is parallel to planes of the (planar) first and second surfaces 33' 38' of the substrate 34', and provided between the said first and second surfaces 33' 38' (in which case the antenna substrate 34' comprises a plurality of layers). Insulating portions are typically provided in the common ground plane in the region of through vias so as to avoid short circuiting the vias to the ground plane.

Integrated circuits 49 providing the MEMS controllers are not shown in FIG. 8 for clarity, but typically they are formed on the respective individual discrete semiconductor IC substrates 50 provided for each of the antenna modules 1. It may be that some of the semiconductor signal processing circuitry common to a plurality of antenna modules is provided on the capping substrate 34' (which may be formed from a semiconducting material in this case) offset from the antenna modules 1.

Instead of the MEMS switches and the integrated circuits 49 being provided on different substrates stacked on top of each other in the embodiment of FIG. 8, they may alternatively be manufactured on (e.g. different layers of) the same (typically semiconductor) substrate.

FIG. 9 shows a variation of the arrangement 118 of FIG. 8. In this case, instead of capping portions of the capping substrate 34' forming the enclosed volume (together with the MEMS substrates 2) in which the MEMS switches are provided, the antenna modules 1 are provided with respective discrete interposer caps 120 which perform this function. The respective discrete interposer caps 120 comprise cavities which are vertically aligned with the MEMS switches of the MEMS substrates 2 (the semiconductor IC substrates 50 and antenna substrate 34' do not have cavities in this embodiment) to allow the MEMS switches to (selectively) move between their first and second states unimpeded and are stacked between the first surfaces 4 of the discrete MEMS substrates 2 and the common capping substrate 34' comprising the antennas 40. The interposer caps 120 help to match different coefficients of thermal expansion between the MEMS substrates 2 and the substrate 34' comprising the antennas 40 (e.g. by being formed of material having a coefficient of thermal expansion intermediate those of the MEMS substrate 2 and the substrate 34'). The interposer caps 120 also provide conductive interface circuitry (i.e. the interposer caps 120 provide signal routing layers) for conductively connecting the signal conductors 14 of the respective MEMS substrates 2 to the antennas 40. In this case, the interface circuitry comprises respective through vias 121 extending through the interposer caps 120 between the MEMS substrates 2 and the vias 42 which extend through substrate 34 to connect to respective antennas 40. The interposer caps 120 may further comprises one or more integrated components or (e.g. passive) devices, such as one or more lumped elements (e.g. one or more capacitors, one or more inductors or one or more resistors) provided as part of the conductive interface.

Particularly in the embodiments of FIGS. 8 and 9, preferably the substrate 34' has a high dielectric constant (e.g. greater than 3, more preferably greater than 5, greater than 10, greater than 20 or greater than 50) to allow antennas 40 to be provided closer together on the substrate 34', particularly those in different sub-arrays (although antennas common to the same sub-array would not couple with each other through a substrate having a high dielectric constant, if positioned close to each other they could still couple through the air). Again integrated circuits 49, 101 are not shown in FIG. 9 for clarity.

As an alternative to the embodiments of FIGS. 8 and 9, it may be that the antennas 40 are instead provided (e.g. formed) on the first surface 33' of the capping substrate 34' (together with the electromagnetic signal divider and/or combiner 70 and the MEMS substrates 2). In this case, the antennas 40 and the electromagnetic signal divider and/or combiner 70 may be provided with a common ground plane on the second surface 38' of the common substrate 34'. This effectively makes the MEMS phase shifters an integral part of the electromagnetic signal divider and/or combiner 70, allowing the MEMS phase shifters and antennas to be provided closer to each other with shorter conductive connections between them. Indeed, the requirement for through substrate vias is significantly reduced (although typically a short via and/or small conductive pillar is typically required to connect the signal conductors 14 of the MEMS phase shifters to the antennas and electromagnetic signal divider and/or combiner). This helps to keep parasitic and signal losses low, particularly at high signal frequencies.

FIG. 10 is a schematic view of an alternative antenna module 150 comprising a MEMS substrate 2, which is identical to the MEMS substrate 2 of the antenna module 1 described above (the same reference numerals will be used for common features) capped by a semiconductor IC substrate 152 similar to the semiconductor IC substrate 50 described above. The MEMS switches 16, 18 are provided between the semiconductor IC substrate 152 and the MEMS substrate 2. The semiconductor IC substrate 152 comprises a first surface 152a which engages the MEMS substrate 2 and a second surface 152b opposite the first surface which comprises the antenna 40. The semiconductor IC substrate 152 and the MEMS substrate 2 together form an enclosed volume around the MEMS switches 16, 18 and the signal conductor 14 and a hermetic seal is provided between them. The enclosed volume is either at vacuum or at atmospheric pressure (in which case it is filled with nitrogen or an inert gas) or at a pressure intermediate vacuum and atmospheric pressure. The semiconductor IC substrate 152 also comprises a (typically CMOS) MEMS controller 153 configured to control the states of the MEMS switches 16, 18 as described above (and/or in some embodiments some or all of the said signal processing circuitry). As shown in FIG. 11, the MEMS controller 153 is provided on the second surface 152b of the semiconductor IC substrate 152 (typically offset from the antenna 40 vertically (in which case it may be that the semiconductor IC substrate 152 comprises a plurality of layers, and it may be that one or more of the layers, such as a layer comprising the antenna 40, is insulating) and/or laterally), but alternatively the MEMS controller 153 (or a portion thereof, or at least a portion of the signal processing circuitry) may be provided on an upper surface of the cavity 154 (i.e. first surface 152a of the semiconductor IC substrate 152) or on the first surface 152a of the semiconductor IC substrate 152 laterally offset from the MEMS switches. The MEMS controller 153 is connected to the MEMS switches by way of a redistribution layer of the semiconductor IC substrate 152 which connects the MEMS controller 153 to respective conductive pads 155 which conductively connect to the anchors 22 of the MEMS substrate 2. In the embodiment of FIG. 11, the conductive pads 155 are provided in the enclosed volume between the MEMS substrate 2 and the cap 152, but it will be understood that, alternatively, the conductive pads 155 may be provided outside of the enclosed volume but conductively connected to the respective anchors 22. The MEMS controller 153 may be a standalone controller or a local controller configured to receive control signals from a master MEMS controller as described above. The antenna 40 is conductively connected to the signal conductor 14 by way of conductive through substrate via 161 extending (fully) through the semiconductor IC substrate 152 and a conductive pillar 162 built up on the front end of the signal conductor 14.

FIG. 12 shows a portion of a phased array 200 of antenna modules 150 wherein a semiconductor IC substrate 152' is a carrier substrate common to all of the antenna modules 150 of the array comprising the MEMS controllers (or local and/or master MEMS controllers where provided) of the antenna modules 150. Also shown in FIG. 12 is electromagnetic signal divider and/or combiner 210 formed on and supported by the first surface 152a' of the carrier substrate 152', the electromagnetic signal divider and/or combiner 210 being configured to divide an RF signal from an RF port 214 between a plurality of antenna modules (typically of a sub-array) of the array and/or to combine RF signals from a plurality of antenna modules (typically of a sub-array) of the array to the RF port 214. The electromagnetic signal divider and/or combiner 210 comprises a plurality of conductive branches 212 each of which (directly) connects to the signal conductor 14 of a respective antenna module 150. The conductive branches 212 link to the RF port 214 which carries RF signals to and from the carrier substrate 152' by way of a surface mount connection (e.g. land grid array). The electromagnetic signal divider and/or combiner 210 is provided on the first surface 152a' of the semiconductor IC substrate (i.e. on the same surface that the MEMS substrates of the antenna modules 150 are stacked). As above, a common ground plane is typically provided for the antennas 40 and the electromagnetic signal divider and/or combiner 210 between the first and second surfaces 152a', 152b' of the capping substrate 152'. Typically the common ground plane is parallel to planes of the (planar) first and second surfaces 152a', 152b' of the substrate 152', and provided between the said first and second surfaces 152a', 152b' (in which case the semiconductor IC substrate 152' comprises a plurality of layers). Insulating portions are typically provided in the common ground plane in the region of through vias so as to avoid short circuiting the vias to the ground plane. Also as above, respective electromagnetic signal dividers and/or combiners are provided for each sub-array of the array.

The common carrier substrate 152' may further comprise integrated circuitry 101 comprising (typically semiconductor, typically CMOS) signal processing circuitry (e.g. power amplifier(s), low noise amplifier(s), analogue to digital converter, digital to analogue converter, interface, filters) configured to process signals received and/or to be transmitted by the antennas 40. In this case, the integrated circuitry 101 is provided between the port 214 and the connection 214.

FIG. 13 is a schematic view of an alternative antenna module 250 which is identical to that shown in FIG. 10 and described above with reference thereto (common features will be referred to using the same reference numerals) except for the fact that the antenna 40 is provided on the second surface of the MEMS substrate 2 rather than on the second surface of the semiconductor IC substrate 152, the antenna 40 is connected to the signal conductor 14 by way of a via 252 extending through the MEMS substrate 2 and the IC(s) provided by the semiconductor IC substrate 152 are connected to the anchors 22 of the MEMS switches provided on the MEMS substrates by way of through vias 32 extending through the semiconductor IC substrate 152 (which still provides a protective cap for the MEMS switches). Via 44 in this case extends through the semiconductor IC substrate 152 to connect to a conductive pillar 253 built up on the back end of the signal conductor 14.

Figure 14:
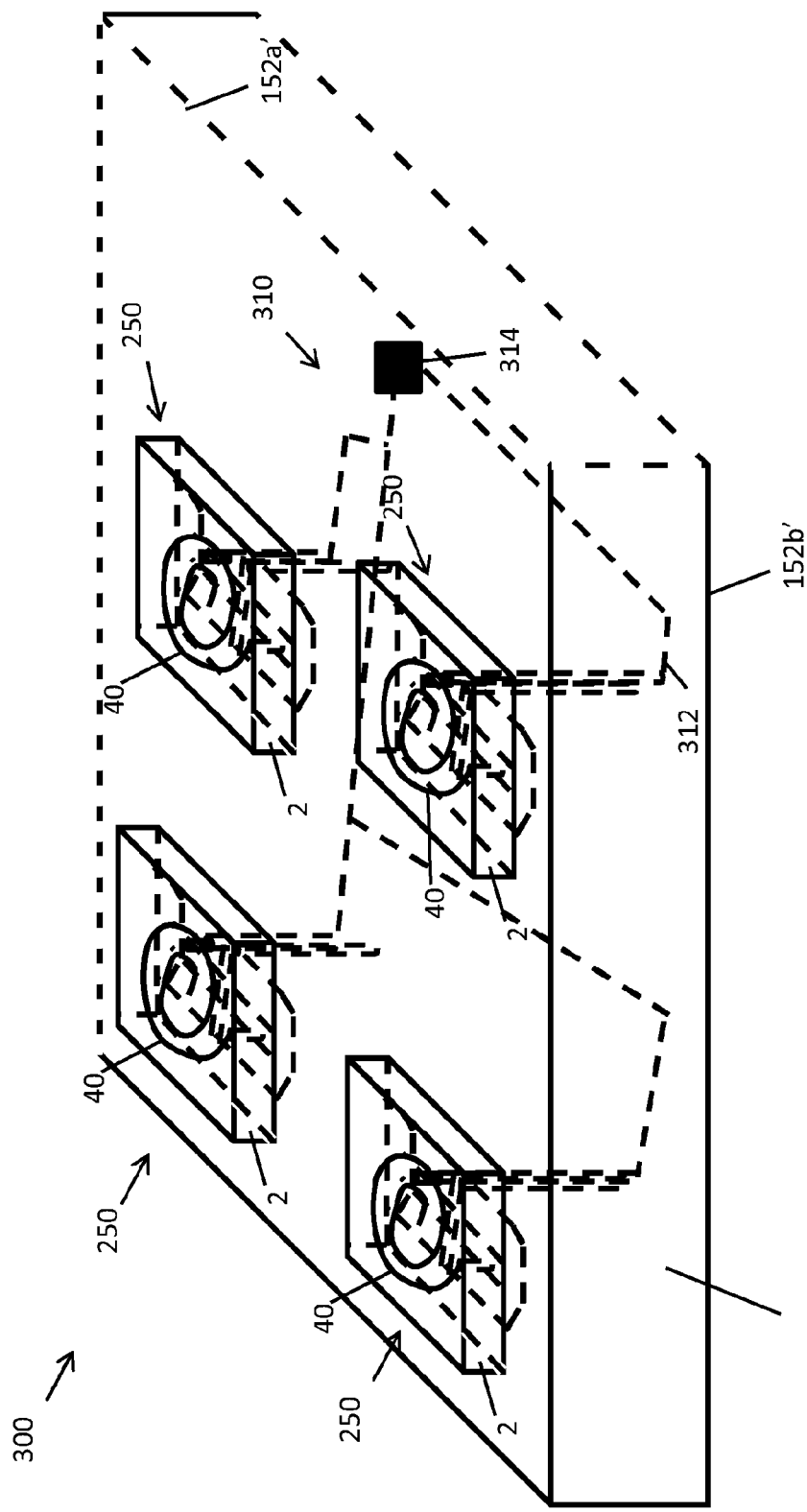
FIG. 14 is a schematic diagram of a portion of a phased antenna array having antenna modules as shown in FIG. 13, with the antenna modules of the array having a common semiconductor IC substrate.

FIG. 14 shows a portion of a phased array 300 of antenna modules 250 wherein the semiconductor IC substrate 152' comprising the MEMS controllers of the antenna modules (or the local and/or master MEMS controllers where provided) is again the common carrier substrate. Also shown in FIG. 14 is an electromagnetic signal divider and/or combiner 310 formed on and supported by the second surface 152b' of the carrier substrate 152' (i.e. the opposite side of the carrier substrate 152' from the first side 152a' of the substrate 152' on which the MEMS substrates 2 are mounted) and configured to divide an RF signal from an RF port 314 between a plurality of antenna modules of the array (e.g. of a sub-array) and/or to combine RF signals received from a plurality of said antenna modules of the array (e.g. a sub-array) to an RF port 314. The electromagnetic signal divider and/or combiner 310 comprises a plurality of conductive branches 312 each of which connects to the signal conductor 14 of a respective antenna module 250 by way of a respective via 44 and pillar 253 as shown in FIG. 13. The conductive branches 312 link to the RF port 314 which carries electromagnetic signals to and from the carrier substrate 152' by way of a surface mount connection (e.g. land grid array). In this case, a common ground plane for the antennas and the electromagnetic signal divider and/or combiner 310 is provided on the first surface 152a' of the carrier substrate 152'. Although the antennas 40 are shown directly above (i.e. vertically aligned) with the MEMS switches 16, 18 in FIG. 14, the antennas 40 may alternatively be laterally offset from the MEMS switches 16, 18 to reduce interference between the antennas 40 and the MEMS switches 16, 18.

The common carrier substrate 152' of FIG. 14 may further comprise integrated circuitry 101 comprising signal processing circuitry configured to process signals received and/or to be transmitted by the antennas 40.

As an alternative to the embodiments of FIG. 14, it may be that the antennas 40 and the electromagnetic signal divider and/or combiner 310 are instead provided (e.g. formed) on the first surface 152a' of the semiconductor IC substrate 152' (together with the MEMS substrates 2). In this case, the antennas 40 and the electromagnetic signal divider and/or combiner 310 may be provided with a common ground plane on the second surface 152b' of the common substrate 152'. This effectively makes the MEMS phase shifters an integral part of the electromagnetic signal divider and/or combiner 310, allowing the MEMS phase shifters and antennas to be provided closer to each other with shorter conductive connections between them. Indeed, the requirement for through substrate vias is significantly reduced. This helps to keep parasitic and signal losses low, particularly at high signal frequencies.

Figure 14A:
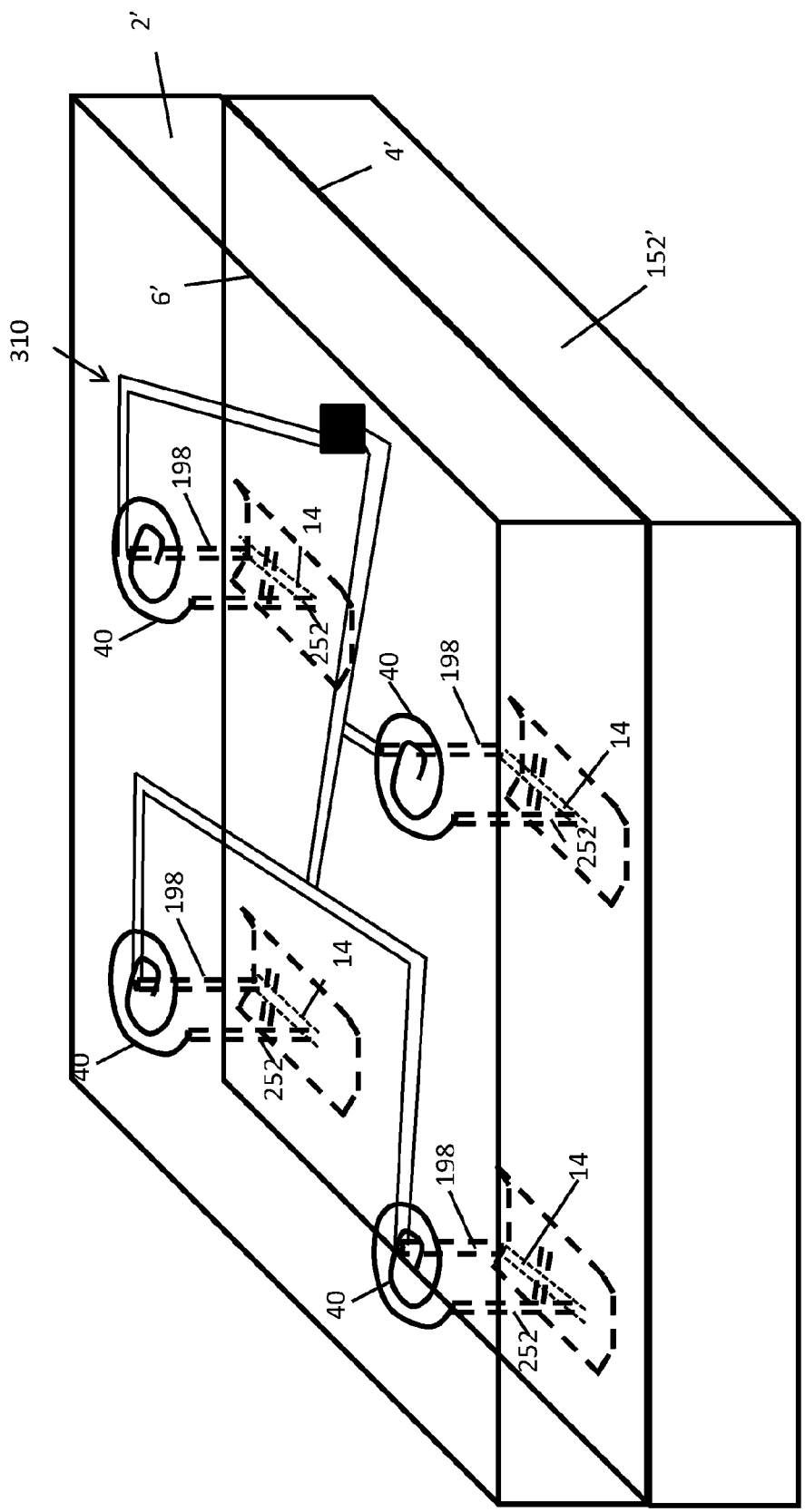
FIG. 14a is a schematic diagram of a portion of a similar array to FIG. 14 but with a common MEMS substrate.

FIG. 14a shows a similar phased antenna array to FIG. 14, but in this case the MEMS switches 16, 18, signal and ground conductors 14, 15 and antennas 40 of each antenna module of the array are supported by and formed on a common MEMS substrate 2' (rather than individual discrete MEMS substrates 2 for each module). The common MEMS substrate 2' is stacked on (and typically bonded to) the carrier semiconductor IC substrate 152'. The electromagnetic signal divider and/or combiner 310 is in this case provided on the second surface 6' of the MEMS substrate 2, the electromagnetic signal divider and/or combiner 310 being connected to the signal conductors 14 of the respective antenna modules by way of respective first through vias 198 which extend through the MEMS substrate 2. The first surface 4' of the common MEMS substrate 2' comprises a ground plane which provides a common ground plane for the electromagnetic signal divider and/or combiner 310 and the antennas 40. Although the antennas are shown vertically aligned with the MEMS switches 16, 18, it will be understood that alternatively, the antennas 40 may be laterally offset from the MEMS switches 16, 18.

Figure 14B:
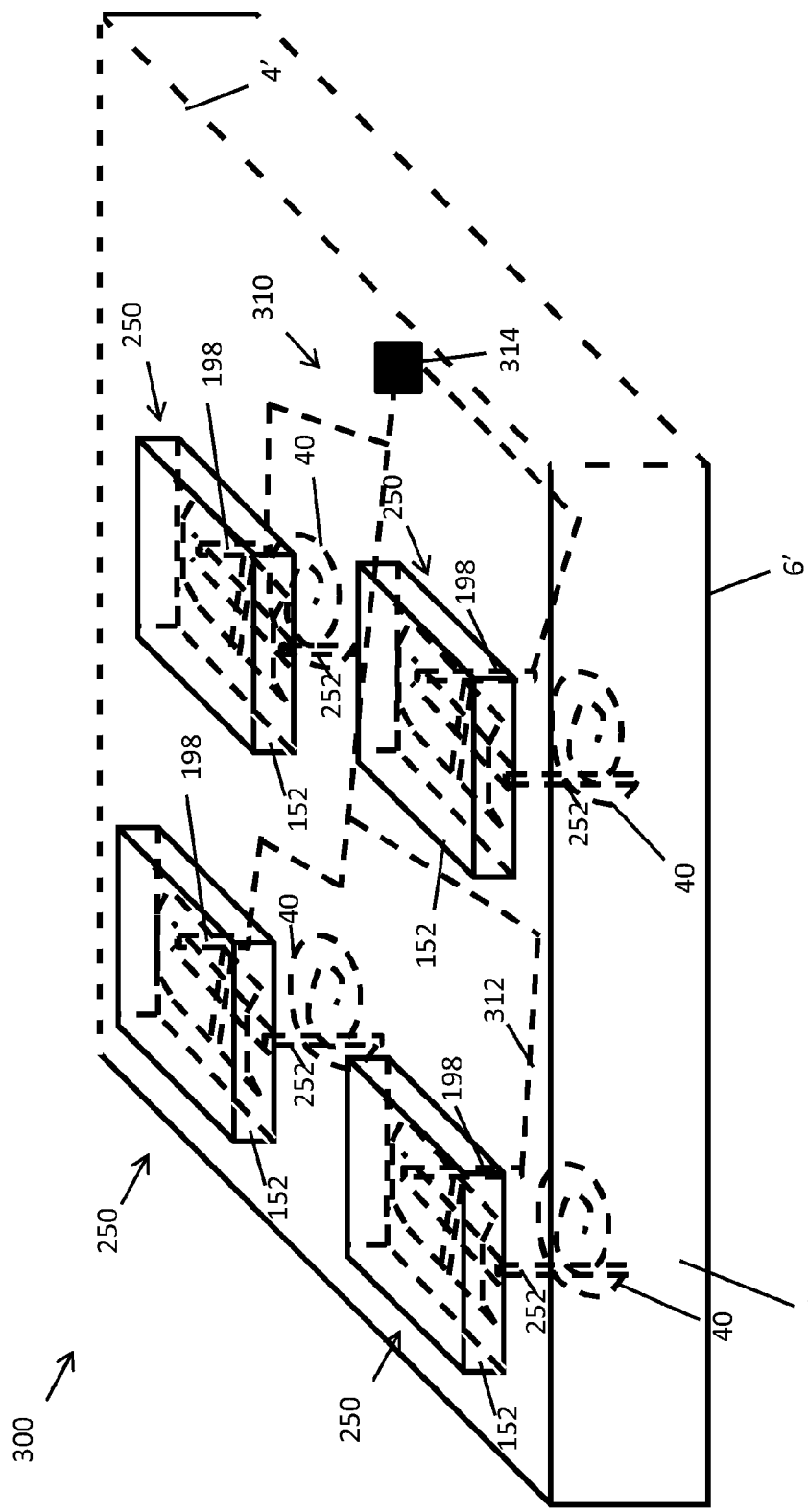
FIG. 14b is a schematic diagram of a similar array to FIG. 14a but with semiconductor IC substrates discrete from each other mounted on the common MEMS substrate.

FIG. 14b shows a similar phased antenna array to FIG. 14a, but in this case, the carrier substrate is the common MEMS substrate 2'. Individual semiconductor IC substrates 152 (one per antenna module) which are discrete from each other are mounted on the common MEMS substrate 2' to form respective enclosed volumes around the MEMS switches of the antenna modules of the array between the respective semiconductor IC substrates 152 and the MEMS substrate 2'. The respective semiconductor IC substrates 152 typically comprise respective MEMS controllers (not shown in FIG. 14b) configured to control the respective MEMS switches provided in the respective enclosed volume formed between the respective semiconductor IC substrate 152 and the MEMS substrate 2'. The semiconductor substrates 152 each have a cavity vertically aligned with the MEMS switches in the respective enclosed volumes such that the MEMS switches are allowed to move (selectively) between their first and second states.

Figure 15:
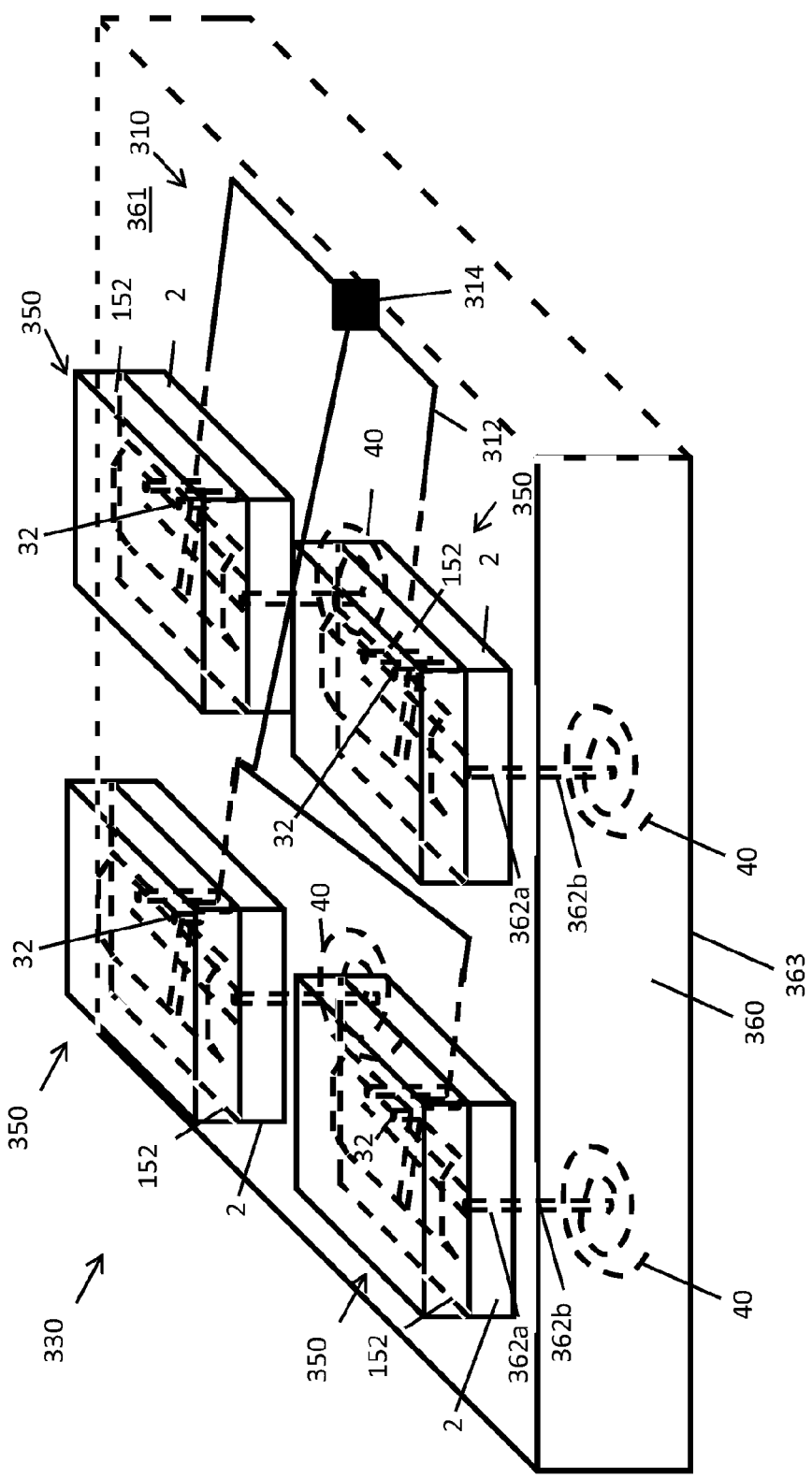
FIG. 15 is a schematic diagram of a portion of an alternative phased antenna array having antenna modules each of which is made up from a semiconductor IC substrate stacked on and capping a MEMS substrate which is itself stacked on an antenna substrate comprising the antenna, the antenna substrate being a carrier substrate common to all of the antenna modules of the array.

FIG. 15 shows a phased array 330 of alternative antenna modules 350 with the antennas 40 provided on a common carrier antenna substrate 360 bonded to the second surfaces of the MEMS substrates 2. The MEMS substrates 2 are sandwiched between the antenna substrate 360 and discrete semiconductor IC substrates 152 comprising the MEMS controllers. The MEMS switches 16, 18 are provided in an enclosed volume between a capping portion of the semiconductor IC substrate 152 and the MEMS substrate 2. The antennas 40 are conductively connected to the respective signal conductors 14 of the respective antenna modules 350 by way of conductive through substrate vias 362a, 362b together extending through the MEMS substrate 2 and the antenna substrate 360. The discrete semiconductor IC substrates 152, together with the MEMS substrates 2, form enclosed volumes around the MEMS switches 16, 18 of the respective modules. Hermetic seals are provided between the MEMS substrates 2 and the respective semiconductor IC substrates.

MEMS control signals are provided from the or the respective MEMS controller of the semiconductor IC substrate 152 to the anchors 22 of the MEMS switches 16, 18 by way of respective through vias 32 extending through the respective semiconductor IC substrates 152. A common ground plane is typically provided for the antennas 40 and the electromagnetic signal divider and/or combiner 310 between the second and first surfaces 361, 363 of the carrier substrate 360. Typically the common ground plane is parallel to planes of the (planar) first and second surfaces 361, 363 of the substrate 360, and provided between the said first and second surfaces 361, 363 (in which case substrate 360 comprises a plurality of layers). Insulating portions are typically provided in the common ground plane in the region of through vias so as to avoid short circuiting the vias to the ground plane. Electromagnetic signal divider and/or combiner 310 is formed on and supported by the first surface 361 of the carrier substrate 360 on which the MEMS substrates 2 are stacked, the electromagnetic signal divider and/or combiner 310 being configured to divide an RF signal from an RF port between a plurality of antenna modules 350 (e.g. a sub-array) of the array 330 and/or to combine RF signals received from a plurality of antenna modules 350 (e.g. a sub-array) of the array to an RF port.

It may be that the carrier substrate 360 is formed from semiconducting material and signal processing circuitry common to a plurality of antenna modules (e.g. master MEMS controller) is formed on the carrier substrate 360 (e.g. offset from the antenna modules 1). Alternatively, semiconductor signal processing circuitry common to a plurality of antenna modules may be provided on an external substrate separate from the carrier substrate 360. It is preferable for the antenna substrate 360 to have a high dielectric constant (e.g. made from one or more of the high dielectric materials set out above in respect of the MEMS substrate(s)) in order to reduce the electric (and thus physical) length of the antennas 40, thereby allowing them to be provided smaller (or more complicated) and closer together. In some cases, the antenna substrate is a laminate substrate, LTCC substrate, HTCC substrate, organic substrate, multi-layer organic substrate (such as a multi-layer organic substrate from Rogers Corporation), a glass substrate, a ceramic substrate, a glass ceramic substrate or an insulating substrate such as alumina.

Figure 16:
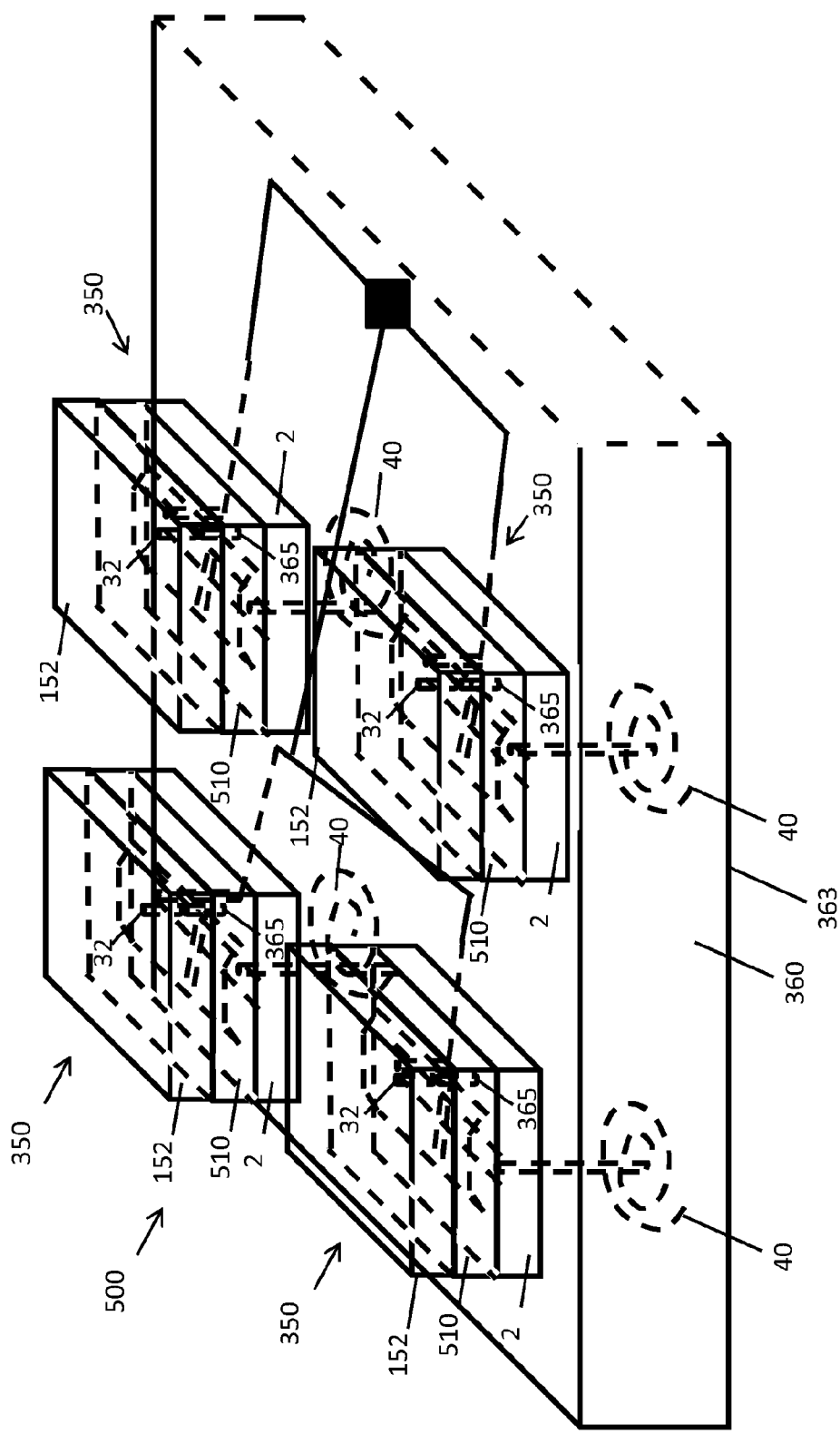
FIG. 16 is similar to FIG. 15 but with discrete interposer caps between the semiconductor IC substrates and the MEMS substrates of the antenna modules.

FIG. 16 shows yet another phased antenna array 500 which is identical to phased antenna array 330 shown in FIG. 15 but for the addition of respective discrete interposer caps 510 provided between the MEMS substrates 2 and the semiconductor IC substrates 152. The respective interposer caps 510 are stacked (and sandwiched) between the first surface of the MEMS substrate 2 and the respective semiconductor IC substrates 152. The interposer caps 510 help to match different co-efficients of thermal expansion between the MEMS substrate 2 and semiconductor IC substrates 152 (e.g. by being formed of material having a coefficient of thermal expansion intermediate those of the MEMS substrate 2 and the semiconductor IC substrates 152). The interposer caps 510 also provide an electrical interface (i.e. the interposer caps 510 provide signal routing layers) between the MEMS substrates 2 and the respective semiconductor IC substrate 152, in this case in the form of through vias extending through the interposer caps 510 between the MEMS substrates 2 and the semiconductor IC substrate 152. In this case, the MEMS controllers of the respective semiconductor IC substrates 152 are electrically connected to the anchors 22 of the MEMS switches by way of a first respective through substrate via 32 extending through the respective semiconductor IC substrate 152 and a second respective through substrate via 365 which extends through the respective interposer cap 510. The interposer caps 510 may further comprise one or more integrated components or (e.g. passive) devices, such as one or more lumped elements (e.g. one or more capacitors, one or more inductors or one or more resistors) provided as part of the conductive interface.

Figure 17:
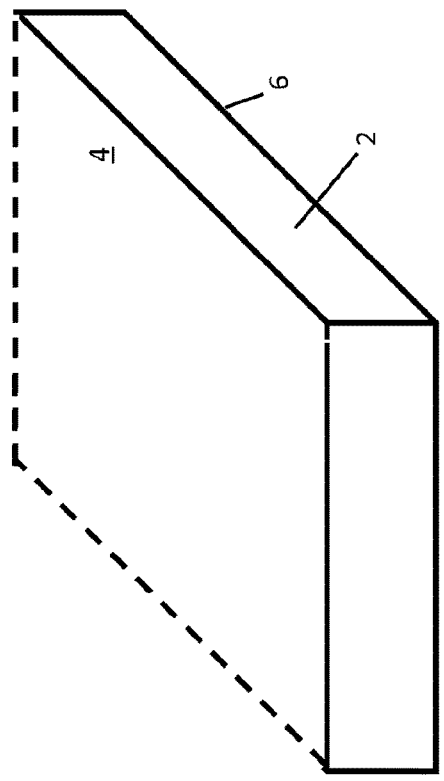
FIGS. 17 to 20a illustrate a method of manufacturing the antenna modules of FIGS. 1 to 4.

A method of manufacturing the antenna apparatus 1 of FIGS. 1 to 3 is illustrated in FIGS. 17 to 21. With reference to FIG. 17, the capping portion of the capping substrate 34 can be manufactured by: providing a (typically monolithic) semiconductor substrate 34; forming (e.g. etching) a cavity 36 in a first surface 33 of the (e.g. high resistivity silicon) substrate 34; providing (typically forming, e.g. by etching a hole in the substrate 34 and filling it with metal) a conductive through substrate via (e.g. through silicon via) 42 extending from a second surface 38 of the substrate 34 to the first surface 33 of the substrate 34 so that the via 42 is in communication with the cavity 36; and forming (e.g. by depositing and/or patterning metal (e.g. by photolithography)) an antenna element 40 on the second surface 38 of the substrate 34 such that an end of the antenna element 40 is in conductive communication with the via 42 (i.e. the end of the via 42 closest to the second surface 38 of the semiconductor substrate 34). A conductive ground plane is typically formed on the second surface 33 of the capping substrate 34 by depositing a metal layer thereon with an insulating portion surrounding the via 42 on the second surface 33.

Figure 18:
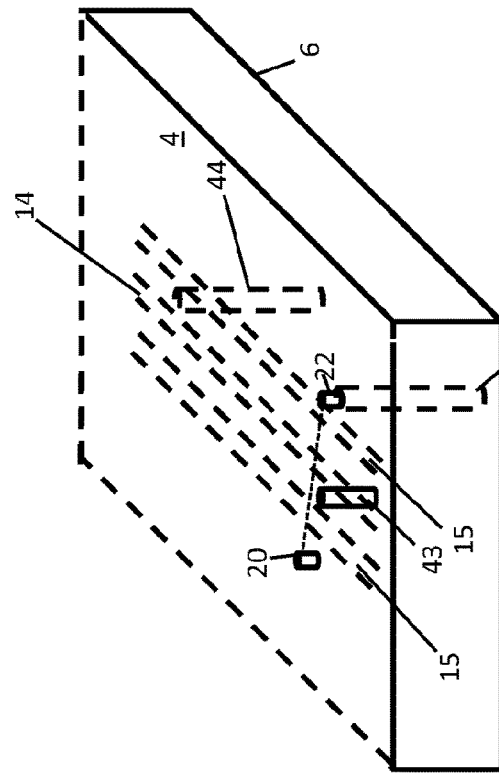
Figure 19:
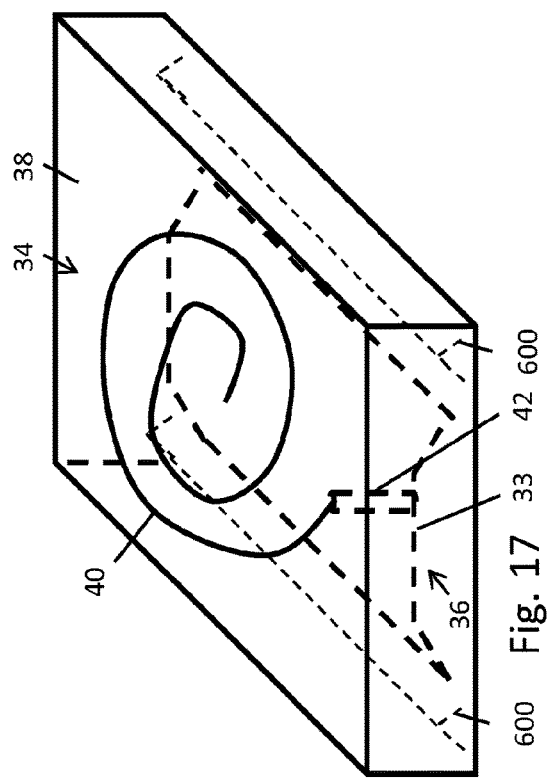

With reference to FIG. 18, a crystalline semiconductor MEMS substrate 2 (which in this case will be assumed to be formed from high resistivity silicon) is provided. As shown in FIG. 19, a through substrate via 44 is formed (e.g. by etching a hole in the MEMS substrate and filling it with metal) between the first and second surfaces 4, 6 of the MEMS substrate 2. A signal conductor 14 and ground conductors 15 are formed (e.g. deposited and/or patterned, e.g. using photolithography) on the first surface 4 such that a back end of the signal conductor is conductively connected to the through substrate via 44. Solid dielectric material 28 is deposited on the signal conductor 14. In addition, conductive through substrate vias 32 are formed (e.g. by etching holes in the substrate 2 and filling them with metal) between the first surface 4 of the MEMS substrate 2 and the second surface 6 of the MEMS substrate 2. Anchors 20, 22 are formed (e.g. deposited) on either side of the signal co-planar waveguide formed by the signal conductor 14 and ground conductors 15 by depositing conductive material (e.g. metal, e.g. aluminium) to form pillars having heights (above the first surface 4 of the MEMS substrate 2 on which they are formed) which are greater than the heights of the combination of the signal conductor 14 and dielectric layer 28 and greater than the heights of the ground conductors 15. Anchor 22 is formed on top of via 32 to allow connection of the anchor 22 to the MEMS controller. A ground plane may also be formed on the second surface 6 of the MEMS substrate 2 by depositing metal thereon.

Figure 20:
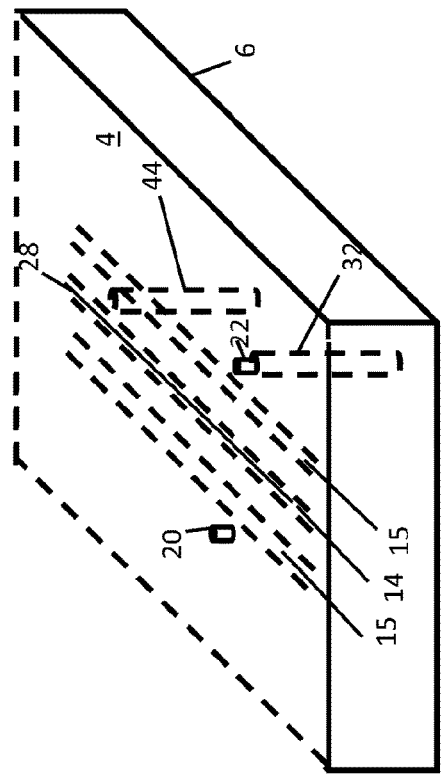

As shown in FIG. 20, MEMS switches 16, 18 are formed on the first surface 4 of the MEMS substrate 2. This is done by serial semiconductor (e.g. CMOS) fabrication process steps, typically including: filling the region between the anchors 20, 22 with a sacrificial (typically polymer or silicon oxide) layer; polishing the sacrificial layer; forming (e.g. depositing) a conductive (typically metallic—e.g. aluminium) layer on top of the sacrificial layer extending between the anchors 20, 22; patterning (e.g. by masking and etching, e.g. using photolithography) the conductive layer into the desired shape of the MEMS bridge 24; and removing (the mask, where provided, and) the sacrificial layer (e.g. using a sacrificial layer solvent). In addition, the conductive pillar 43 is formed (e.g. built up by material deposition) at a front end of the signal conductor 14 for conductively connecting the via 42 to the signal conductor 14.

It will be understood that, alternatively, a trench may be formed in the MEMS substrate 2 and the MEMS switches 16, 18 are formed in the trench by depositing the sacrificial layer in the trench and polishing it before forming the bridge 24 as described above. In some embodiments, the anchors 22 of discrete groups of capacitive MEMS switches are conductively connected together to form a (e.g. 7-bit) reconfigurable MEMS phase shifter (as described above).

Figure 20A:
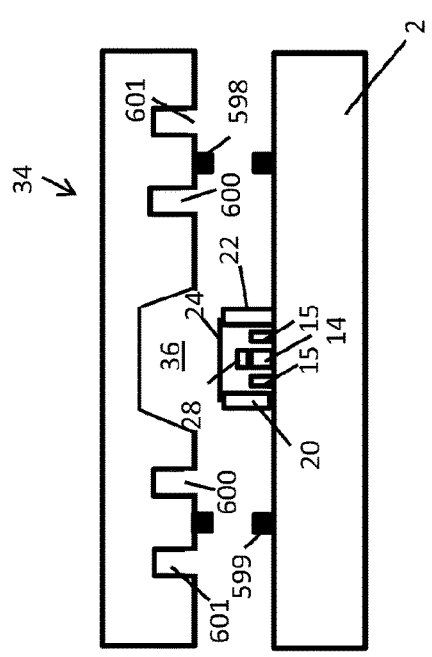

With reference to FIG. 20a, the capping substrate 34 is typically bonded to the MEMS substrate 2 by: providing a first metal sealing ring 598 around the MEMS switches 16, 18 on the MEMS substrate 2; providing a second metal sealing ring 599 around the cavity 36 on the capping substrate 34; placing the capping substrate 34 onto the MEMS substrate 2 such that the rings are provided between the capping substrate 34 and the MEMS substrate 2 which form an enclosed volume around the MEMS switches 16, 18; placing the capping substrate and the MEMS substrate 2 together into a vacuum chamber; evacuating the chamber (e.g. to substantially a vacuum); heating the chamber to melt the sealing rings; and cooling the chamber so that the sealing rings cool and thereby solidify to bond the MEMS substrate 2 to the capping substrate 34, and to form a hermetic seal between the MEMS substrate 2 and the capping substrate to maintain a vacuum in the enclosed volume. Grooves 600 are provided between the MEMS switches 16, 18 and the sealing rings 598, 599 so as to receive reflowed metal from the molten sealing rings, in order to inhibit (preferably prevent) the reflowed metal coming into contact with the MEMS switches 16, 18. Optionally, grooves 601 are also provided between the sealing rings 598, 599 and the outer edge of the capping substrate. Grooves may be provided in the MEMS substrate 2 such that the grooves in the MEMS substrate 2 can be aligned with grooves in the capping substrate to thereby align the MEMS substrate 2 and the capping substrate 34 during assembly (which typically helps to align via 42 with conductive pillar 43).

Instead of using grooves 600 to prevent molten metal from the sealing rings from coming into contact with the MEMS switches 16, 18, multiple (thinner) sealing rings (for example three sealing rings) may be provided with gaps between them in place of sealing rings 598, 599.

The step of evacuating the chamber may be substituted or followed by a step of filling the chamber with nitrogen at atmospheric pressure or at a pressure intermediate vacuum and atmospheric pressure (e.g. between 25% and 75% of atmospheric pressure). In this case, instead of the enclosed volume being a vacuum in the sealed structure, the sealed enclosed volume contains nitrogen at atmospheric pressure or at the said pressure intermediate vacuum and atmospheric pressure. This reduces the pressure differential between the enclosed volume and the surrounding environment (in typical use) which helps to prevent leaks bringing the enclosed volume into communication with the surrounding environment.

It will be understood that, when the capping substrate 34 is placed on the MEMS substrate, the via 42 is brought into conductive engagement with the signal conductor 14 to thereby conductively connect the antenna 40 to the signal conductor 14.

In order to form the structure of FIG. 4, the method may further comprise forming integrated circuitry 49 on the semiconductor IC substrate 50 by serial semiconductor (e.g. high voltage CMOS) fabrication process steps, typically including depositing material on the substrate; patterning the deposited material (e.g. by photolithography); etching; and doping. Next, the method comprises bonding the first surface 52 of the semiconductor IC substrate 50 to the second surface 6 of the MEMS substrate 2. Again, this may be by providing metal sealing rings around the periphery of the second surface 6 of the MEMS substrate 2 and around the periphery of the first surface 52 of the semiconductor IC substrate 50; heating the metal sealing rings to thereby melt the metal sealing rings; and cooling the metal sealing rings so that they solidify to thereby bond the substrates 2, 52 together. This results in the antenna module of FIG. 4.

As shown in FIG. 5, it may be that the semiconductor IC substrate 50 is a carrier substrate which carries a plurality of antenna modules 1 to form a phased antenna array 100. In this case, the second surfaces 6 of the discrete MEMS substrates 2 of the respective antenna modules 1 are bonded to respective portions of the carrier substrate. The method may further include providing (typically forming, typically deposited and/or patterned, e.g. using photolithography) digital signal tracks on and/or through the semiconductor IC substrate 50 in order to carry control signals from the MEMS controller to the vias 32 (if for example the MEMS controller is not provided directly beneath the MEMS substrates 2 and is instead offset therefrom on the carrier substrate, or to carry control signals from the master MEMS controller (where provided) to the respective local MEMS controllers).

The method typically further comprises forming electromagnetic signal dividers and/or combiners 70 on the first surface 52 of the semiconductor carrier substrate 50, typically by providing deposited and/or patterned tracks onto the first surface 52 of the semiconductor carrier substrate (e.g. by depositing, masking and etching a metallic layer, e.g. using photolithography). The electromagnetic signal dividers and/or combiners is typically connected to circuitry external to the carrier substrate 50 by respective connections 74 (e.g. to RF front end circuitry of a base station or a small, micro or femto cell infrastructure, or wireless backhaul, transmitter, receiver or transceiver or a or mobile wireless telecommunications device).

The method typically further comprises forming integrated circuitry 101 on the semiconductor carrier substrate 50 by serial semiconductor (e.g. CMOS) fabrication process steps, typically including depositing material on the substrate; patterning the deposited material (e.g. by photolithography); etching; and doping. The integrated circuitry 101 is typically provided between an electromagnetic signal divider and/or combiner 70 and a connection 74.

As discussed above, the integrated circuitry 49 typically comprises a MEMS controller (or local MEMS controller) configured to control the states of the MEMS switches 16, 18. The integrated circuitry 101 typically comprises semiconductor integrated signal processing circuitry, which may be RF signal processing circuitry and/or digital signal processing circuitry. The integrated circuitry 101 may further comprise a master MEMS controller configured to control local MEMS controllers provided in integrated circuitry 49 local to the antenna modules.

As discussed above, instead of the semiconductor IC substrate 50 being the carrier substrate of the phased antenna array 100, it may be that the capping substrate 34 is the carrier substrate so as to form the phased antenna array 118 shown in FIG. 8. In this case, the sealing and evacuation (and/or inert gas/nitrogen filling) of the enclosed volumes between the capping substrate 34 and the MEMS substrates 2 of the antenna modules 1 typically takes place in parallel in the chamber. The bonding of the individual semiconductor IC substrates 52 to the second surfaces of the MEMS substrates 2 may be performed beforehand, afterwards or at the same time.

As also discussed above, instead of the capping substrate 34 forming the enclosed volume around the MEMS switches 16, 18 with the MEMS substrate 2, it may be that respective discrete interposer caps 120 are provided between the MEMS substrates 2 and the carrier substrate 50 to form the phased array as shown in FIG. 9. In this case, the sealing and evacuation (and/or inert gas/nitrogen filling) of the enclosed volumes between the interposers 120 and the MEMS substrates 2 of the antenna modules 1 is performed (serially or in parallel) in the said chamber. The bonding of the interposers 120 to the carrier substrate 50 (which is typically performed by heating and cooling a metallic sealing ring between the interposers 120 and the carrier substrate 50) can be performed serially or in parallel with the sealing of the enclosed volumes. The method may comprise forming a conductive interface in the interposers, optionally comprising one or more conductive through substrate vias and/or one or more integrated components or (e.g. passive) devices, such as one or more lumped elements (e.g. one or more capacitors, one or more inductors or one or more resistors) provided as part of the conductive interface. For example, the interposers may comprise one or more vertical capacitors.

As discussed above with respect to FIG. 5*b*, instead of providing discrete MEMS substrates 2 and capping substrates 34, it may be that a MEMS substrate 2 common to all of the antenna modules of the array and a capping substrate 34 common to all of the antenna modules of the array are provided. In addition, it may be that the electromagnetic dividers and/or combiners are provided on the first surface 4 of the common MEMS substrate 2.

Figure 21:
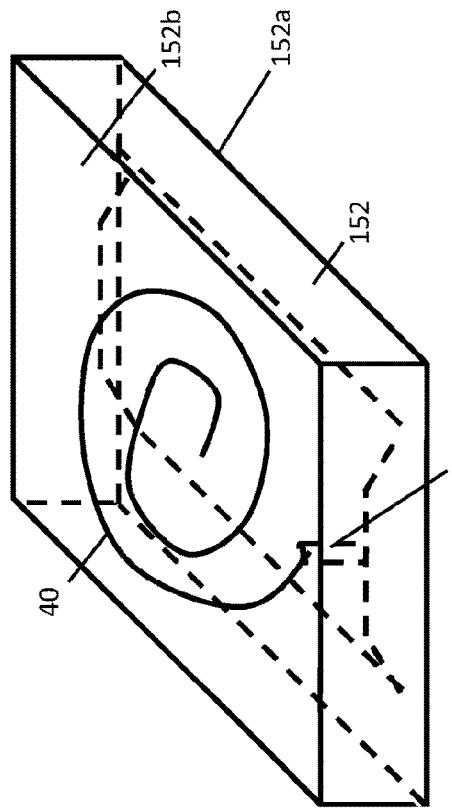
FIG. 21 shows a capping semiconductor IC substrate having an antenna on a top surface thereof.

In order to manufacture the antenna module 150 shown in FIGS. 10 to 11, or the phased array 200 shown in FIG. 12, the step of forming the IC substrate 152 is the same as the step of forming the IC substrate 50 described above, but for the addition of the antenna 40 being deposited and/or patterned on the second surface 152*b* of the semiconductor IC substrate 152 and a conductive through substrate via 161 conductively extending between the antenna 40 and the signal conductor 14 on the MEMS substrate 2. This is illustrated in FIG. 21. Typically via 161 is formed (e.g. by etching a hole through the substrate 152 and filling it with metal) before the antenna 40. In addition, a redistribution layer is formed and configured to route MEMS control signals from the integrated circuitry formed on the semiconductor IC substrate 152 to the conductive anchors 22 on the MEMS substrates 2. The semiconductor IC substrate 152 is sealedly bonded to the MEMS substrate 2 in a similar way to the way in which the capping substrate(s) 34 and the MEMS substrates 2 are bonded above.

As shown in FIG. 12, the semiconductor IC substrate 152' may be the carrier substrate of the phased array 200. In this case, the sealing of the semiconductor IC substrate 152 to the respective MEMS substrates 2 of the array 200 is typically performed in the chamber (e.g. in parallel with each other).

Figure 23:
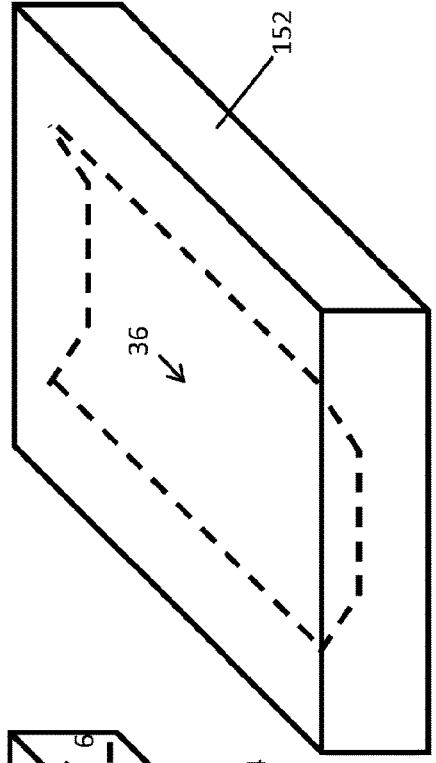
FIG. 23 shows a semiconductor IC substrate having a cavity.
Figure 22:
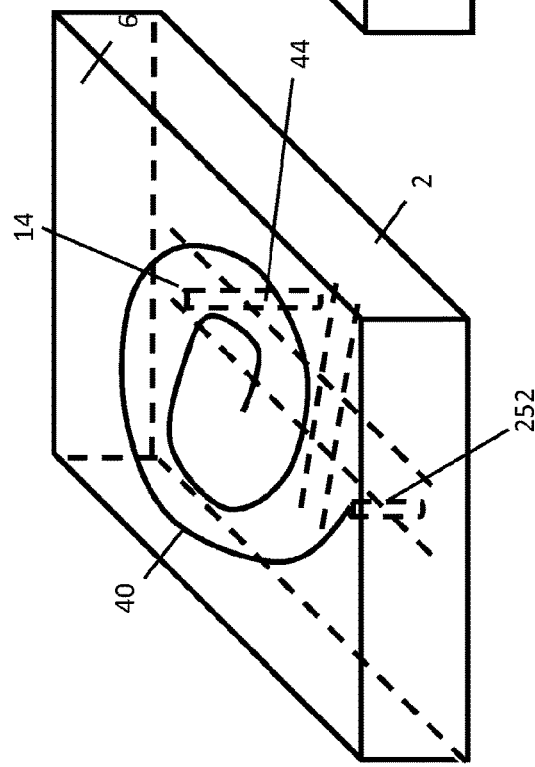
FIG. 22 shows a MEMS substrate having MEMS switches on a first surface and an antenna on a second surface opposite the first surface.

In order to manufacture the antenna module 250 shown in FIG. 13, instead of forming the antenna 40 on the second surface of the semiconductor IC substrate 152, the antenna 40 is formed on the second surface 6 of the MEMS substrate 2 (again typically by depositing material and patterning (e.g. using photolithography)) and a via 252 is formed which extends through the MEMS substrate 2 to conductively connect the antenna 40 to the signal conductor 14. This is illustrated in FIG. 22. In this case, the semiconductor IC substrate 152 comprises the integrated circuitry and a cavity 36 which aligns with the MEMS switches 16, 18 on the MEMS substrate 2. This is shown in FIG. 23. Again, grooves may be provided in the respective substrates to help with the alignment thereof.

As shown in FIG. 14, the semiconductor IC substrate 152' may be the carrier substrate for a phased array 300 comprising a plurality of the antenna modules 250 of FIG. 13.

As shown in FIG. 14*a*, instead of providing discrete MEMS substrates 2, a MEMS substrate 2' may be provided which is common to all of the antenna modules of the array. In this case, it may be that the electromagnetic signal dividers and/or combiners are provided on the second surface 6' of the common MEMS substrate 2.

As shown in FIG. 14b, instead of providing a common semiconductor IC substrate 152', a plurality of semiconductor IC substrates 152 discrete from each other may be provided.

In order to form the phased antenna array 330 shown in FIG. 15, instead of forming the antennas 40 on the second surfaces 6' of the MEMS substrates 2, they may be formed on a second surface 363 of a semiconductor antenna substrate 360 opposite a first surface 361 of the semiconductor antenna substrate 360 on which the MEMS substrates of the antenna modules are mounted. In this case, the semiconductor antenna substrate 360 acts as the carrier substrate. The vias 362a,b together extend between the antennas 40 and the respective signal conductors 14 through the antenna substrate 360 and the MEMS substrate 2. In this embodiment, the sealing and evacuation (and/or inert gas/nitrogen filling) occurs between the semiconductor IC substrates 152 and the MEMS substrates 2, the semiconductor IC substrates 152 providing the protective cap function for the MEMS switches 16, 18. The MEMS substrates 2 are bonded to the antenna substrate 360, either in series with or in parallel to the evacuation (and/or inert gas/nitrogen filling) and sealing between the semiconductor IC substrates 152 and the MEMS substrates 2.

As shown in FIG. 16, respective discrete interposers 510 may provide the cap over the MEMS switches 16, 18. In this case, the sealing and evacuation (and/or inert gas/nitrogen filling) between the interposers 510 and the MEMS substrates 2 occurs either in series with or in parallel with the bonding of the antenna substrate 360 to the MEMS substrates 2. Similarly the bonding between the interposers 510 and the semiconductor IC substrates 152 may occur in series with or parallel to the sealing and evacuation (and/or inert gas/nitrogen filling) between the interposers 510 and the MEMS substrates 2.

It will be understood that in any of the above embodiments, any of the MEMS controller(s) or signal processing circuitry may be provided on semiconductor IC substrates individual to the antenna modules, on a semiconductor IC substrate common to a plurality of the antenna modules, or distributed between semiconductor IC substrates individual to the antenna modules and a semiconductor IC substrate common to a plurality of the antenna modules.

In each case, the respective ground planes are formed by depositing metallic layers on the relevant substrate surfaces.

It will be understood that, in the variations of the embodiments of FIGS. 8, 9 where the antennas are formed on the second surface 38' of the capping substrate 34', the antennas would be formed on the first surface 33' of the capping substrate 34' (typically by deposition of metal) rather than on the second surface 38'. Similarly, in the variation of the embodiment of FIG. 14 where the antennas 40 are formed on the first surface 152a' of the semiconductor IC substrate 152', the antennas would be formed on the first surface 152a' of the semiconductor IC substrate 152' rather than on the second surfaces 6 of the MEMS substrates 2.

It will also be understood that, in some embodiments the MEMS phase shifters and/or MEMS attenuators may be replaced by other types of phase shifter and/or attenuator (e.g. semiconductor based phase shifters and/or attenuators).

In some embodiments, instead of forming the antennas of the antenna modules on a semiconducting substrate, it may be that they are formed on an insulating substrate such as alumina. Alumina is particularly attractive for the antenna substrate because it has a very low loss tangent—i.e. it allows the antenna to radiate the field rather than it being lost in the substrate. Alumina can also be easily deposited as a dielectric.

The electromagnetic signal divider and/or combiner in each phased array may be formed by the deposition of metal on the relevant surface.

As discussed above, common ground planes may be provided for the electromagnetic signal divider and/or combiner and the antennas, and in some cases this is provided as an intermediate layer between first and second substrate surfaces of the capping substrate, the MEMS substrate or the carrier substrate. In this case, the respective capping substrate, MEMS substrate or carrier substrate may be provided as a multi-layered substrate comprising respective first and second substrate layers and a ground plane sandwiched between them.

Further variations and modifications may be made within the scope of the invention herein described.

For example, although some of the embodiments discussed above provide a respective MEMS controller or local MEMS controller on an integrated circuit 49 for each antenna module, it may be that a single MEMS controller or a single local MEMS controller is provided for controlling the MEMS switches of each of a plurality of antenna modules. FIG. 24 is a plan view of a 4×4 MIMO phased antenna array 700 comprising sixteen antenna modules (which in this example are the antenna modules as described in FIG. 13) which form four independent 2×2 sub-arrays (the antennas of the first sub-array being referred to by reference numeral 702, the antennas of the second sub-array being referred to by reference numeral 704, the antennas of the third sub-array being referred to by reference numeral 706 and the antennas of the fourth sub-array being referred to by reference numeral 708), each of which comprises four antennas and which is configured to wirelessly communicate with one or more (typically terrestrial) electromagnetic signal sources/receivers independently of the other sub-arrays. The antenna modules 702-708 of the respective sub-arrays are interspersed with antenna modules of one or more other said sub-arrays to reduce interference between antenna modules of the same sub-array. In an alternative embodiment (see FIG. 25), the antennas of each sub-array may be provided adjacent to each other (e.g. arranged in a 2×2 grid). Typical separation between antennas of the same sub-array is $\lambda/2$ or $\lambda$ or $2\lambda$ (where $\lambda$ is the wavelength of electromagnetic radiation being transmitted or received by the antennas).

The antenna modules 702-708 of all four sub-arrays are carried by a common semiconductor carrier substrate 709 which comprises respective integrated circuits 710, 712, 714 and 716 (formed on the reverse side thereof (i.e. to that on which the MEMS substrates of the antenna modules are mounted)) which each comprise a respective MEMS controller configured to control the MEMS switches of the antenna modules within the respective sub-arrays 702, 704, 706 and 708 respectively. That is, each MEMS controller controls the MEMS switches of a respective sub-array. Specifically, IC 710 controls the MEMS switches of sub-array 702, IC 712 controls the MEMS switches of sub-array 704, IC 714 controls the MEMS switches of sub-array 706 and IC 716 controls the MEMS switches of the sub-array 708. The integrated circuits 710-716 are conductively connected to the MEMS switches of the antenna modules which they are configured to control by deposited and/or patterned signal tracks (e.g. on one or both of the side of the carrier substrate 709 on which the MEMS substrates are mounted and the side on which the integrated circuits are formed)

and/or conductive through substrate vias (not shown). Part of one of the integrated circuits 710, 712, 714 and 716 is typically (but not necessarily) provided beneath each antenna module 702, 704, 706 and 708. By providing a common integrated circuit which provides the MEMS controller for the MEMS switches of the antenna modules of each sub-array, a more compact structure can be provided which helps to reduce footprint and signal losses and to improve manufacturing efficiency.

It may be that a master MEMS controller is provided (e.g. on the semiconductor carrier substrate 709) which controls each of the MEMS controllers 710-716, the MEMS controllers 710-716 being local MEMS controllers in this case. The MEMS controllers 710-716 may each be configured to receive (e.g. from the master MEMS controller) as inputs control signals 59 which specify which of the MEMS switches 16, 18 of the respective said sub-arrays should be in their first (up) states and which should be in their second (down) states in order to achieve target phase shifts and/or a steering direction and/or signal amplitudes and/or gains for the electromagnetic signals received and/or to be transmitted by the antennas 40 of that sub-array. In this case, as explained above, the MEMS controllers 710-716 are required to interface with circuitry 62 (e.g. by way of an industry standard interface such as an industry standard RF Front End (RFFE) interface or Serial Peripheral Interface (SPI) etc.) to receive control signals for controlling the MEMS switches 16, 18, in some cases boost the system voltage (e.g. 3.3V) to a higher DC voltage (e.g. 30V or 40V) required for actuation of the MEMS switches of the respective sub-array (which is again typically done by one or more charge pumps of the local controllers or the combination of one or more charge pumps of the local controllers and one or more energy storage elements (e.g. capacitors), although alternatively this may be done by one or more charge pumps of the master controller or the combination of one or more charge pumps of the master controller and one or more energy storage elements (e.g. capacitors)) and route the boosted, relevant control signals to the correct MEMS switches 16, 18 of the correct antenna modules. The determination of which switches 16, 18 should be in which states may performed in the master MEMS controller (where provided) or in circuitry external to the array responsive to a target phase shift and/or gain and/or amplitude and/or steering direction.

Alternatively, the MEMS controllers 710-716 may be standalone controllers configured to receive inputs from circuitry external to the array. For example, the controllers 710-716 may be configured to receive as inputs target phase shifts and/or a steering direction and/or signal amplitudes and/or gains for the electromagnetic signals received and/or to be transmitted by the antennas 40 of the respective sub-array they control. The controllers 710-716 may be configured to determine from the inputs configurations for the MEMS switches of the respective sub-array specifying which of the one or more MEMS switches 16, 18 should be in their first (up) states and which of the MEMS switches 16, 18 should be in their second (down) states responsive to the inputs, and to provide control signals to the relevant MEMS switches 16, 18 of the relevant sub-arrays to implement the determined configurations. Alternatively, the inputs received by the controllers 710-716 may specify which of the MEMS switches of the antenna modules are to be in which state.

The re-use of MEMS controllers for a plurality of antenna modules means, for example, that one or more charge pumps and, where provided, energy storage elements, (where required to boost the system voltage in order to actuate the MEMS switches) can be re-used between antenna modules within a particular sub-array. In addition, the number of digital interfaces required can be reduced.

As an alternative to providing one standalone MEMS controller or one local MEMS controller per sub-array, one standalone MEMS controller or local MEMS controller can be provided per pair of antenna modules (i.e. to control the MEMS switches thereof) or even one standalone MEMS controller for the entire array.

As before the common carrier substrate 709 may further comprise signal processing circuitry configured to process electromagnetic signals received and/or to be transmitted by the antennas (either individual to the antenna modules, or common to each of a plurality of the antenna modules, e.g. common to the antenna modules of a respective sub-array).

Although the arrays shown in FIGS. 24 and 25 are described as being 4×4 arrays, with 2×2 sub-arrays, more typically a full array would be a 16×16 array with each sub-array being 4×4 sub-arrays.

It may be that the arrays of FIGS. 24, 25 are based on the architecture described above with reference to FIG. 14. In an alternative embodiment to that shown in FIGS. 24-25, the carrier substrate 709 is instead an antenna substrate common to each of the antennas of the array. In this case, it may be that the arrays are based on the architecture described above with reference to FIG. 14a.

Although the examples shown in the Figures show the anchors 20, 22 as provided within an enclosed volume between the MEMS substrate and the capping substrate, it may be that the anchors 20, 22 (or conductive pads conductively connected to the anchors) are provided external to the enclosed volume. In this case, the method may comprise grinding the capping substrate in order to expose the anchors 20, 22 (or a single anchor thereof).

Although the example described above describe the MEMS substrate as a semiconductor crystalline substrate, in some embodiments the MEMS substrate need not be a semiconductor substrate or a crystalline substrate. For example, in some embodiments, the MEMS substrate may be an amorphous (e.g. glass) substrate. In some embodiments the MEMS substrate may be a ceramic substrate.

Although the examples described above involve the capacitive MEMS switches of the MEMS phase shifter each providing substantially the same quantity of phase shift to signals propagating on the signal conductor, it will be understood that in other embodiments, different capacitive MEMS switches of the phase shifter provide different quantities of phase shift to signals propagating on the signal conductor.

Although the interposer caps 120 and 510 are described as comprising a conductive interface and optionally integrated components or devices provided as part of the conductive interfaces, it may be that the capping substrate of any of the embodiments described herein may comprise a conductive interface and optionally integrated components or devices provided as part of the conductive interfaces.

Figure 26:
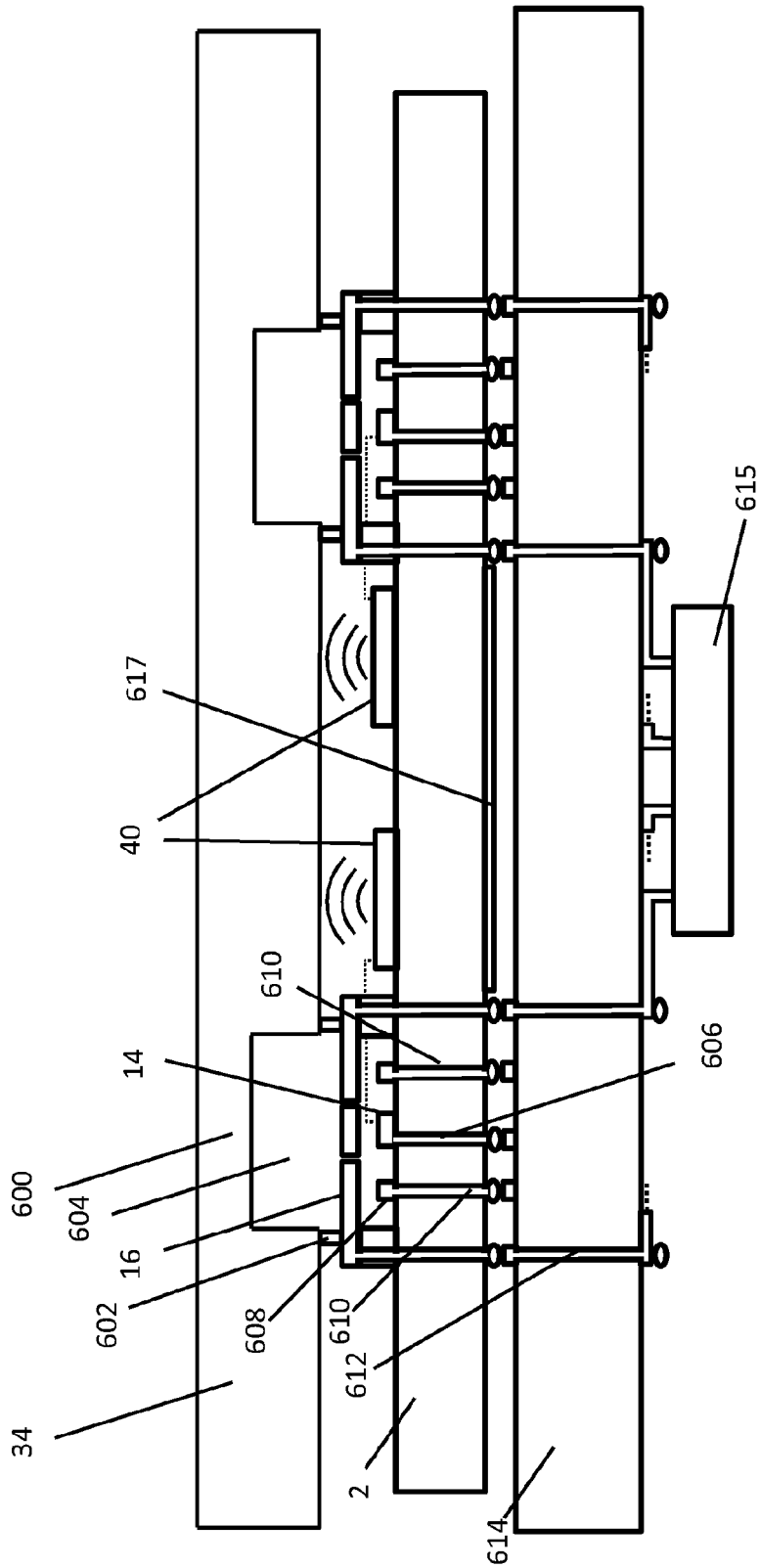
FIG. 26 is a cross-section through an example embodiment of the invention.
Figure 27:
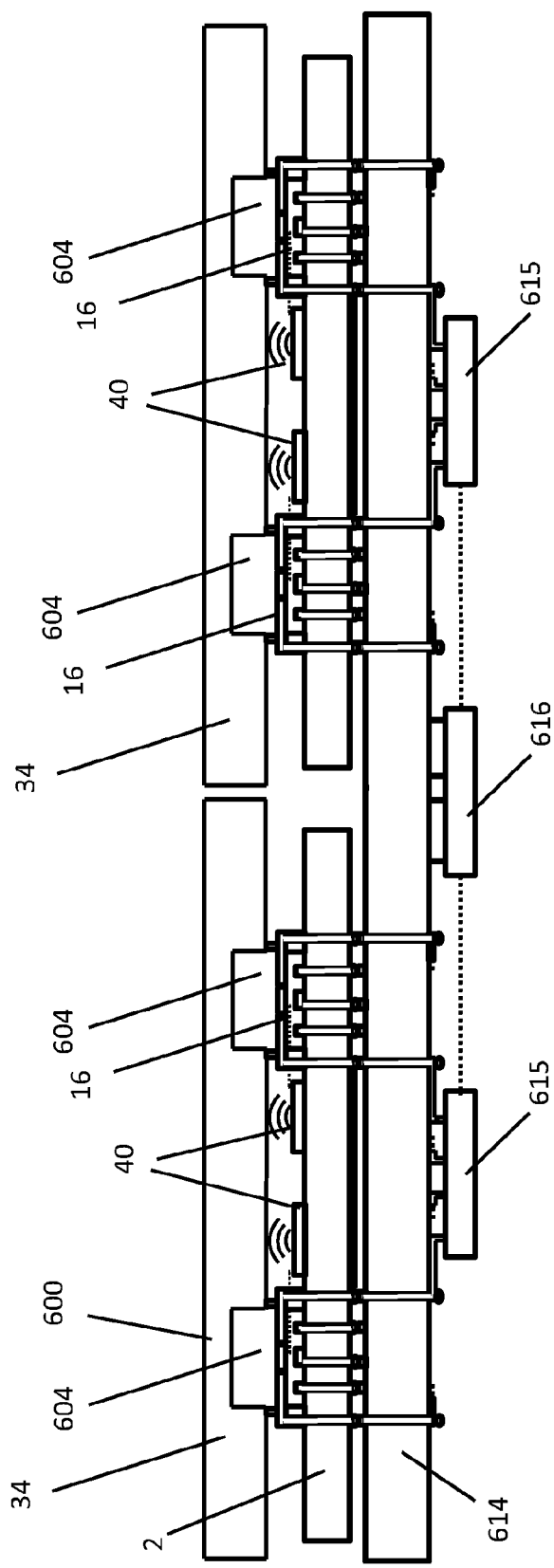
FIGS. 27 to 30 are schematic diagrams of circuits for operating an embodiment of the invention.

FIGS. 26 and 27 illustrate an example embodiment of the invention labelled as above, in which MEMS switches 16 are formed on a MEMS substrate 2 which also support an antenna 40 to which it is connected via a signal conductor 14 (in practice although it is shown schematically with a dashed line it is typically formed on the MEMS substrate). A capping substrate 34 has a capping portion 600 which is sealed against the MEMS substrate, using in this example a sealant 602, thereby forming an enclosed volume 604 around the respective MEMS switch. The signal conductor is connected to RF signal processing circuitry (e.g. a power amplifier to drive the antenna) by way of a through-substrate via 606. Ground conductors 608 are also connected to external circuitry by way of through-substrate vias 610. MEMS switch control lines 612 further extend through a semiconductor carrier substrate 614 on which are formed one or more ICs predominantly configured as local MEMS controllers 615 which a group of MEMS switches to regulate a plurality of antenna modules, but also include a master MEMS controller 616 which control the local MEMS controllers thereby (indirectly) controlling the switches of the array. A ground plane 617 is provided on the opposite surface of the MEMS substrate to the antennas.

The through-substrate vias are hermetic and the interior of the enclosed volume is a vacuum. Accordingly, the MEMS switches remain in a vacuum environment, avoiding damage. Typically the number of through-substrate vias is limited, for example, it may be that there are two hermetic through-substrate vias for an RF signal line (for communication between the antenna and RF circuitry) two or four hermetic through-substrate vias for a ground connection, and optionally two through-substrate vias for one or more MEMS switch control signals, and no other electrical connections into the enclosed volume.

In another embodiment, RF signals are conducted into the enclosed volume by way of through-substrate vias, but non-RF signals, typically MEMS switch control signals, are conducted into the enclosed volume through substrate integrated waveguides, e.g. along the surface of the MEMS substrate, under the sealant. This provides efficient, reliable connections while maintaining the vacuum.

Figure 28:
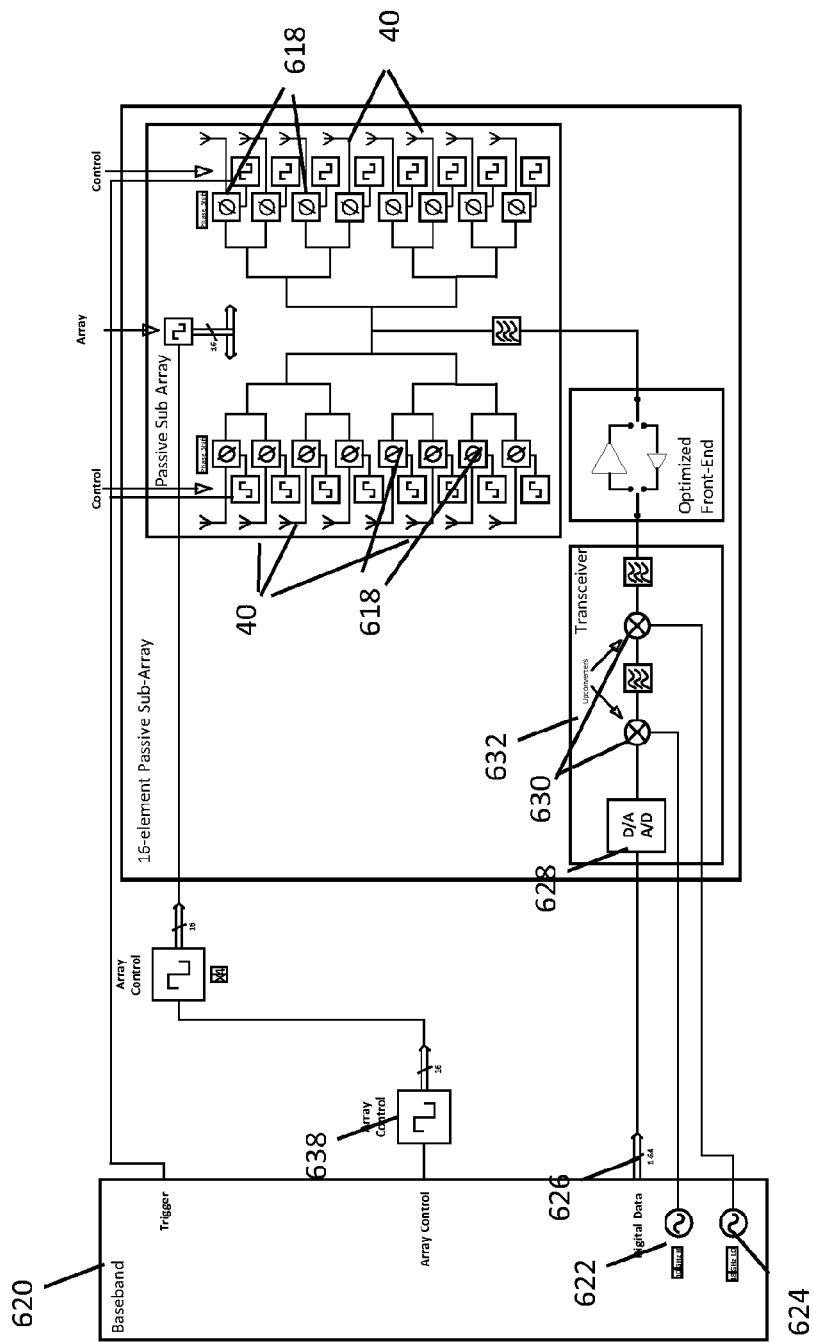
Figure 29:
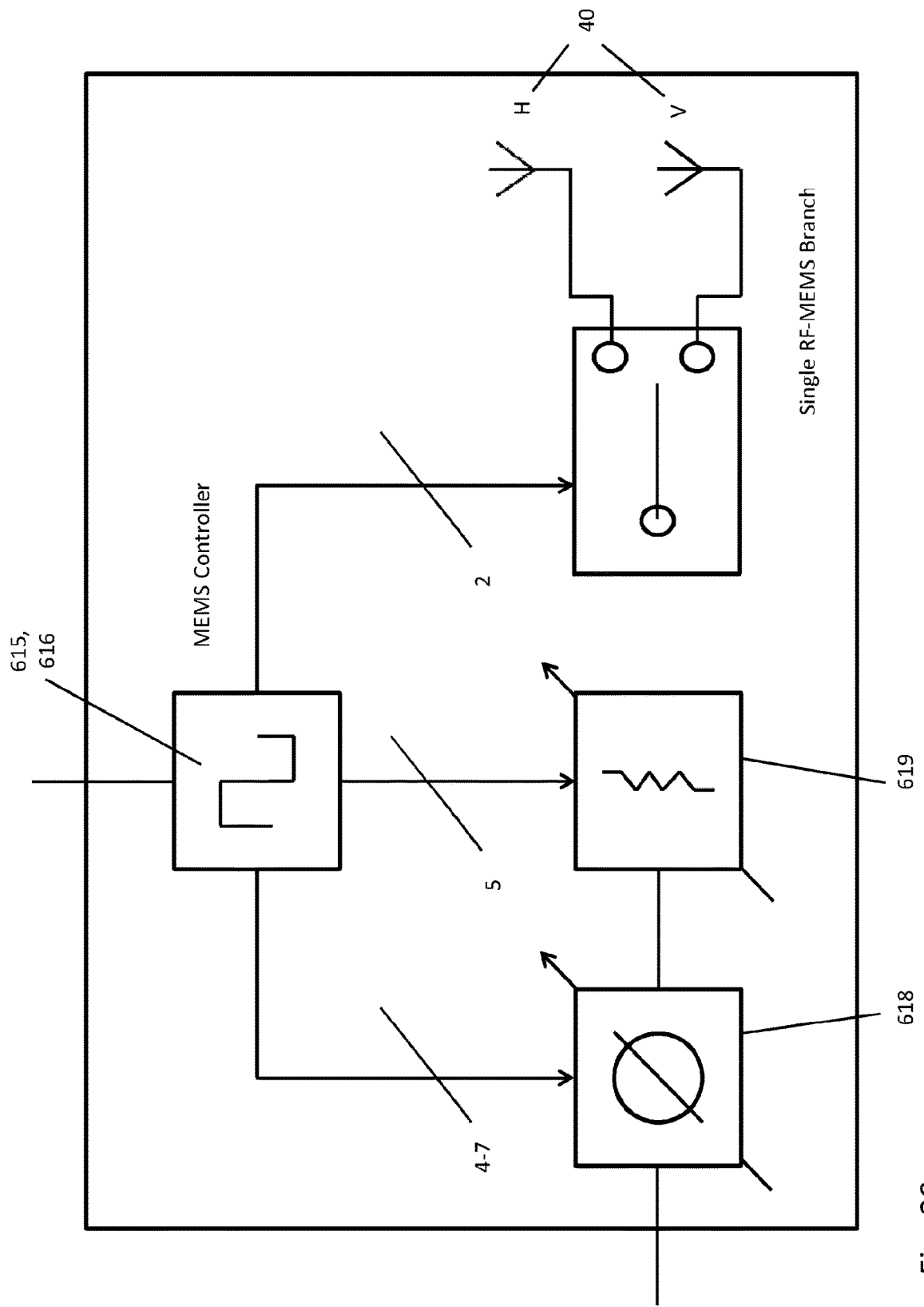
Figure 30:
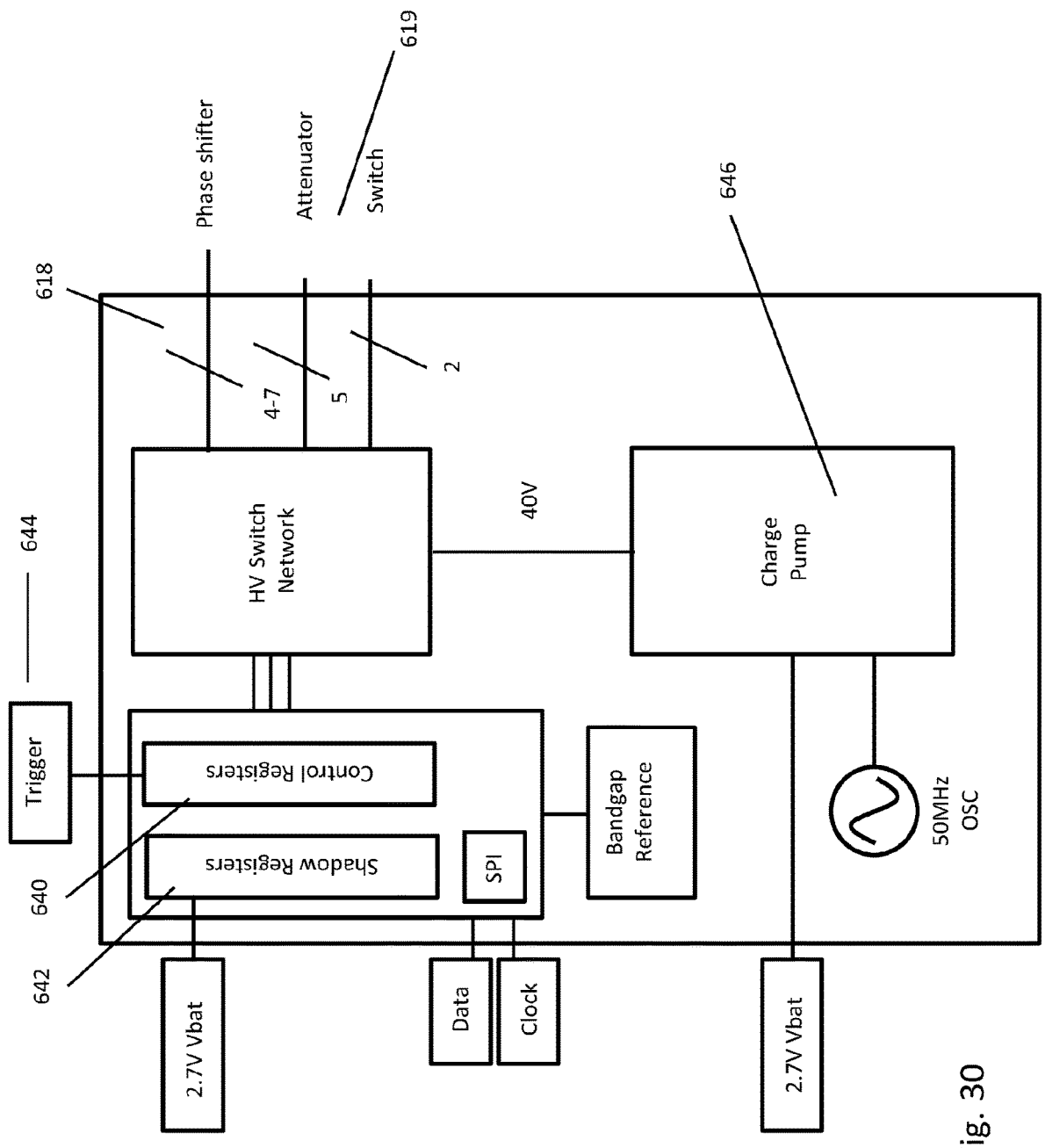

The control architecture is further described in FIGS. 28 to 30. In this example a 16-element passive subarray comprises 16 antennas 40 with individual MEMS switch controlled phase shifters 618 and attenuators 619 to form a controllable phased array driven by baseband 620. RF signals to the antennas are generated by 10 GHz and 18 GHz sources 622, 624 (in this example), and digital data 626 fed into a DAC 628 (or in reverse ADC) and upconverters 630 within a transceiver 632 which generates modulated RF signals 634 which are in turn processed through a suitable RF front-end 636 and supplied through dividers and combiners to the individual antennas. A master MEMS controller provides array control signals 638 which are processed by local MEMS controllers containing charge pumps 646 to generate switch control signals to raise or lower MEMS switches, in changing their capacitance and thus the phase shift to a respective antenna. Although a single phase shifter is shown per antenna for clarity, in practice there may be many to give a highly controllable phase shift. As well as MEMS phase shifters and attenuators MEMS switches may select between antennas. To enable the MEMS switches to change rapidly and simultaneously despite the potentially large number of control signals, each switch is associated with a control register 640 which determines the instantaneous control signal to an individual MEMS switch and a shadow register 642 into which the next setting of the control register is preloaded. A trigger signal line 644 conducts trigger signals to the local MEMS controllers and the shadow registers are copied to the control registers at a trigger signal (e.g. rising or falling edge).

The invention claimed is:

1. Phased array antenna apparatus comprising a plurality of antennas configured to wirelessly transmit and/or receive electromagnetic radiation, signal processing circuitry configured to process signals received and/or to be transmitted by the said antennas; and the signal processing circuitry comprising one or more MEMS phase shifters or attenuators, the MEMS phase shifter or attenuators comprising MEMS switches, and configured to individually adjust the amplitudes of electromagnetic signals received and/or to be transmitted by each of the antennas of the array; one or more electromagnetic signal dividers and/or combiners; and a MEMS controller configured to control the MEMS switches of each of a plurality of antennas.

2. Phased antenna array apparatus according to claim 1 wherein the signal processing circuitry comprises a plurality of phase shifter attenuators, each of the attenuators being associated with a respective antenna of the said plurality of antennas and being configurable to individually adjust an attenuation of electromagnetic signals received and/or to be transmitted by the antenna with which it is associated, each of the phase shifter attenuators comprises one or more microelectromechanical (MEMS) switches, the said one or more MEMS switches being reconfigurable to individually adjust the said attenuation of electromagnetic signals received and/or to be transmitted by the antenna with which the MEMS switch is associated and cause a change in the phase of electromagnetic signals received and/or to be transmitted by the antenna with which the MEMS switch is associated, each MEMS switch causes a phase shift of at least 180° or a multiple thereof to electromagnetic signals received and/or to be transmitted by the antenna with which the MEMS switch is associated, and each said phase shifters and/or MEMS switches consist of MEMS Varactors.

3. Phased antenna array apparatus according to claim 2 wherein the signal processing circuitry comprises a plurality of phase shifters, each of the phase shifters being associated with a respective antenna of the said plurality of antennas and being configurable to individually adjust a phase of electromagnetic signals received and/or to be transmitted by the antenna with which it is associated, each said phase shifter comprises one or more microelectromechanical (MEMS) switches, the said one or more MEMS switches being reconfigurable to individually adjust the said phase of electromagnetic signals received and/or to be transmitted by the antenna with which the phase shifter is associated, and the phased antenna array apparatus further comprising a controller configured to determine together a configuration of the MEMS switches of the phase shifter and the attenuator associated with a or each respective said antenna taking into account a target attenuation and a target phase shift; and to implement the said configuration.

4. Phased antenna array apparatus according to claim 2 wherein the antenna signal processing circuitry comprises a distributed circuit.

5. Phased antenna array apparatus according to claim 2 wherein the antenna signal processing circuitry comprises:
   (i) a plurality of power amplifiers, each of the power amplifiers being associated with a respective antenna of the said plurality of antennas and being configurable to individually adjust a power amplification of electromagnetic signals to be transmitted by the antenna with which it is associated,
   (ii) a plurality of low noise amplifiers, each of the low noise amplifiers being associated with a respective antenna of the said plurality of antennas and being configurable to individually adjust a power amplification of electromagnetic signals received by the antenna with which it is associated,
   (iii) one or more mixers each of which is configured to demodulate and/or modulate electromagnetic signals received and/or to be transmitted by one or more of the said antennas, and/or (iv) a plurality of filters each of which is configured to filter signals received and/or to be transmitted by one or more of the antennas.

6. Phased antenna array apparatus according to claim 2 wherein the antenna array comprises a plurality of independent sub-arrays each comprising a plurality of said antennas, wherein the said independent sub-arrays are configured or configurable to communicate with different external electromagnetic signal sources independently from each other.

7. Phase antenna array apparatus according to claim 2 wherein the said antennas of the array are supported by a common carrier substrate, wherein the common carrier substrate comprises the said antennas, and the common carrier substrate supports the antenna signal processing circuitry, wherein the common carrier substrate comprises some or all of the antenna signal processing circuitry.

8. Phased antenna array apparatus according to claim 2 wherein the antenna signal processing circuitry comprises one or more controllers, each of which is configured to control one or more MEMS switches of an attenuator and/or one or more MEMS switches of a phase shifter associated with a respective antenna, the said attenuator being configurable by the controller to individually adjust the attenuation of electromagnetic signals received and/or to be transmitted by the antenna with which it is associated and the said phase shifter being configurable by the controller to individually adjust the phase of electromagnetic signals received and/or to be transmitted by the antenna with which it is associated.

9. Phased antenna array apparatus according to claim 7, wherein the electromagnetic circuitry is supported by the said common carrier substrate.

10. Phased antenna array apparatus according to claim 2 wherein each antenna of the said antenna array is provided as part of a respective antenna module comprising at least the said antenna and a portion of the said antenna signal processing circuitry being configured to individually adjust the power of electromagnetic signals received and/or to be transmitted by that antenna.

11. A method of operating a phased antenna array comprising a plurality of antennas, each of the said antennas configured to transmit and/or receive radio frequency or microwave electromagnetic signals, the method comprising: individually adjusting the power of electromagnetic signals received or to be transmitted by each of the said plurality of antennas, wherein the step of individually adjusting the power of electromagnetic signals received or to be transmitted by each of the said plurality of antennas comprises individually adjusting the attenuation of electromagnetic signals received or to be transmitted by each of the said plurality of antennas by changing the state(s) of one or more MEMS switches of respective attenuators associated with the said antennas.

12. The method according to claim 11 wherein the step of changing the state(s) of the said one or more MEMS switches of each said attenuator further causes a change in phase of said electromagnetic signals, and wherein the step of individually adjusting the attenuation of electromagnetic signals received or to be transmitted by each of the said plurality of antennas further comprises each said attenuator causing a phase shift to the said electromagnetic signals, and the method further comprising individually adjusting the phase of electromagnetic signals received or to be transmitted by one or more or each of the said plurality of antennas by changing the states of one or more MEMS switches of a phase shifter associated with the respective antenna.

13. A method of operating a phased antenna array comprising a plurality of antennas, each of the said antennas configured to transmit and/or receive radio frequency or microwave electromagnetic signals, the method comprising: individually adjusting the power of electromagnetic signals received or to be transmitted by each of the said plurality of antennas, wherein each of the said plurality of antennas is associated with a phase shifter and an attenuator both having one or more MEMS switches, the method further comprising determining together a configuration of the MEMS switches of the phase shifter and the attenuator associated with each respective said antenna taking into account a target attenuation, a target phase shift; and implementing the said configuration.

14. A method of manufacturing phased antenna array apparatus, the method comprising: providing a plurality of antennas; and conductively coupling antenna signal processing circuitry to the said antennas, the antenna signal processing circuitry being configured to individually adjust the power of electromagnetic signals received and/or to be transmitted by each of the said plurality of antennas, the antenna signal processing circuitry comprises a plurality of MEMS attenuators, each of the attenuators being associated with a respective antenna of the said plurality of antennas and being configurable to individually adjust an attenuation of electromagnetic signals received or to be transmitted by the antenna with which it is associated.

\* \* \* \* \*